United States Patent
Shishido et al.

(10) Patent No.: US 6,909,930 B2
(45) Date of Patent: Jun. 21, 2005

(54) METHOD AND SYSTEM FOR MONITORING A SEMICONDUCTOR DEVICE MANUFACTURING PROCESS

(75) Inventors: Chie Shishido, Yokohama (JP); Yuji Takagi, Kamakura (JP); Masahiro Watanabe, Yokohama (JP); Yasuhiro Yoshitake, Yokosuka (JP); Shunichi Matsumoto, Yokohama (JP); Takashi Iizumi, Hitachinaka (JP); Osamu Komuro, Hitachinaka (JP); Maki Tanaka, Yokohama (JP); Hidetoshi Morokuma, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 389 days.

(21) Appl. No.: 10/124,412

(22) Filed: Apr. 18, 2002

(65) Prior Publication Data

US 2003/0015660 A1 Jan. 23, 2003

(30) Foreign Application Priority Data

Jul. 19, 2001 (JP) .................................... 2001-218952
Sep. 28, 2001 (JP) .................................... 2001-298912

(51) Int. Cl.$^7$ ............................................. G06F 19/00
(52) U.S. Cl. ........................ 700/121; 700/95; 700/117; 438/473; 250/492.2; 716/19

(58) Field of Search .......................... 700/90, 95, 117, 700/121; 438/5, 6, 473, 795; 716/19, 21; 250/492.1, 492.2

(56) References Cited

U.S. PATENT DOCUMENTS

| | | | | |
|---|---|---|---|---|
| 4,212,031 A | * | 7/1980 | Schmitt et al. | 348/87 |
| 4,567,364 A | * | 1/1986 | Kano et al. | 250/307 |
| 6,329,826 B1 | * | 12/2001 | Shinada et al. | 324/751 |
| 6,614,923 B1 | * | 9/2003 | Shishido et al. | 382/149 |
| 2002/0117635 A1 | * | 8/2002 | Shinada et al. | 250/492.3 |

FOREIGN PATENT DOCUMENTS

EP        0898300 A2 *   2/1999

* cited by examiner

Primary Examiner—Jayprakash N. Gandhi
(74) Attorney, Agent, or Firm—Antonelli, Terry, Stout & Kraus, LLP

(57) ABSTRACT

To realize a method for detecting variations in conditions (drift of the exposure and drift of the focus) in exposure equipment at a product wafer level in lithography process, the process is specified in such a way that calculation results of feature quantities such as electron beam images, line profiles, dimensions, etc. under various sets of the exposure and the focus are stored as a library, and an electron beam image of the product wafer is compared with these pieces of data in the library so that detection of drifts of the exposure and the focus a check of the results on the screen can easily be performed.

37 Claims, 51 Drawing Sheets

$W_1$ : bottom width of resist pattern
$\theta$ : slope angle of resist pattern
$W_2$ : width of film pattern (a) maximum slope point for each slope min   dimension (b)

$th = max \times a + min \times (1-a)$
a: predetermined ratio (0.0~1.0)

max, th, min, dimension (c)

slope line, slope line, edge, edge, base line, base line, dimension (a)

(PRIOR ART)

(b)

$\theta_2 = \theta_1$ (a)

| Index | Exposure | Focus | CD value | Top index | Bottom index |
|---|---|---|---|---|---|
| | | | | | |

(b)

| | Exposure | Focus |
|---|---|---|
| Optimal exposure conditions | EO | FO |

(c)

| | CD value | Top index | Bottom index |
|---|---|---|---|
| Upper limit | | | |
| Lower limit | | | |

(a)

(b)

(c)

(a)

(b)

(a)

(b)

(a)

Interval L $$SE(k) = a / \theta(k) + b \quad \cdots (25\text{-}1)$$
($\theta(k)$ : slope angle at point of attention)

(b)

$$H = d \sum_{\text{Interval L}} \tan \theta(k) \quad \cdots (25\text{-}2)$$

$$= d \sum g(SE(k), a, b)$$
Determine a, b (c)

(a)

(b)

(c)

| | Exposure | Focus |
|---|---|---|
| Optimal exposure conditions | EO | FO |

(d)

| XL(10,20··90) | XR(10,20··90) | Tolerance(%) |
|---|---|---|
| ... | ... | |

(a)

$$e = \frac{Top}{Bottom}$$

(b)

$$e = |R - L|$$

(a)

$X_1$ (b)

$X_2$ (c)

$\phi = \tan^{-1}[(X_1 \cos \alpha_2 - X_2 \cos \alpha_1) / (X_1 \sin \alpha_2 - X_2 \sin \alpha_1)]$ $h = X_1 \sin \phi / M \cos(\phi + \alpha_1)$ (a)

(b)

(c)

(a) element isolation process side-wall slope angle corner part (b) gate process gate oxide film gate length (a)

(b)

(a)

(b)

(a)

(b)

(a)

(b)

(a) Etching time T−

A(Fa,Ea)

(b) Etching time T0

A(Fa,Ea)

(c) Etching time T+

A(Fa,Ea)

(d) Logical sum of (a), (b), and (c)

A(Fa,Ea)

METHOD AND SYSTEM FOR MONITORING A SEMICONDUCTOR DEVICE MANUFACTURING PROCESS

BACKGROUND OF THE INVENTION

The present invention relates to a method of monitoring processes used in the manufacture of semiconductor devices, such as a lithography process and an etching process, and a system therefore; and, more specifically, the invention relates to a method of monitoring the manufacture of a semiconductor device so as to monitor a state of processing in each process from an image obtained by imaging a pattern produced on a substrate that was processed in each treatment process, and a system therefor.

FIG. 2 is a view showing the flow of processing in a conventional lithography process. The lithography process consists of a photo process in which a resist pattern is formed by exposure and development, and an etching process in which the resist pattern is transferred onto a film that is the subject of the processing.

A thin film of a material to be processed is first grown on a substrate of a semiconductor wafer. Then, a resist pattern is produced on this thin film by: (a) coating the film with a resist that acts as a photosensitizer to a predetermined thickness; (b) exposing a mask pattern thereto using exposure equipment; and (c) developing the resist. The resist pattern thus formed is subjected to (d), (f) to (e), (g) to (f) and (h) to (g) dimension measurement by a scanning electron microscope equipped with a measuring function (critical dimension SEM) etc. and, if the dimensions fail to satisfy predetermined the resist pattern is peeled off, and the pattern is reformed after the exposure is altered. It is often the case that the amount of increment/decrement of the exposure is determined by the operator based on his/her experience and intuition.

Next, the resist pattern is transferred by (f) etching the thin film that has been grown below the resist using the resist pattern formed thereon as a mask, to form a circuit pattern. Currently, many minute patterns of semiconductors are processed by dry etching with the use of a plasma. In such a case, (g) the resist is removed, and subsequently, as with the resist pattern, (h) the formed circuit pattern is measured to find its dimensions using a critical dimension SEM, etc. In the dry etching process, since the re-processing of the wafer cannot be executed, if an abnormality is found in the wafer, continuing the manufacture of the wafer is stopped, and an investigation of the cause of the abnormality and possible countervailing measures therefor are performed. If the pattern is normally produced, the film growth process, the photo process, and the etching process are repeated to build up a multilayer circuit.

In order to achieve an excellent pattern shape through use of these manufacturing processes, both the resist pattern formation process and the etching processes must be executed properly. FIG. 3 shows one example of the relationship between the resist pattern and the film pattern after etching (source; "Electron Beam Testing Handbook," Japan Society for the Promotion of Science, the 132nd Committee of "Applications of Charged Particles to Industries," Research Material No. 98, p. 255). There is a fixed relationship between the shape of the resist pattern and the shape of the film pattern, assuming that the etching conditions for the film are the same; and, to obtain a film pattern having a predetermined shape, the resist pattern must have a predetermined shape as well.

When a new process is going to be set along with other occasions, "a condition-finding operation" to find the focus and exposure that yield the optimal resist pattern shape is conducted in such a way that, as seen in FIG. 4, a wafer, on which a pattern is exposed and developed with the focus and the exposure being varied, respectively, for each shot (one time of an exposure unit), is produced (usually such a wafer is called a "focus exposure matrix (FEM)," and hereinafter referred to as the "FEM wafer"), and the dimensions of the resist pattern of each shot are measured and the finished state is inspected.

Incidentally, Japanese Patent Application Laid-open No. H11-288879 discloses a system for supporting the condition-finding operation. Through this operation, the exposure and focus conditions that allow wider manufacturing margins are determined, and a product wafer is exposed using these conditions. However, due to diverse process variations (such as a variation in the photosensitivity of the resist, variation in the film thickness of an anti-refection film below the resist, drift in the exposure equipment), among product wafers, some wafers are found which have a resist pattern deviating from the predetermined shape to be obtained under the conditions determined by the condition-finding operation. It is the object of the dimension measurement at the step (d) in FIG. 2 that detects these defective wafers. In the conventional processing, a change in the resist shape caused by process variations is intended to be compensated by correction of the exposure.

On the other hand, the processed shape of the pattern that is required to be obtained in the etching process depends on the product classes of the device concerned and its processes. For example, in an element isolation process, it is often the practice that a part of the pattern is tapered to improve the embedding performance, and a corner part thereof is rounded to prevent the electric field from concentrating at the corner part, as shown in FIG. 41(a). Further, in the gate wiring process shown in FIG. 41(b), since the wiring width (gate length) of a gate oxide film part at the bottom of the wiring is important, dimensional accuracy at the bottom of the thin film is especially required. Moreover, these shapes in conformity with the object must be processed uniformly over the whole wafer surface. Because the etching utilizes chemical reactions, the equipment and gasses to be used are different in accordance with the material that is being subject to processing.

Control of a tilt angle of a side wall of the pattern, as shown in FIG. 41(a), is carried out by establishing a balance between generation of a side-wall protective coating made with a byproduct that is being generated in the processing and the etching; therefore, it is largely affected by the flow rates of the process gasses being used, the ratio of these flow rates, their pressures, etc. Besides these parameters, the etching time, the electric power of the plasma discharge, the bias electric power applied to the sample, the wafer temperature, etc. mutually affect, in a complicated manner, not only the side-wall shape, but also the etching rate, the dimensional difference with respect to the resist pattern, the shape of the corner part, etc Therefore, the processing condition determined at the time when a new product is intended to be manufactured and the like depends on the experience and craftsmanship of experts to a large degree. Moreover, it is difficult to check the shape with high precision, and so a shape check is carried out by cross-sectional observation in most cases.

Even when processing conditions are fixed by the determined condition, it is often the case that a desired shape cannot be obtained due to drift in the property of the equipment etc. Especially, regarding a process variation resulting from adhesion of byproducts generated during the process onto the interior of a chamber, the wear of parts, etc., countervailing measures have been devised by the practice of periodic cleaning and replacement of parts. However, since the process is affected by a lot of parameters, as described above, a change in the pattern shape caused by these variations cannot be avoided. Detecting such a change is the purpose of the post-etching dimension measurement step (g) of FIG. 2. However, among conventional processes, there is no effective means of quantitatively evaluating the slope angle, the shape of a corner part, etc. of the pattern, as shown in FIG. 5, in an invasive manner.

In the above-mentioned discussion of the conventional processing, there are problems, as will be described in the following items (1)–(3). (1) There are cases where an abnormality in the shape of the pattern cannot be detected with dimension values alone. (2) There are cases where the countervailing measures taken against the formation of a shape abnormality in the pattern cannot be devised with the dimension values alone. (3) Information that indicates the process variations quantitatively and that is required to monitor the lithography process and maintain the process stably cannot be obtained.

Hereafter, how the above-mentioned problems come into being will be described.

FIG. 5 and FIG. 6 show possible variations of a change in the cross section of a resist pattern. FIG. 5 schematically shows the change in the resist cross section in the case where the exposure produced by exposure equipment is fixed and the focus is altered. The focus position is moved in a positive direction for the curves (a), (b), (c), (d), and (e) in this order, Further, FIG. 6 schematically shows the change in the resist cross section in the case where the focus of the exposure equipment is fixed and the exposure is altered. The exposure is increased for the curves (a), (b), (c), (d), and (e) in this order.

Since it is common for the dimension measurement on the critical dimension SEM to be performed by using a line profile of a secondary electron image, first a relationship between the cross section and the line profile of the secondary electron intensity will be introduced, as described in the "Electron Beam Testing Handbook," Japan Society for the Promotion of Science, the 132nd Committee of "Applications of Charged Particles to Industries," Research Material No. 98, p. 261.

In FIG. 7, (A) When the electron beam irradiates the substrate, the intensity of the detected secondary electron signal indicates a constant value governed by the secondary electron emission efficiency of the substrate material. (B) As the beam irradiation point approaches the pattern, the signal strength decreases due to a decrease in the collection efficiency of the secondary electrons, that results from an increase in secondary electrons that collide against a slope of the pattern, among the generated secondary electrons. (C) The secondary electron signal strength marks its minimum at a position that is shifted by a half beam diameter from the bottom edge of the pattern toward the outside. (D) After passing the point C, the intensity increases abruptly with almost linear dependence because of a change in the secondary electron emission efficiency that corresponds to the change in the slope angle of the sample. (E) As the beam irradiation point approaches the vicinity of a top edge, the increase of the signal strength becomes milder because of the difference of collection efficiencies of emission secondary electrons at irradiation points of the slope. (F) The secondary electron signal strength marks its maximum at a position that is shifted by a half beam diameter from a top edge of the pattern toward the outside. (G) After passing the point F, the strength gradually decreases and settles to a constant value that is governed by the secondary electron emission efficiency of the pattern material.

To measure the dimensions from the line profile, it is necessary to detect the edges of the line profile. For an edge detecting technique that is installed on the critical dimension SEM, there are, for example, a method of detecting a largest slope position as the edge, as shown in FIG. 8(a); a method of detecting the edge at a predetermined threshold value, as shown in FIG. 8(b); and, a line approximation method wherein lines are applied to the edge parts and the substrate parts and then intersections of these lines are detected as edges, as shown in FIG. 8(c).

It is the conventional processing of FIG. 2 that detects the edges from the line profile of the secondary electron image of the resist pattern having a cross-section as shown in FIG. 5 and FIG. 6 by means of one of the techniques shown in FIGS. 8(a) to 8(c), measures the dimensions, and judges whether the resist cross section is good or bad according to the results. Assuming that the conventional process uses the maximum slope method of FIG. 8(a) or the threshold method of FIG. 8(b) with the threshold being set to 50%, the dimensions obtained for curves (b) to (e) in FIG. 5 hardly differ from one another; therefore, the conventional process that judges whether the resist cross section is good or bad with dimensional values alone is quite capable of overlooking the change in the shape (→problem (1)).

Alternatively, assuming that the conventional process uses the line approximation method of FIG. 8(c), although overlooking the above-mentioned type of variation would not occur because a dimension comparable to a bottom width of the cross section of a trapezoid is obtained, the shape of curve (b) in FIG. 5 and the shape of curve (a) in FIG. 6, both of which have an almost equal bottom width, cannot be distinguished from each other. If the state of the resist pattern corresponds to curve (b) in FIG. 5, the parameter that should be corrected is the focus. However, in the conventional process, since the exposure is corrected on the basis of a result of the measurement of dimensions, it can hardly be expected that the pattern shape will be improved with correction of the exposure (→problem (2)).

Besides, in order to attain stabilization of the lithography process, it is essential to detect, not large changes, such that measurement results deviate from the standard specification, but a slight change before the variation comes to it, that is, to detect a slight difference between the measurement results and the optimal shape and thereby to sense the sign of the process drift. Then, the results must be used to adjust the exposure conditions for a product to be put into the production line next or to adjust the conditions of the etching process waiting as the next one. However, in the above-mentioned conventional process, because the resist cross section cannot be always monitored accurately, such process control is actually difficult to execute (→problem (3)).

In the passed-over age of large device size (FIG. 9(a)), the effect of the taper of the side-wall upon the post-etching film pattern shape was insignificant. However, since the aspect ratio of the pattern (a ratio of the height dimension to the width dimension of the pattern) has become large (FIG. 9(b)) to accommodate a reduction in device size in recent year the miniaturization has reached a stage where the effect of the taper of the side-wall cannot be ignored. With the conventional process that cannot take into consideration the taper of the side-walls, the lithography process is becoming invalid.

In the foregoing, en example of the conventional photo process has been explained, but also the conventional etching process is subject to similar problems. As shown in FIGS. 41(a) and 41(b), since the targeted shape is different according to the pattern the conventional measurement of dimension cannot provide the necessary shape information. Moreover, since the conventional process cannot detect a process abnormality in the photo process accurately, there is a problem in that, when a problem occurs in the post-etching pattern shape, it is hardly possible to judge which process is responsible for the problem, the photo process or the etching process.

SUMMARY OF THE INVENTION

The present invention provides a system for monitoring a semiconductor device manufacturing process that can monitor three dimensional (3-D) shapes of a resist pattern and those of a post-etching circuit pattern and can direct precise alterations of processing condition parameters.

In other words, the present invention provides a system for monitoring a semiconductor device manufacturing process that will be described in the following based on the use of a critical dimension scanning electron microscope (CD-SEM).

That is, the present invention provides a method of monitoring a semiconductor device manufacturing process that performs the monitoring by the steps of: (a) obtaining an electron beam image of a pattern produced on the surface of a substrate that was subjected to a predetermined treatment process by irradiating the substrate with an electron beam by scanning; (b) calculating feature quantities of this pattern from the electron beam image of the pattern; and (c) monitoring the predetermined treatment process by using i) information of the calculated feature quantities of the pattern and ii) information of the relationship between processing condition parameters in the predetermined treatment process that have previously been stored and the feature quantities of the pattern produced on the substrate being subjected to the predetermined treatment process.

That is, the present invention provides a method of monitoring a semiconductor device manufacturing process that performs the monitoring by the steps of: (a) obtaining an electron beam image of a pattern produced on the surface of a substrate that was subjected to a predetermined treatment process by irradiating the substrate with an electron beam by scanning; (b) calculating feature quantities of the pattern from this electron beam image of the pattern; and (c) judging that at least one variation quantity of the processing condition parameters exceeds allowable errors of the feature quantities of the pattern when at least one feature quantity of the pattern is out of its proper range by using i) information of the calculated feature quantities of the pattern, ii) information of the relationship between the processing parameters in the predetermined treatment process and the feature quantities of the pattern produced on the substrate being subjected to the predetermined treatment process, and iii) information of the proper ranges of the feature quantities of the pattern produced on the substrate being subjected to the predetermined treatment process.

In the system for monitoring a semiconductor device manufacturing process according to the present invention, the CD-SEM has a function of calculating a novel group of feature quantities that express characteristics of the 3-D shape of the resist pattern from the electron beam image (i.e., an image acquired by the CD-SEM).

The system is designed in such a way that, in the stage of monitoring the photo process, the electron beam image of the resist pattern subject to inspection is acquired, the feature quantities are calculated, the calculated feature quantities are mapped to a reference database that has previously been constructed (a database that describes the relationship between the exposure condition parameters and the group of feature quantities), and thereby the 3-D shape of the resist pattern is evaluated, and, at the same time, the variation quantities of the exposure condition parameters are calculated.

Further, in the system for monitoring a semiconductor device manufacturing process according to the present invention, the CD-SEM has a function of calculating a novel group of feature quantities that express the characteristics of the 3-D shape for the post-etching pattern from the electron beam image as well.

The system is designed in such a way that, in a stage of monitoring the etching process, the electron beam image of the pattern subject to inspection is calculated, the calculated group of feature quantities is mapped to the previously constructed reference database that describes the relationship between the pattern shape and the group of feature quantities, and thereby the 3-D shape of the pattern is evaluated.

Further, the present invention is designed to provide a user interface that is most suitable to construct the reference database based on the above-mentioned novel group of feature quantities. Moreover, the present invention is designed to provide a method of setting a process window using the above-mentioned reference database. Furthermore, the present invention is designed to provide a method of constructing the reference database using simulation in addition to a method therefor using actual wafers (FEM wafer etc.)

Further, the present invention is designed to have a function of detecting a tilt image of the secondary electron image and a reflection electron image having a directionality in addition to the secondary electron image of the normal top-down view and to be capable of monitoring 3-D shapes more precisely.

Furthermore, the present invention is designed to provide a function of monitoring the drift of the exposure conditions by storing the variation quantities of the above-mentioned exposure condition parameters for a certain period of time.

According to the present invention, the 3-D shape of the resist pattern can be monitored at the product wafer level and a lithography-process monitoring system that can detect not only the drift of the exposure, but also the drift of the focus, can be provided. As a result, it now becomes possible to detect an abnormality in the 3-D shape caused by the drift of the focus that has been overlooked in the conventional dimension measurement and to prevent defects from being further processed into a post-etching film pattern whose reproduction is basically impossible.

Furthermore, it becomes possible to achieve precise feedback to the process because a quantitative output can be attained, in place of the conventional feedback to the exposure equipment that depends on experience and intuition.

Furthermore, by executing variation predictive control of the exposure conditions, it becomes possible to provide a more stable lithography.

These and other objects, features and advantages of the invention will be apparent from the following more particular description of preferred embodiments of the invention, as illustrated in the accompanying drawings.

BRIEF DESCRIPTION OF THE DRAWINGS

FIG. 25(b) is a diagram showing a sectional contour of the resist pattern; FIG. 25(c) is a table showing the relationship between the best suited exposure conditions and the exposure or the focus.

FIGS. 41(a) and 41(b) are diagrams showing the shapes of the circuit pattern to be produced by the etching process, wherein FIG. 41(a) shows an element isolation process and FIG. 41(b) shows a gate process;

DESCRIPTION OF THE PREFERRED EMBODIMENTS

Hereafter, as embodiments of a system for monitoring the semiconductor device manufacturing process according to the present invention, a case where the invention is applied to the lithography process and a case where it is applied to the etching process will be described with reference to the drawings.

First Embodiment (1-0) Fundamental form of Photo Process

Figure 1:
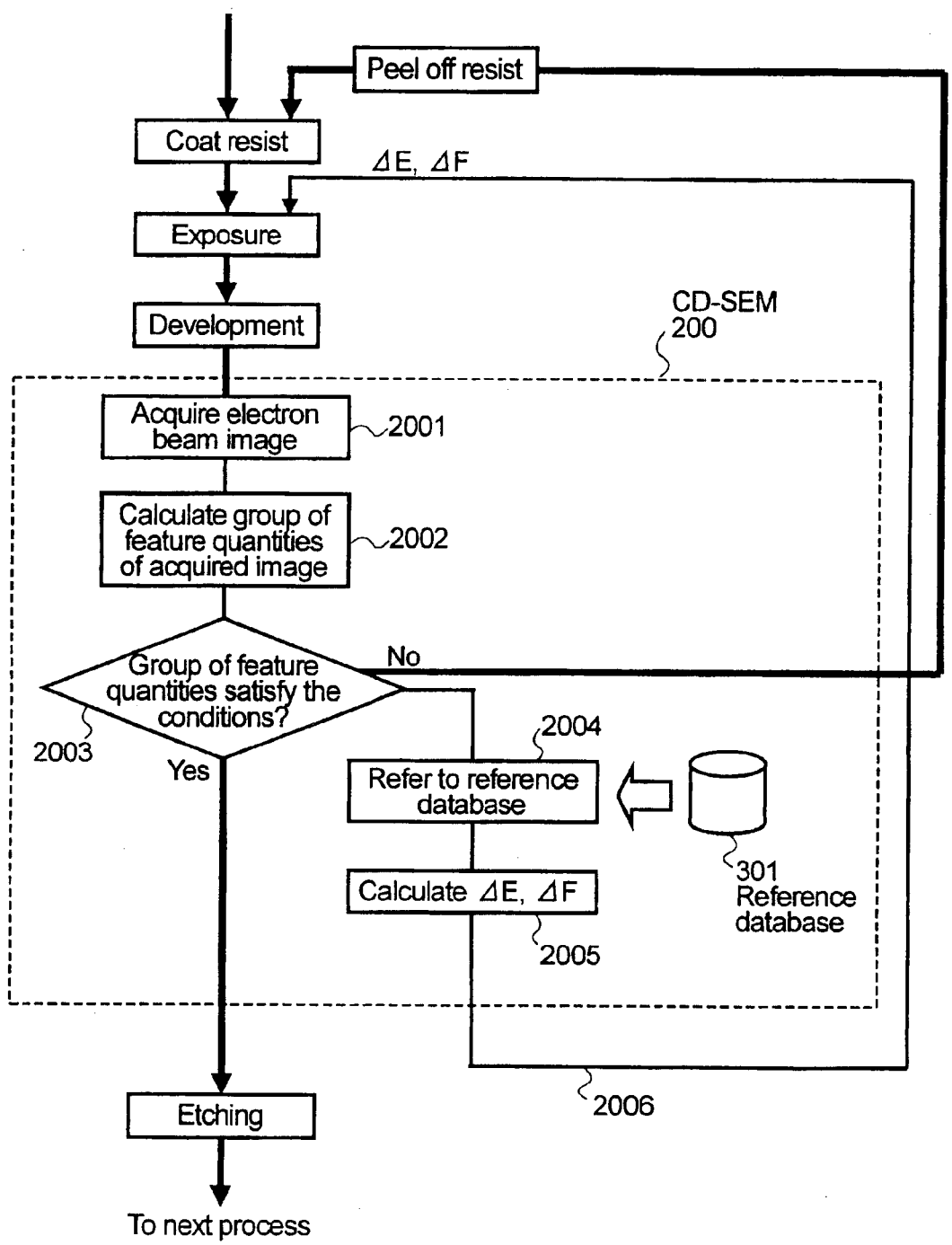
FIG. 1 is a flowchart of the lithography process that incorporates a lithography-process monitoring system according to a first embodiment.
Figure 10:
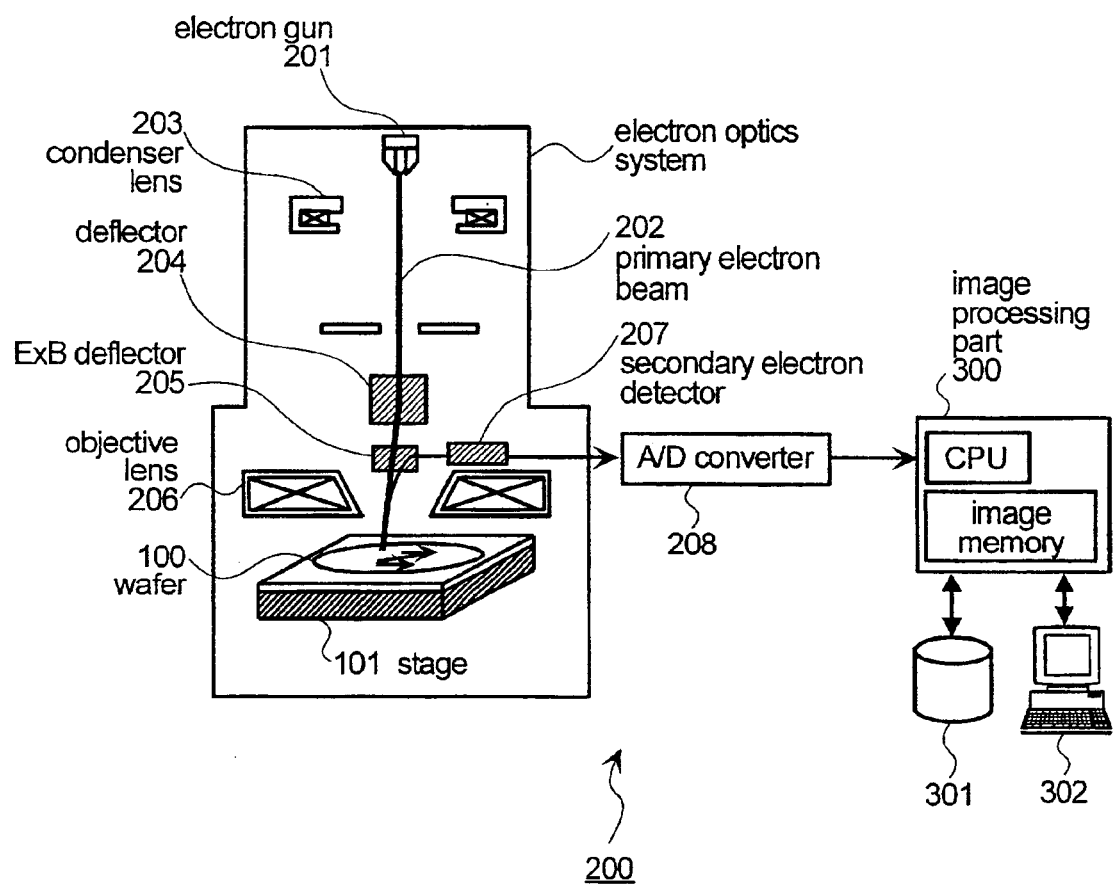
FIG. 10 is a block diagram showing the overall composition of the CD-SEM according to the first embodiment.

FIG. 1 is a conceptual diagram of the lithography process, according to the first embodiment of the present invention, that uses a lithography-process monitoring system constructed on a CD-SEM 200 (the outline composition is shown in FIG. 10). In this embodiment, the CD-SEM generates the electron beam image (step 2001), subsequently calculates a group of feature quantities (details will be described later) that represent characteristics of a 3-D shape of the resist pattern from the electron beam image (step 2002), evaluates the 3-D shape based on the group of feature quantities, and, at the same time, calculates feedback quantities $\Delta E$ and $\Delta F$ to the exposure condition parameters (the exposure and the focus) by using a reference database 301 (details will be described later) that has previously been constructed using the FEM wafer (step 2003–2005).

Figure 42:
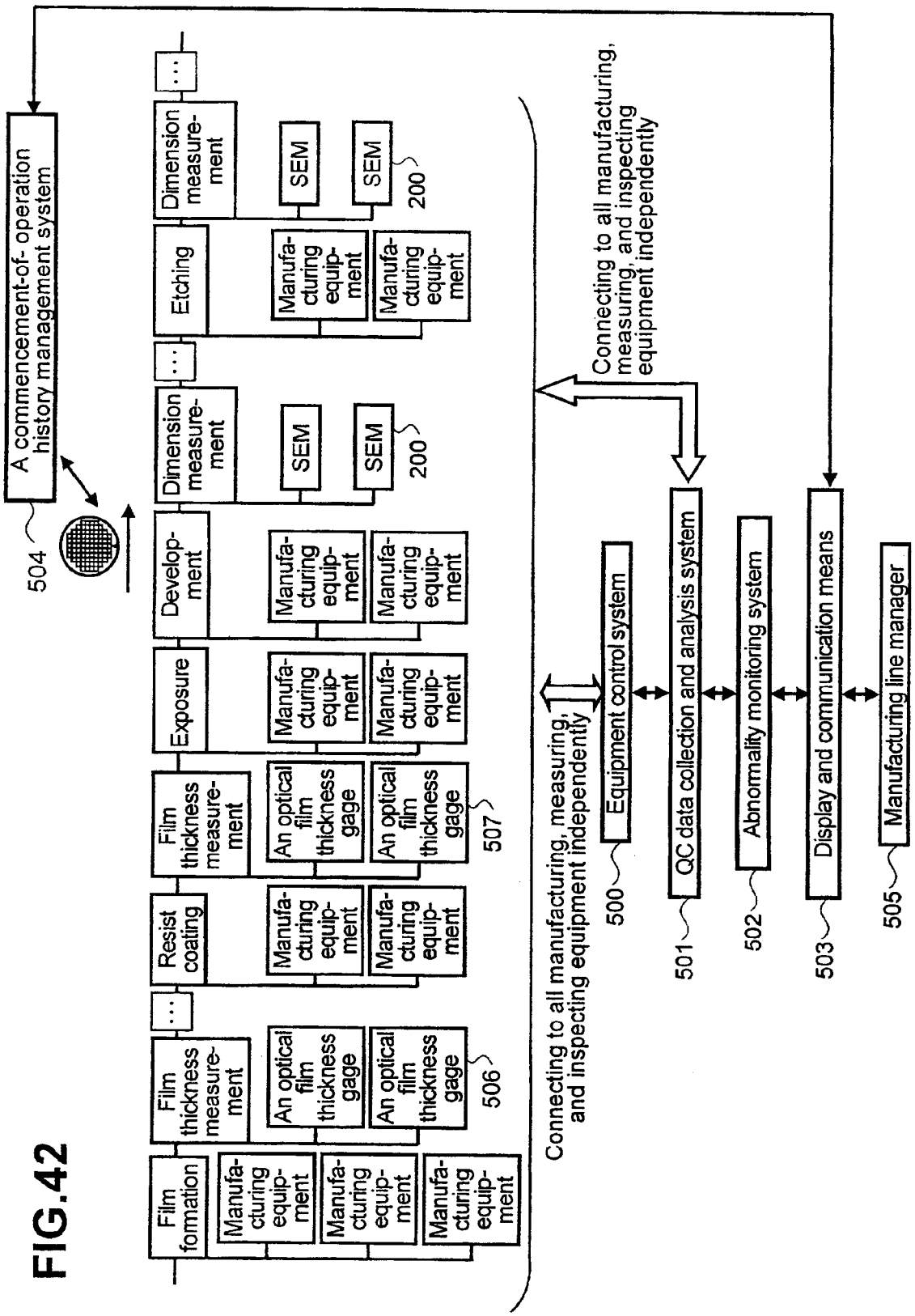
FIG. 42 is a view showing one example of the configuration of a semiconductor production line according to the present invention.

FIG. 42 shows an example of the composition of a semiconductor production line that includes the lithography-process monitoring system according to the present invention. Pieces of manufacturing equipment are connected to an equipment control system 500 via a network, and the equipment control system 500 controls information concerning the manufacturing conditions etc. of the processes carried out for each kind of product, in addition to the operating state and maintenance status of these pieces of equipment.

Further, measuring instruments, such as a film thickness measuring apparatus 506 and the CD-SEM 200, are connected to a QC data collection and analysis system 501, which collects and controls the measurement results indicating the film thickness and the result of the dimension measurement. Further, this QC data collection and analysis system 501 is connected to an abnormality monitoring system 502, so that, when an abnormality occurs in the dimension measurement result, it will be reported to a production line manager 505 through the display and communication means 503.

Moreover, information about when and which wafer starts to undergo which process with which equipment is managed by the commencement-of-operation history management system 504. Therefore, if the need arises, a processing history for all wafers can be referred to.

FIG. 10 is a block diagram showing the composition of the CD-SEM 200 that is used in this lithography-process monitoring system. In FIG. 10, a primary electron beam 202 emitted from an electron gun 201 passes through a beam deflector 204, an ExB deflector 205, and an object lens 206 to irradiate a wafer 100 placed on a stage 101, while in focus.

When the wafer 100 is irradiated with the electron beam, secondary electrons are generated from the wafer 100. The secondary electrons generated by the sample 100 are deflected by the ExB deflector 205 and detected by a secondary electron detector 207. A two-dimensional electron beam image can be obtained by detecting the electrons generated from the sample in synchronization either with two dimensional scanning of the electron beam by the deflector 204 or with repetitive scanning of the electron beam by the deflector 204 in an X direction, together with continuous movement of the wafer by the stage 101 in a Y direction.

A signal detected by the secondary electron detector 207 is converted to a digital signal by an A/D converter 208, and the digital signal is sent to an image processing part 300. The image processing part 300 has an image memory for temporarily storing digital images and a CPU for calculating the line profile and the feature quantities from the image data stored in the image memory. Further, the image processing part 300 has a storage medium 301 for storing the detected images and line profiles, calculated feature quantities, etc. in a reference database. A display device 302 is connected with the image processing part 300, so that the operator is allowed to conduct necessary operation of the equipment, confirmation of the detected results, etc. with the help of a graphical user interface (hereinafter referred to as the "GUI").

Figure 11:
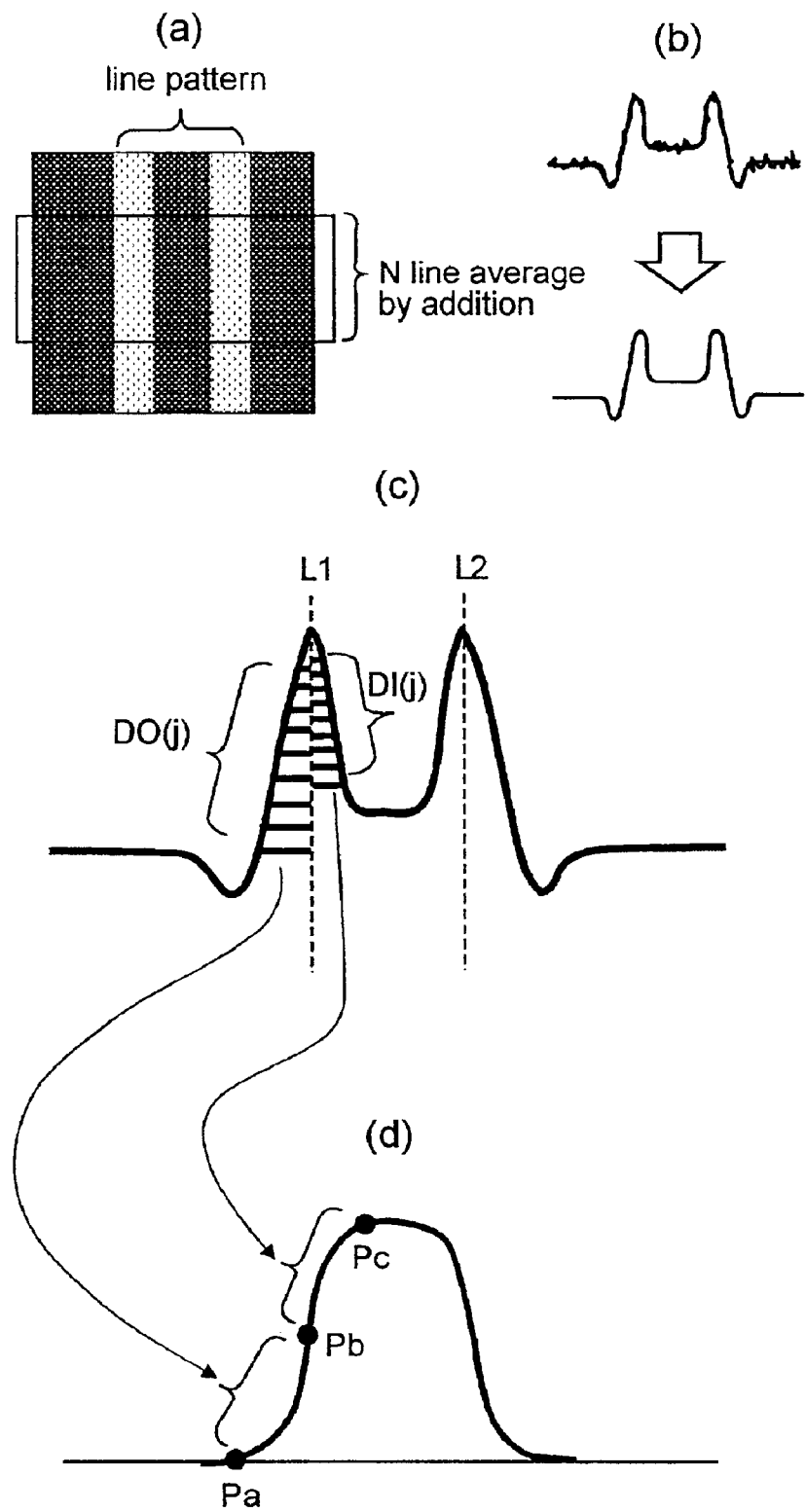
FIG. 11(a) is a diagram of an SEM image of the line pattern.
FIG. 11(b) is a diagram of the line profile of the SEM image.
FIG. 11(c) is an enlarged diagrammatic view of the line profile.
FIG. 11(d) is a schematic diagram of the sectional contour of the line pattern.

First, a procedure for calculation of the feature quantities as performed in the image processing part 300 is shown in FIGS. 11(*a*) to 11(*d*). For a start, to improve the S/N, N lines of the acquired image (FIG. 11(*a*)) are superposed to form a smooth line profile (FIG. 11(*b*)). The line profile has peaks at positions corresponding to the edges of the resist pattern. Taking the left-side peak as an example for purposes of explanation, the peak portion is divided into a left side and a right side by straight line L1 passing the maximum, as seen in FIG. 11(*c*), and an average DO of the left-side widths DO(j) and an average DI of the right-side widths DI(j) are calculated.

As shown in FIG. 11(*d*), since the above-mentioned maximum point roughly corresponds to a maximum slope point Pb of the resist pattern edge, it can be said that the value DO represents a measure of the average slope angle for a portion thereof below the maximum slope point, namely a bottom-side portion, and the value DI indicates a measure of the average slope angle for a portion thereof above the maximum slope point, namely a top-side portion.

Figure 8:
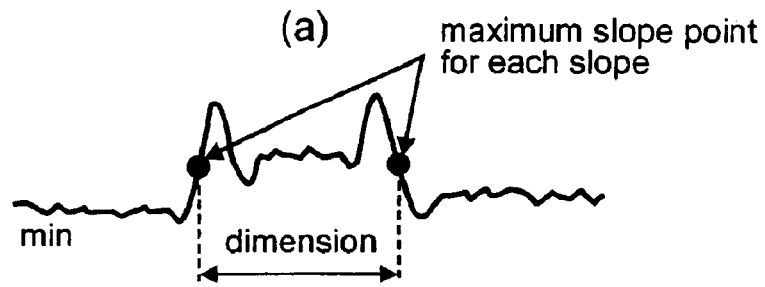
FIGS. 8(a)–8(c) are diagrams illustrating techniques for detecting the edge of a line profile.
Figure 8:
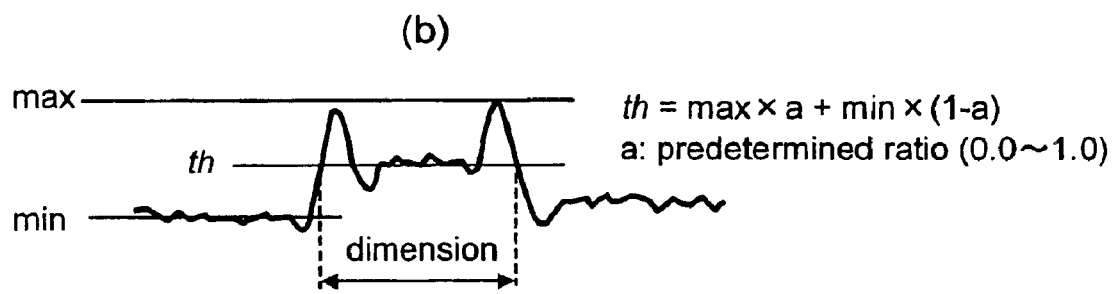
Figure 8:
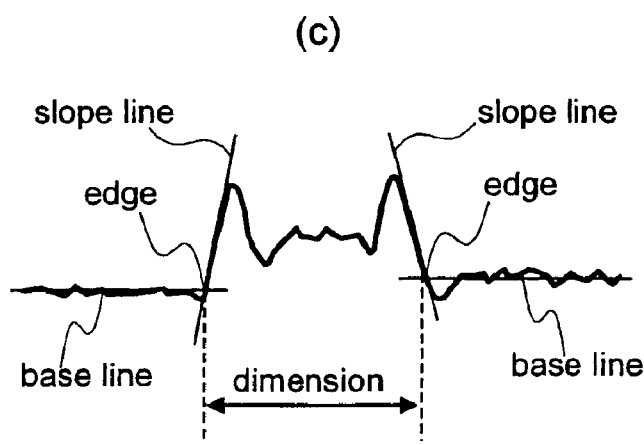
Figure 9:
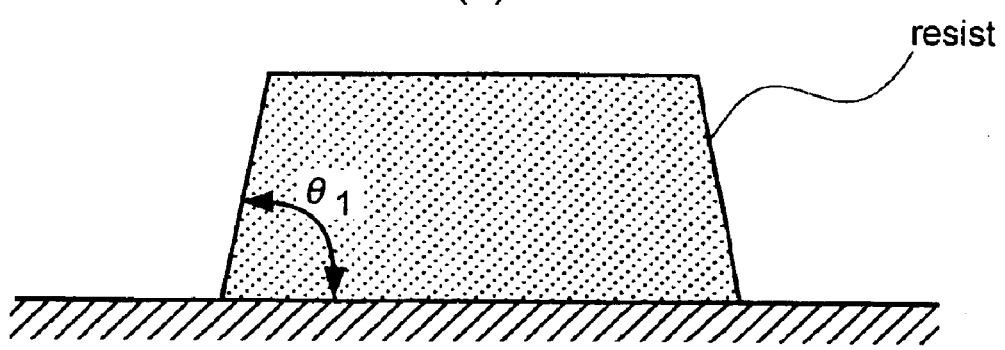
FIG. 9(a) is a diagram showing the cross section of a typical shape of the old-time resist pattern.
FIG. 9(b) is a diagram showing the cross section of a typical shape of the current resist pattern.
Figure 9:
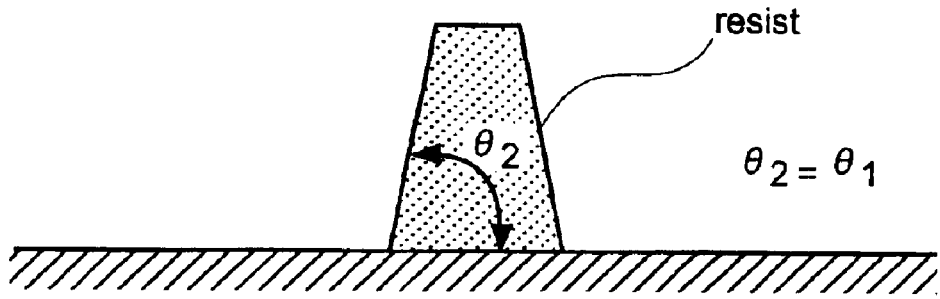

Hereinafter. DO is called the bottom index-value and DI is called the top index-value. Three feature quantities consisting of the top index-value and the bottom index-value, plus the dimension value CD calculated by a method shown in FIG. 8 etc., serve as a group of feature quantities that represent the characteristics of the 3-D shape of the resist pattern.

Figure 12:
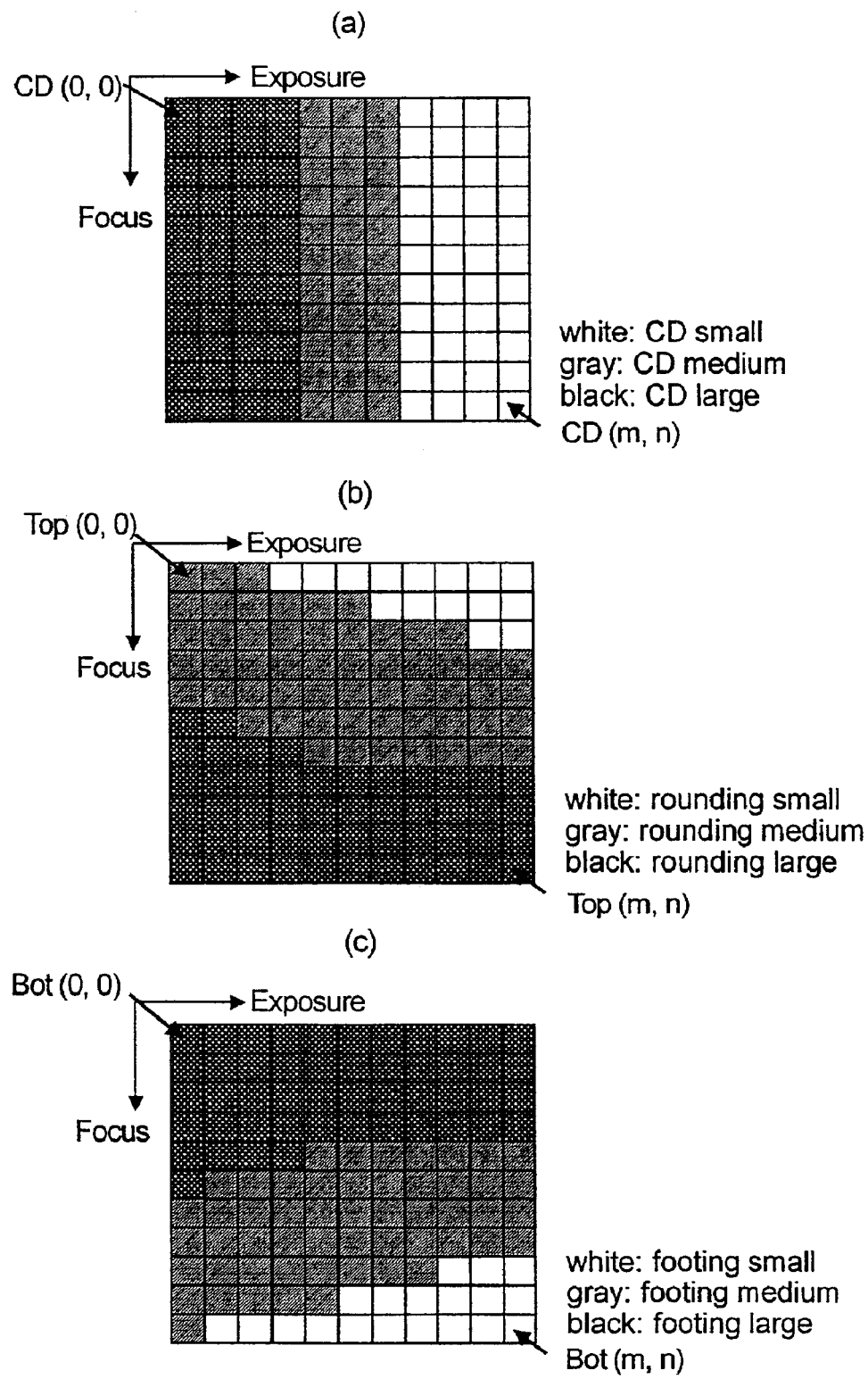
FIG. 12(a) is a matrix chart showing how the CD value varies when the exposure and the focus are altered.
FIG. 12(b) a matrix chart showing how the rounding varies when the exposure and the focus are altered.
FIG. 12(c) a matrix chart showing how the footing varies when the exposure and the focus are altered.

FIGS. 12(*a*) to 12(*c*) show one example of how the above-mentioned three feature quantities vary due to variations of the exposure and the focus. In general, the CD value (line width etc.) changes in accordance with the exposure, but a change in the CD value caused by the focus variation is small and how it changes is illustrated in FIG. 12(*a*). On the other hand, the top index-value and the bottom index-value change depending on the focus rather than the exposure, as seen in FIGS. 12(*b*) and 12(*c*), respectively.

Generally, when the focus varies to the positive side, a rounding occurs at the top part, and, hence, the top index-value becomes large; while, when the focus varies to the negative side, a footing occurs in the bottom part and, hence, the bottom index-value become large. The three indices explained in the foregoing are the group of feature quantities to be calculated at the step 2002 in FIG. 1.

Figure 13:
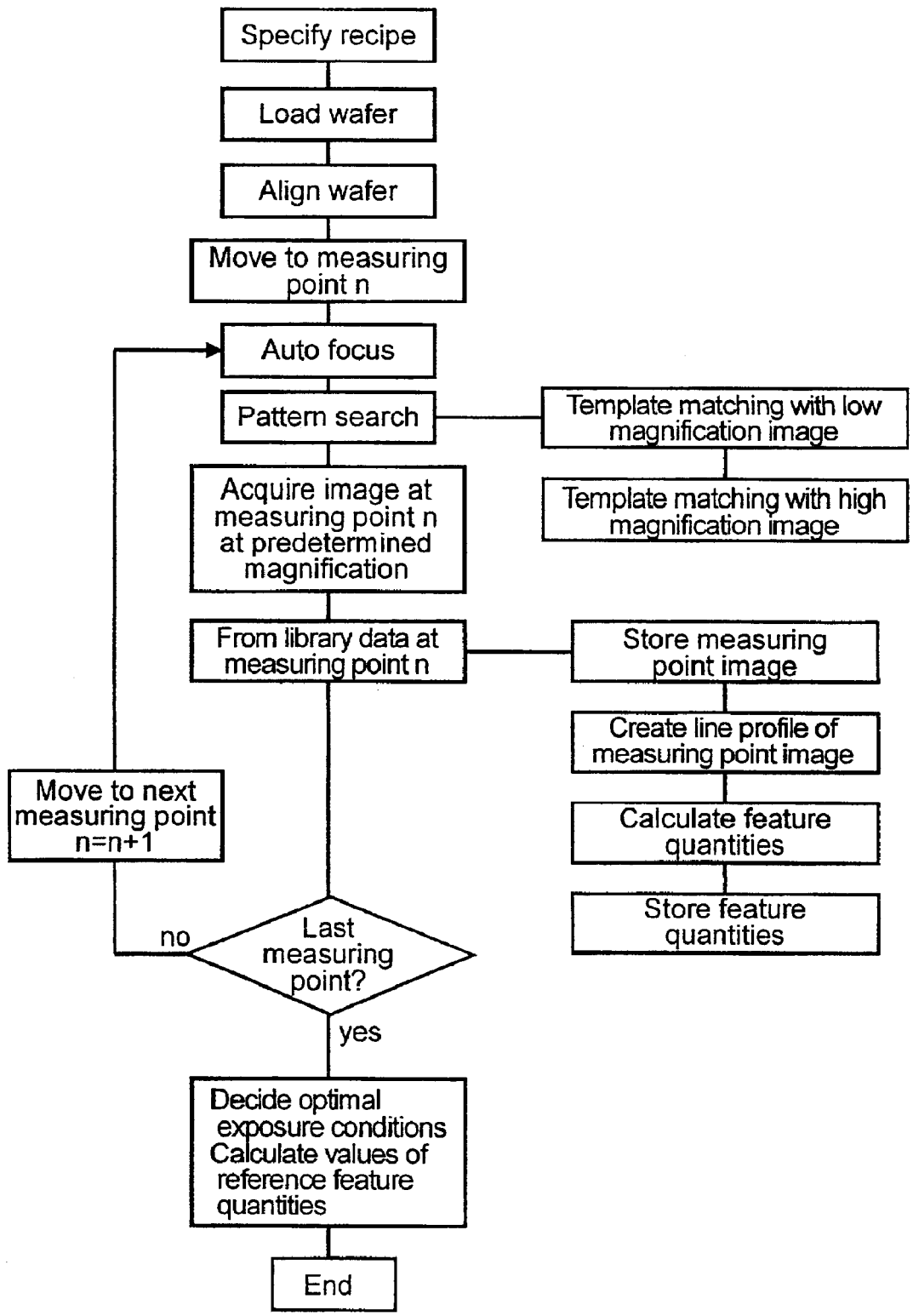
FIG. 13 is a sequence chart showing a procedure for creation of the reference database in the first embodiment.

Next, the reference database 301 will be described. In this embodiment, prior to putting a product wafer into the process, a reference database is created using the FEM wafer shown in FIG. 4. FIG. 13 shows a flowchart for creation of the reference database using the FEM wafer. The flow includes the steps of: first, specifying the recipe; loading and aligning the wafer; subsequently, moving the wafer to a test point; adjusting the focus and searching the pattern by means of template matching, setting the test point in the field of observation and acquiring the image; and calculating the feature quantities from the image data –t the test point and storing them.

This procedure is performed for all test points. The feature quantities thus obtained are stored so as to be paired with the data of the exposure and the focus (FIG. 14(*a*)). Next, by using this database, the optimal exposure conditions are obtained and at the same time the tolerances for the three index-values are determined.

Figure 14:
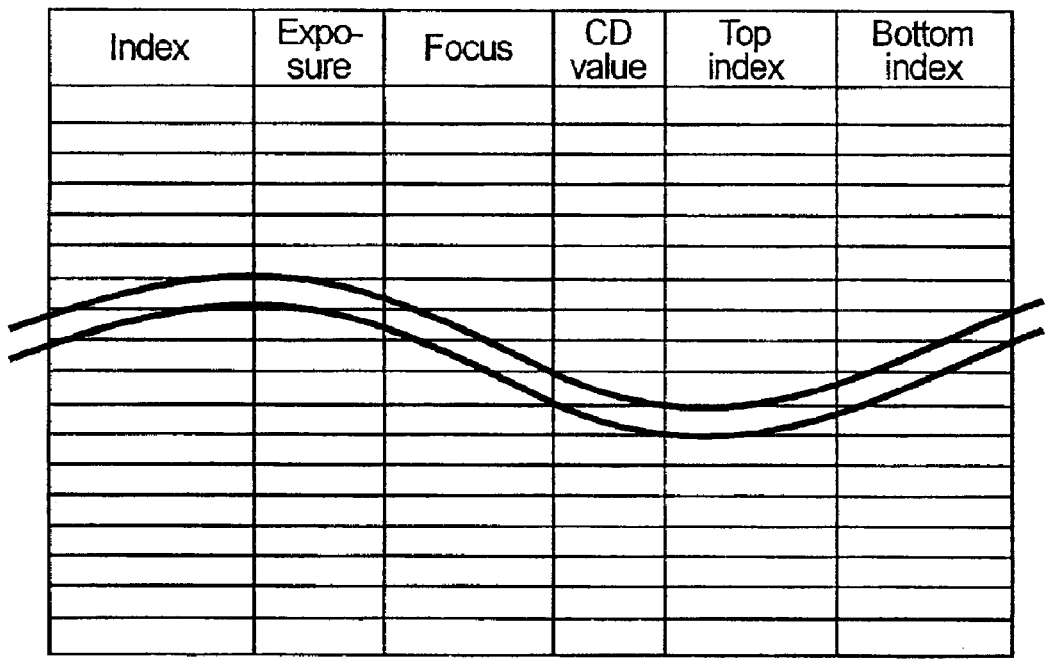
FIG. 14(a) is a diagram of a table showing the data stored in the reference database in the first embodiment.
FIG. 14(b) is a table showing a relationship between the optimal exposure conditions and a set of exposure and focus values.
FIG. 14(c) is a table showing the relationships between the upper limit and the lower limit for each of the CD value, the top index-value, and the bottom index-value.
Figure 15:
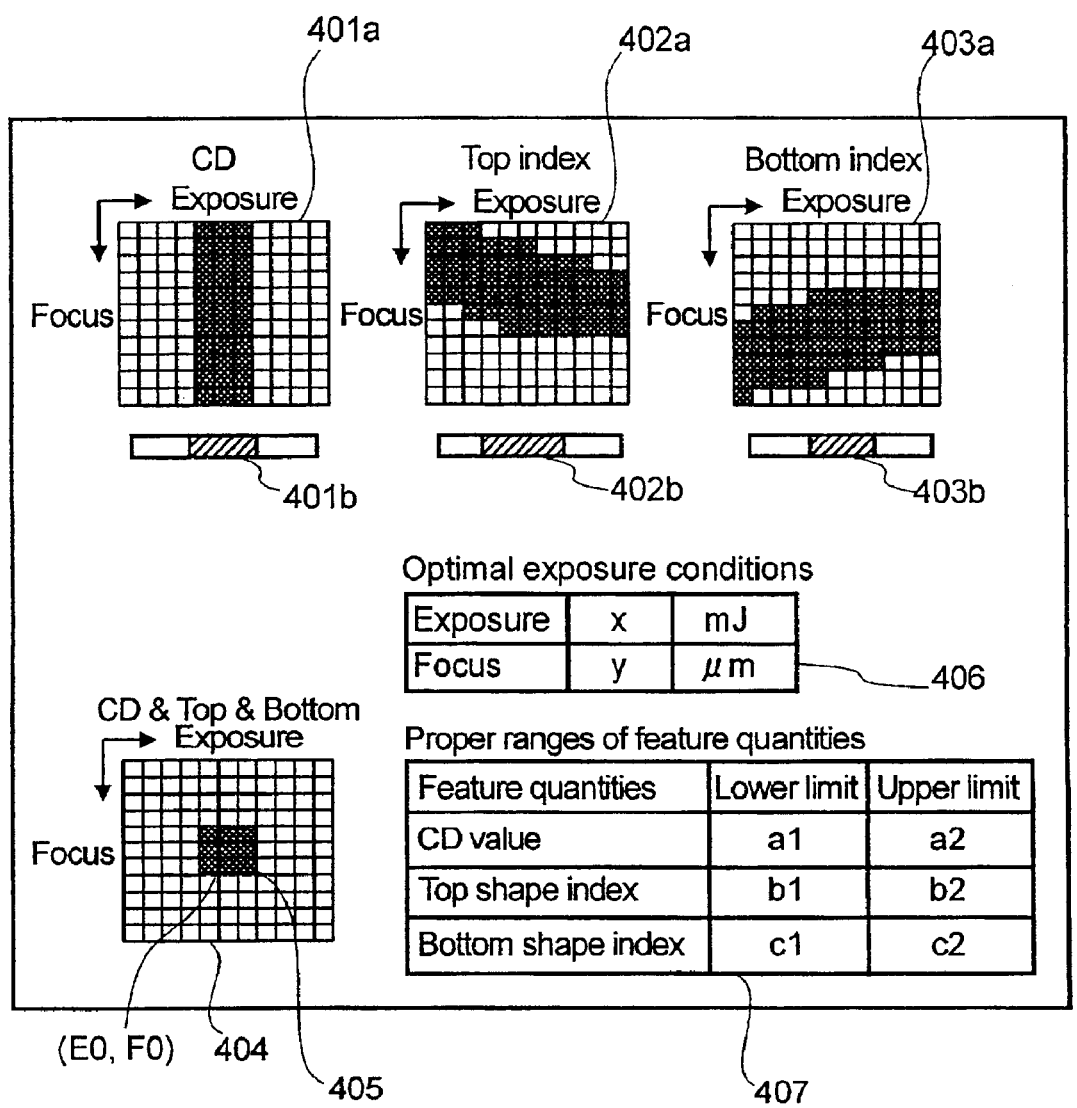
FIG. 15 is a diagram of a display screen showing an example of the process-window setting GUI according to the first embodiment.

FIG. 15 shows one example of a GUI screen used to determine the optimal exposure conditions. In an insert 401*a*, the CD values are displayed for different exposures and different foci by referring to information of FIG. 14(*a*). A displayed contest is any one of (1) readings of the CD values, (2) color-coded representation of the CD values according to magnitude, (3) color-coded representation of the CD values designating an in-proper range and an out-of-proper range that are set by a bar 401*b* for setting a proper range.

Regarding the top index-value DI and the bottom index-value DO, the same representations are provided at inserts 402 and 403, respectively. In an insert 404, a product set 405 of the proper ranges for the CD value, the top index-value DI, and the bottom index-value DO is displayed. This product set becomes the so-called process window. The user can determine the process window by setting the proper ranges of the feature quantities with the help of the bars 401*b*, 402*b*, and 403*b*, and besides, he or she can determine the proper ranges of the feature quantities by setting the process window on the insert 404 conversely.

A center value (E0, FO) located in the middle of the process window represents the optimal exposure conditions, which are displayed in a table 406 and also stored in the reference database (FIG. 14(*b*)). Moreover, these values will become the exposure conditions for the product wafer coming thereafter. The determined proper ranges for three feature quantities are displayed in a table 407, and they also are stored in the reference database (FIG. 14(*c*)).

Next, the steps 2003–2005 in FIG. 1 will be described.

At the step 2003, three feature quantities (i.e., the CD value, the top index, and the bottom index) calculated from the electron beam image of the product wafer subject to inspection are compared with the information of FIG. 14(*c*), and if all three quantities satisfy the conditions, the lithography process is assumed to be normal. If any one of the three quantities deviates from the pertinent condition, the flow proceeds to steps 2004, 2005, where the three feature quantities are compared with the information of FIG. 14(*a*), and an index i designating a set of feature quantities that best agree with the calculated feature quantities is obtained. Now it is understood that differences ΔE and ΔF between a set of the exposure E(i) and the focus F(i) designated by the index i and a set of the optimal exposure E0 and the optimal focus F0 (ΔE=Ei)–E0, ΔF=F(i)–F0) are the deviations of the conditions of the resist pattern subject to inspection from the proper ranges. The values ΔE and ΔF are fed back to the exposure equipment to correct the exposure conditions thereafter (step 2006 in FIG. 1).

Figure 16:
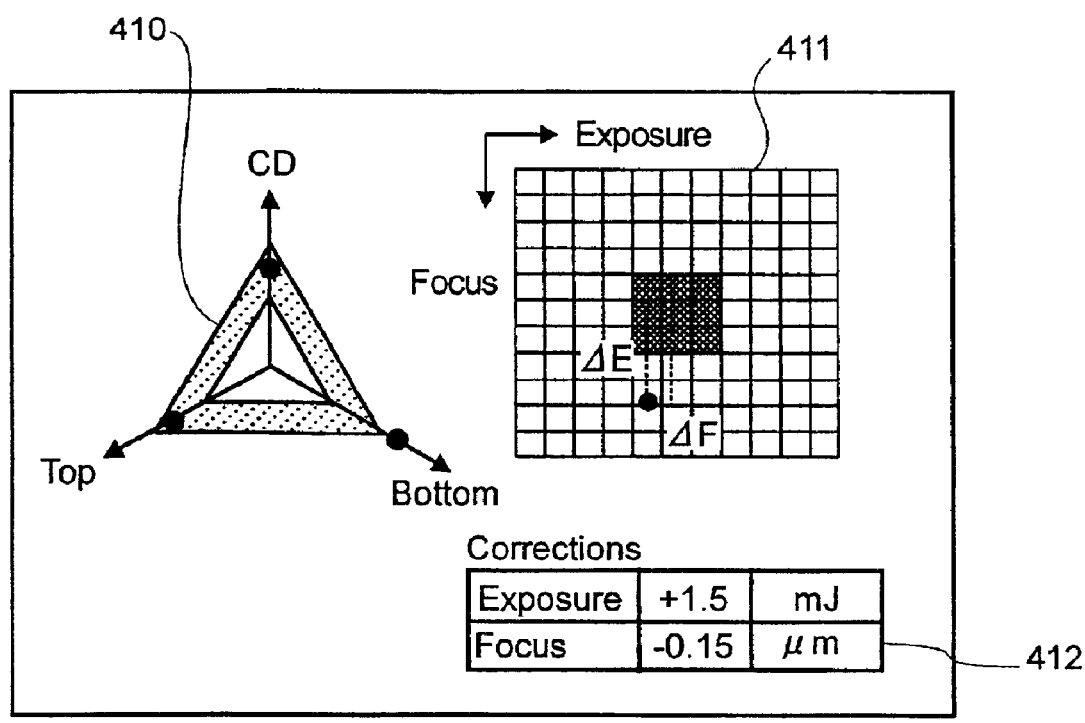
FIG. 16 is a diagram of the display screen showing an example of a process monitoring GUI according to the first embodiment.

FIG. 16 is a schematic drawing of the GUI screen on which the user confirms the state of variation of the exposure conditions. An insert 410 displays how each of the three feature quantities deviated from its, proper range, respectively. In an insert 411, the deviations ΔE, ΔF from the optimal exposure conditions are displayed while being superposed over the process window, so that the user can confirm on the screen how much margins the exposure and the focus have, respectively. Note that, in FIG. 1, the exposure conditions are assumed to be automatically corrected based on information of the calculated variation quantities ΔE and Δr. However, it goes without saying that the operator may alter the exposure conditions in accordance with the corrections of the exposure conditions displayed on the screen, as shown in FIG. 16.

Moreover, in the system of FIG. 1, the acquisition of the electron beam image through quality judgment of the pattern shape, plus the calculation of the corrections, of the exposure conditions are performed in the CD-SEM 200. However, the following scheme may be adopted: in the production line of FIG. 42, only acquisition of the image is performed by the CD-SEM 200, and the remaining part of processing is executed by the QC data collection and analysis system 501 and the equipment control system 500, or by using another computer connected with these systems through a communication network. The alteration of the exposure conditions may be automatically executed by the equipment control system 500, or it may be directed by a human operator who confirms the results through the display and communication means 503.

According to this embodiment No. (1-0), first it becomes possible to detect the abnormality in the shape of the resist pattern, such as the rounding and the footing, which has been impossible to detect conventionally with the CD values alone, by virtue of introduction of the top index and bottom index, in addition to the conventional CD value. Consequently, this embodiment can prevent an abnormality in the shape of the post-etching film pattern resulting from an abnormality in the resist pattern shape. Further, there is also an advantage that not only the existence of the abnormality, but also a portion where the shape abnormality occurs can be found specifically, for example, whether or not the rounding occurs and whether or not the footing occurs.

Second, since it is possible to detect not only an abnormality in the shape, but also variations of the exposure and the focus, that are main factors therefore, quantitatively, more accurate process feedback becomes possible. Especially, since the focal depth of the exposure tends to become shallower as the pattern rule reduces, knowledge of the variation in quantity of the focus will provide a large effect.

As a third point, the work needed to determine the optimal exposure conditions becomes easy and of high precision in various respects. Taking one example, since the states of the size, the rounding, and the footing are expressed numerically, the optimal conditions can be determined without relying on guesswork. Moreover, also in the case where the wafer is cut to examine the cross section or where the wafer is processed by means of FIB to observe the cross section, only a few points on the FEM need to be observed, and the cross sections at other points can be predicted from the feature quantities; therefore, a large amount of time required to observe the cross sections can be saved. Possibly, there is an advantage in that the setting of the proper ranges is easy for the operator to understand because each feature quantity is one that is linked with the cross section.

Figure 2:
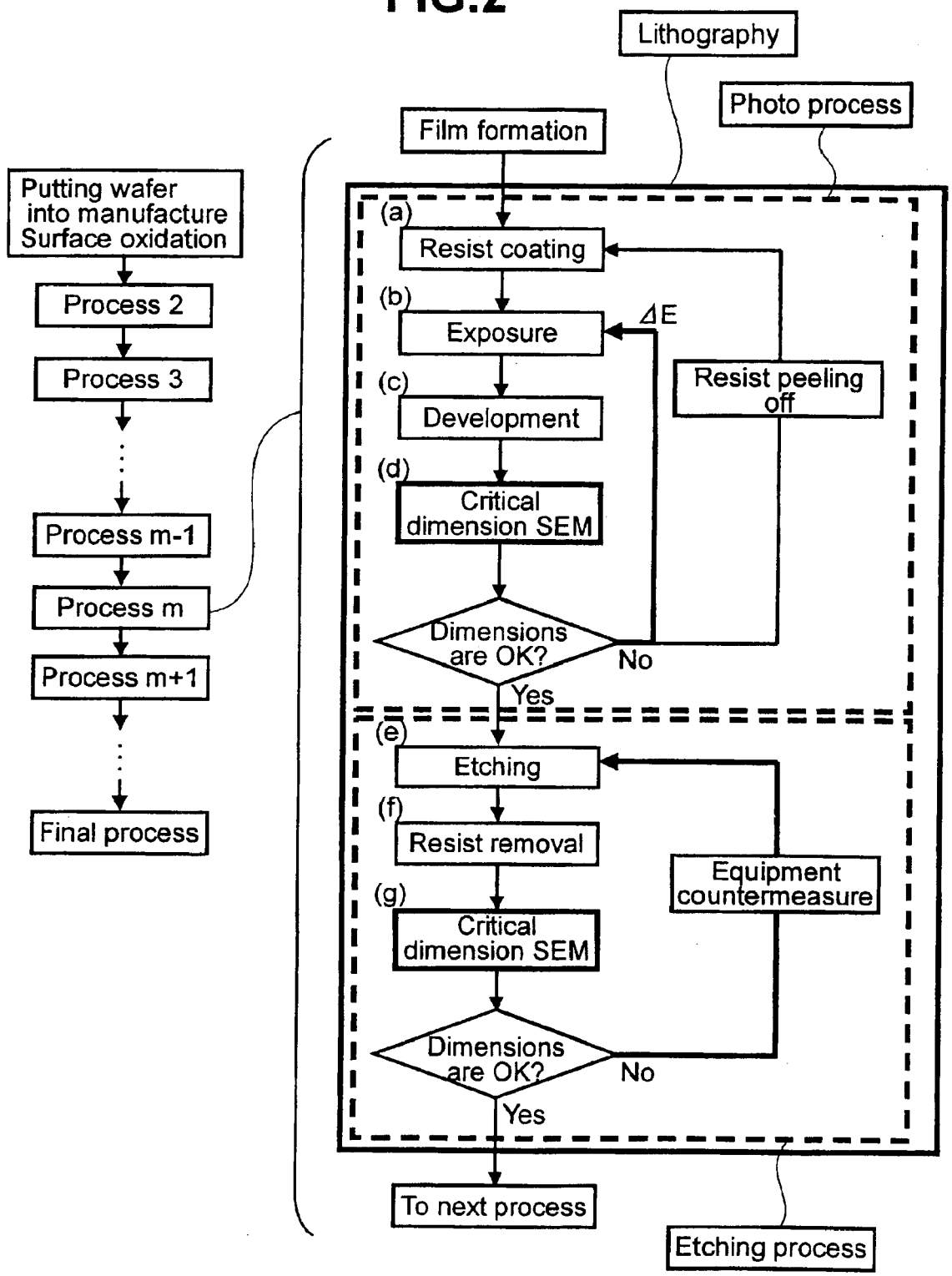
FIG. 2 is a flowchart showing a conventional lithography process.
Figure 3:
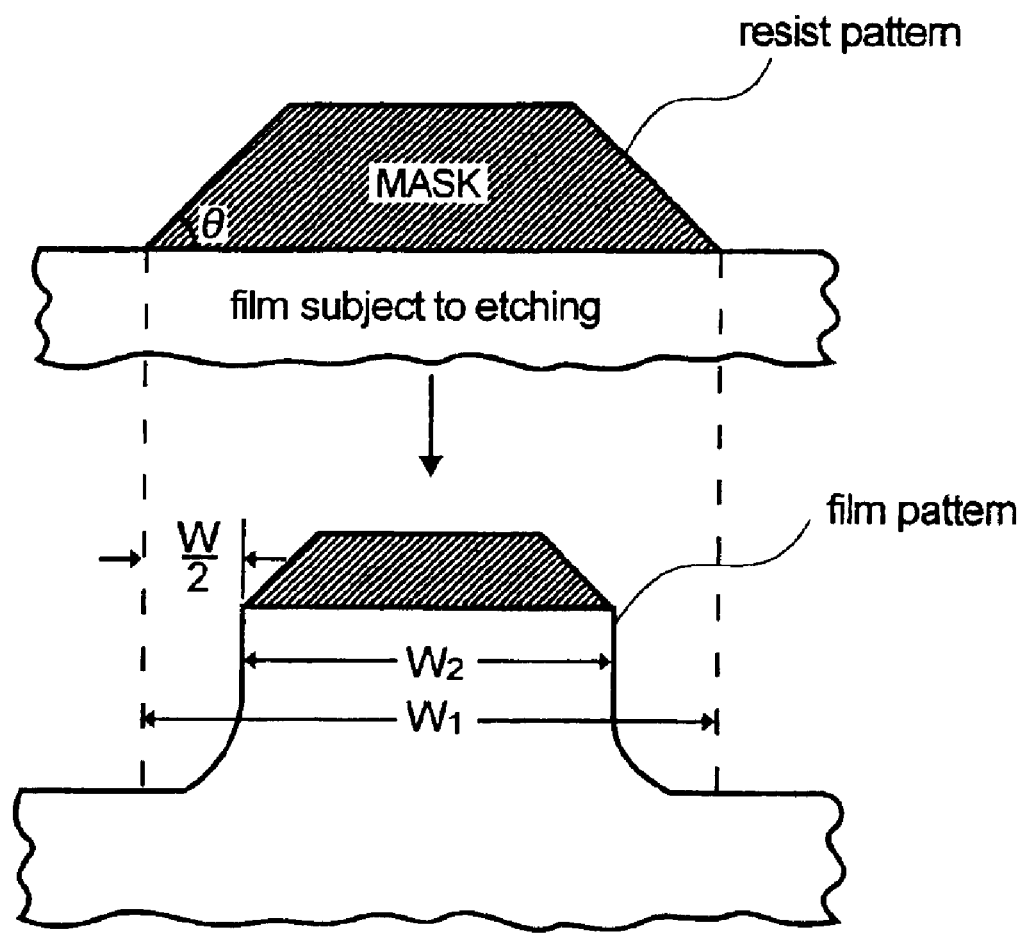
FIG. 3 is a diagrammatical sectional view of the wafer showing the relationship between a resist pattern and a film pattern before and after etching.

Fourth, since the time required for a series of operations (the steps 2001–2005 in FIG. 1) is little more than that at a step in which the dimension measurement is performed using the CD-SEM in the conventional lithography process ((d) of FIG. 2), it is also an advantage that the process does not sacrifice the throughput despite having a number of advantages, as described above.

Note that in the lithography process that uses plural pieces of exposure equipment, since each piece of the exposure equipment has a difference relative to other ones, it is preferable that a reference database has been created for each piece of exposure equipment. Further, although the foregoing explanation has been directed to the use of a line pattern as an example, it is feasible to apply this embodiment to other patterns, such as a circular pattern, by modifying the method fabricating the line profile.

Furthermore, to this point no mention has been made of image acquisition points on the wafer that is subject to inspection. It is preferable in actual operation when, as shown in FIG. 23 images are acquired at predetermined points on the wafer (for example points designated with a symbol X in FIG. 23(*b*)) and the feedback quantities $\Delta E$ and $\Delta F$ of the exposure conditions are determined by judging the feature quantities obtained from those images from a comprehensive standpoint.

Figure 23:
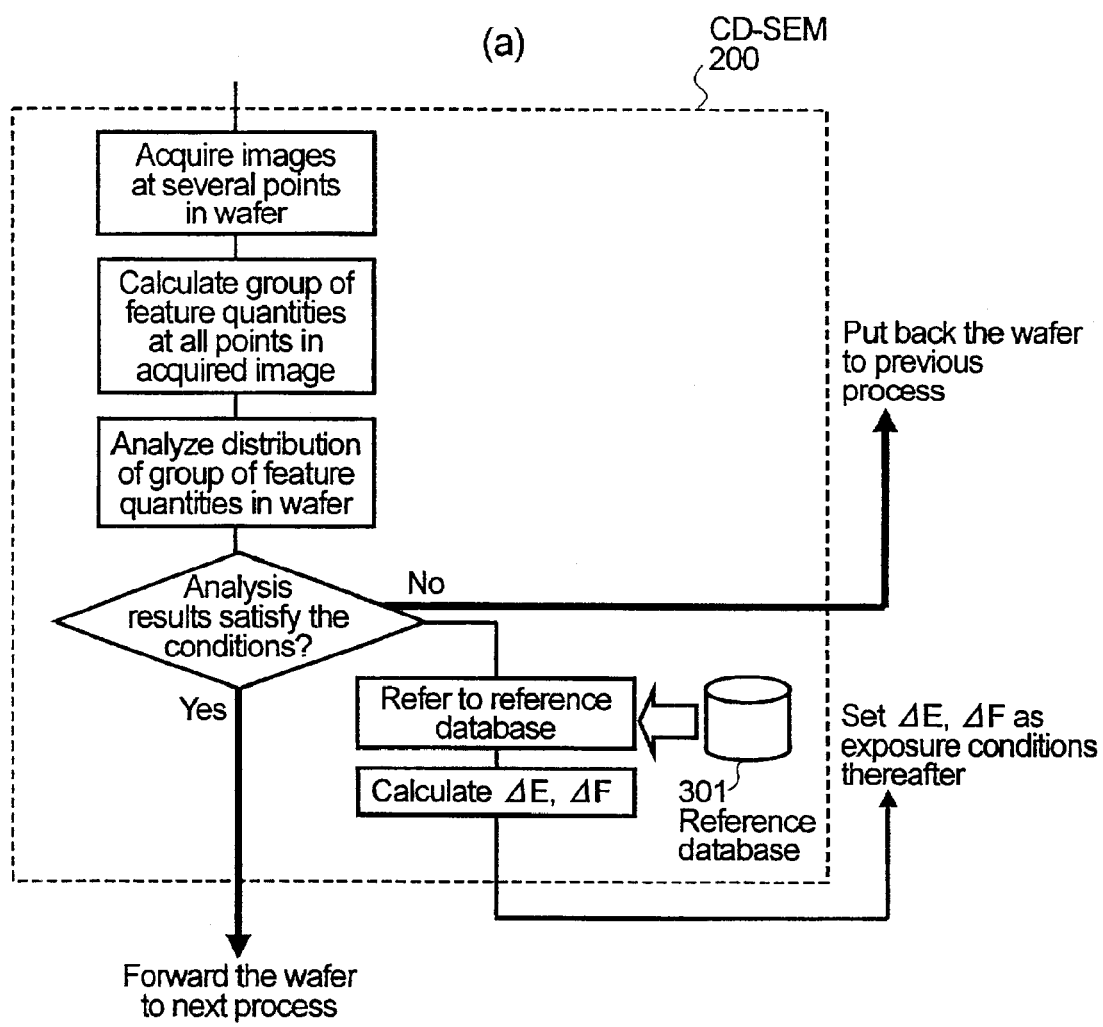
FIG. 23(a) is a flowchart illustrating the operational procedure of the lithography-process monitoring system.
FIG. 23(b) is a plan view of the wafer, both of which are for supplementary explanation of the first embodiment of the present invention.

In this case, a distribution of the feature quantities in the wafer can be found by grouping positions designated with the symbol X in FIG. 23(*b*) to, for example, four regions (groups) consisting of upper, lower, right, and left regions; and, further, either (a) by adding up the feature quantities of the images at the positions designated with the s-bol X in each region to derive a set of feature quantities, or (b) by synthesizing the line profile for each region by addition of the line profiles at the positions designated with the symbol X in each region and then obtaining the feature quantities from the synthetic line profile of the region concerned, so that the feedback quantities AE and AF of the exposure conditions can be set for each region of the wafer.

Moreover, it becomes possible to obtain a distribution of the feature quantities in a unit exposure region (more specifically, in the exposure of the step and repeat method, a region corresponding to one shot of exposure; in the scanning exposure method wherein the wafer and the mask are relatively moved successively, one scan region) at the time of the exposure, in the same manner as described above, and, further, the exposure conditions can be adjusted according to this distribution in the unit exposure region. Here, the adjustment of the exposure conditions includes not only adjusting the exposure and the exposure time, but also adjustment by modification of conditions of an exposure mask (size of the mask pattern, amount of distortion of the mask, etc.) for the adjustment.

(1-1) Variant 1

In the above-mentioned embodiment No. (1-0), the actual values of feature quantities, as shown in FIG. 14(*a*), that are correlated to the exposure and the focus, are stored in the reference database. Alternatively, a method may be adopted whereby the relationships between the exposure conditions and the feature quantities are described in the form of functions, and these functions are stored in the reference database. In the stage of creating the reference database, first the feature quantities are calculated from the electron beam image for all points on the FEM, and then the relationships between the feature quantities and the exposure and between the feature quantities and the focus are approximated with suitable functions capable of expressing the relationships (for example, the data are applied to the polynomial expressions representing the relationships). A specific example will be described.

Figure 17:
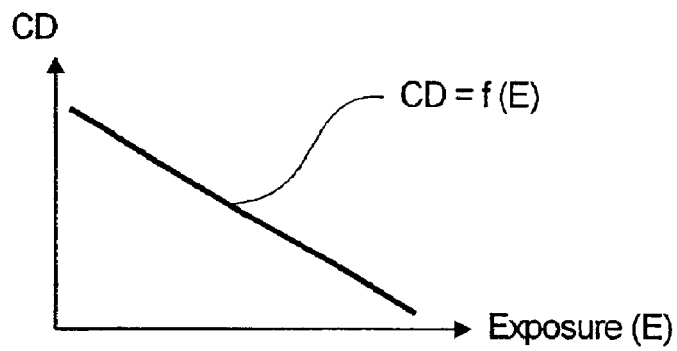
FIG. 17(a) is a graph showing a relationship between the exposure and the CD value.
FIG. 17(b) is a graph showing a relationship between the focus and the top index with different exposures as a parameter.
FIG. 17(c) is a graph, showing the relationship between the focus and the bottom index with different exposures as a parameter.
Figure 17:
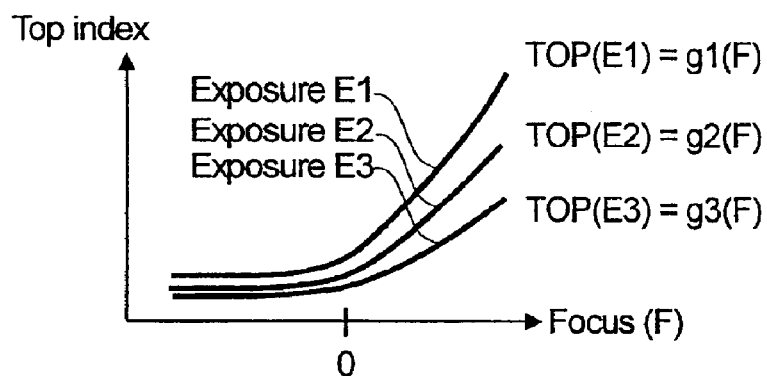
Figure 17:
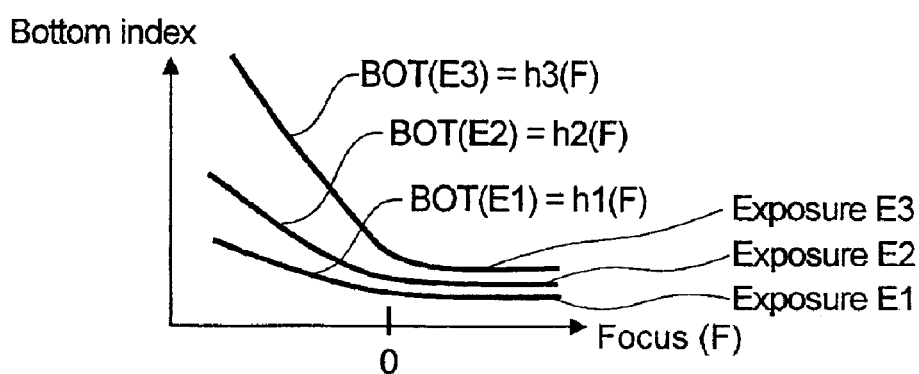

FIG. 17(*a*) shows the relationship between the CD value and the exposure. Since the CD value varies in almost direct proportion to the exposure (not depending on the focus), a linear expression of E is applied to the CD value and an expression C=f(E) is obtained. FIG. 17(*b*) shows the relationship between the focus and the top index for several different exposures. Since the top index-value hardly changes when the focus shifts into a negative region, fitting is considered only for a region F>0, and an expression of F, for example, a quadratic expression of F, is fitted to the data to obtain TOP(E1)=g1(F), TOP(E2)=g2(F) . . . FIG. 17(*c*) shows the relationship between the focus and the bottom index for several different exposures. Since the bottom index-value hardly changes when the focus shifts into a positive region, fitting is considered only for a region F<0, and an expression of F, for example, a quadratic expression of F, is fitted to the data to obtain BOT(E1)=h1(F), BOT(E2)=h2(F) . . . In the reference database, f(E), TOP(E1), TOP(E2) . . . , BOT(E1), BOT(E2) . . . are stored.

At the step 2004 in FIG. 1, first the CD value is substituted into the function CD=f(E) to obtain the exposure Ex, and then the exposure Ex is substituted into the function gx(F) that expresses the relationship between the focus and the top index TOP and also is substituted into the function hx(F) that represents the relationship between focus and the bottom index BOT to find the Locus Fx. The differences between these values and a set of the optimal exposure E0 and the optimal focus F0, $\Delta E$ and $\Delta F$ ($\Delta E=Ex-E0$, $\Delta F=Fx-F0$) are considered to be the deviations of the resist pattern subject to inspection from the proper ranges of the exposure conditions for the resist pattern.

According to this embodiment No. (1-1), there is an advantage that the reference database can be reduced in its scale, in addition to the effects of the embodiment No. (1-0) described in the foregoing. Utilizing this advantage, the exposure equipment and a developing machine may have respective functions. Further, since the exposure conditions Ex and Fx are simply calculated as described above, there is an advantage that the processing time can be lessened markedly.

Note that, here, the relationship between the CD value and the exposure is represented as a linear expression and relationships between the top index and the focus and between the bottom index and the focus are represented as quadratic expressions, respectively. However, these relationships merely represent one example, and it is preferable to adopt functions that match the situation of the subject of the inspection.

(1-2) Variant 2

Figure 18:
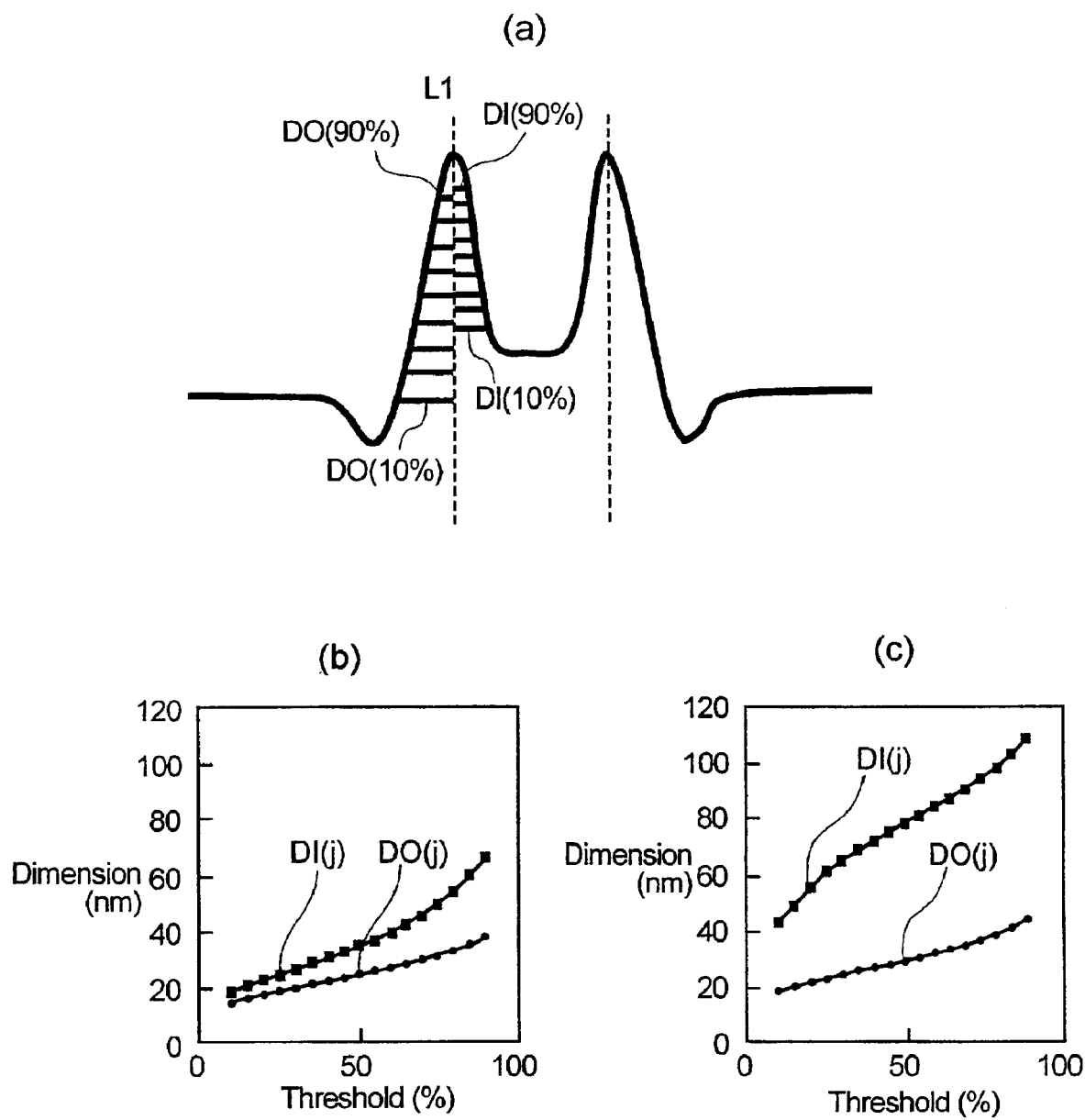
FIG. 18(a) is a graph showing a line profile.
FIGS. 18(b) and 18(c) are graphs each showing behaviors of DI and DO of the pattern produced under mutually different exposure conditions.

In the above-mentioned embodiment No. (1-0), the average value DO of the left side widths DO(j) and the average value DI of the right side widths DI(j), that are defined when the peak portion is divided into the left-side, and the right-side sub-portions with a straight line Li, as used. However, DO(j) and DI(j) as they are may be used. In FIG. 18(*a*), setting a value of the maximum point to 100% and setting the right-side and left-side minimum values to 0% when the profile is divided into right-side and the left-side sub-portions, DO(j) and DI(j) are calculated at every 5% of the profile from 10% to 90%. Therefore, a total of 35 points consisting of 17 DO(j), 17 DI(j), and additionally the CD value are used as the feature quantities. FIG. 18(*b*) and FIG. 18(*c*) shows examples of the behaviors of DO(j) and DI(j) obtained under mutually different exposure conditions, respectively.

At the steps 2004–2005 in FIG. 1, the feature quantities of the product wafer are compared with plural sets of feature quantities stored in the reference database, and an index i designating a set of the feature quantities that best agree with the said feature quantities (hereinafter referred to as "best agreed index i") is obtained. For example, denoting the feature quantities of the product wafer as I (I is a vector having 35 feature quantities as elements), the feature quantities for each set of exposure conditions in the reference database as R(i) (R(i) is a vector having 35 feature quantities as elements with i: index of the exposure conditions), all that should be done by the method is to find an index for representing the exposure conditions that minimize $(R(i)-I)^2$.

Figure 19:
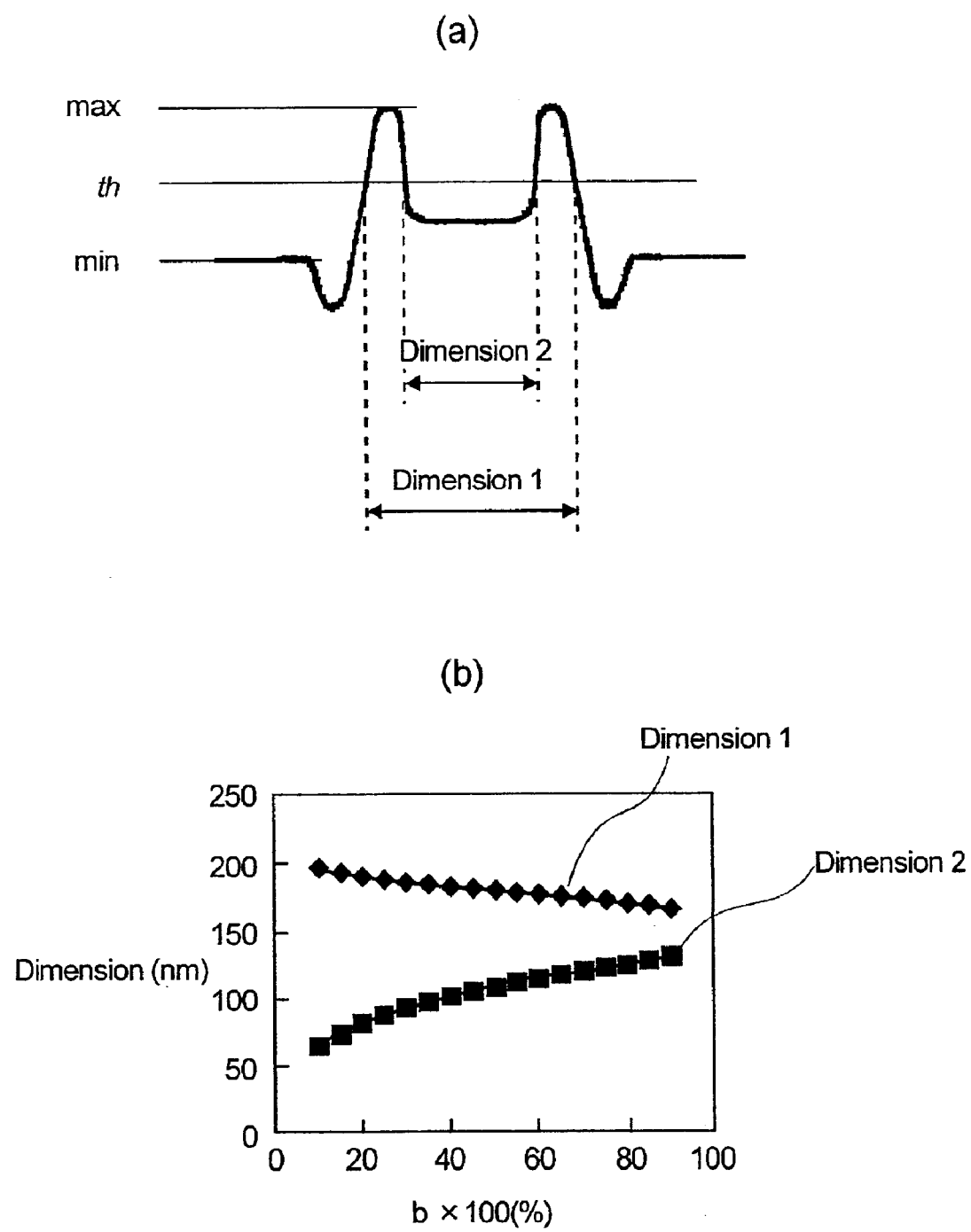
FIG. 19(a) is a diagram showing the line profile.
FIG. 19(b) is a graph showing the relationship of a dimension 1 and a dimension 2 versus the size of b.

According to this embodiment No. (1-1), although the processing time that is necessary to obtain the best agreed index i for the feature quantities increases only so long as the number of the feature quantities is larger than the embodiment No. (1-0), there is an advantage that the certainty of calculating the index i increases. Note that cutting the profile at every 5% is merely an example, and it is also possible to increase or decrease the number of points. Alternatively, the dimension 1 and the dimension 2 shown in FIG. 19(*a*) may be used instead of DO(j) and DI(j) in FIG. 18(*a*).

(1-3) Variants

Figure 20:
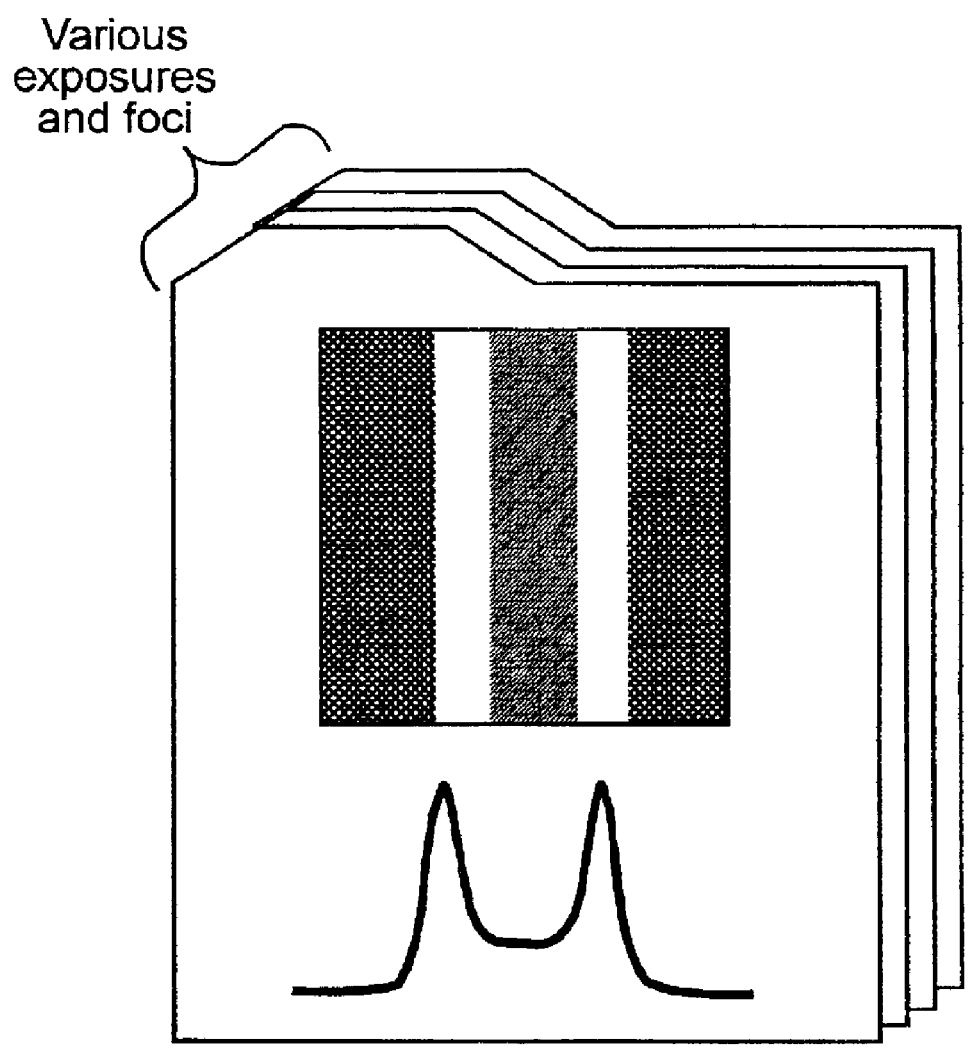
FIG. 20 is a further different sketch of the feature quantity database used in the first embodiment of the present invention.

As other different feature quantities, the acquired electron beam image as it is or the line profile can be used. At a stage in which the reference database is created, the acquired image and line profile are stored as a set together with the exposure conditions (FIG. 20). First, a case where the electron beam image is used as it is will be described. The electron beam image of the product wafer subject to inspection is denoted by I(x, y), the electron beam image under the optimal exposure conditions stored in the reference database by R0(*x*, y), and the electron beam image of the exposure condition number i by Ri(x, y). Here, (x, y) represent coordinates in the image.

At the step 2003 in FIG. 1, a correlation value (normalized correlation) between I(x, y) and R0(*x*, y) is obtained, and if the correlation value is less than a previously determined threshold value, the flow proceeds to the steps 2004, 2005. At the steps 2004, 2005, the correlation value between I(x, y) and Ri(x, y) (i=1, 2, 3) is obtained one by one and the exposure condition number i that gives the highest correlation value is found. Representing the exposure and the focus at the exposure condition number i by E and F, respectively, the differences $\Delta E$ and $\Delta F$ ($\Delta E=Ex-E0$, $\Delta F=Fx-F0$) between a set of these values and a set of the optimal exposure E0 and the optimal focus F0 are the deviations of the exposure conditions of the resist pattern subject to inspection from the proper ranges.

When the line profile is used, the procedure is exactly the same. The electron beam image of the product wafer subject to inspection is denoted by I(x), the electron beam image under the optimal exposure conditions stored in the reference database by R0(*x*), and the image at the exposure condition number i by Ri(x). Here, x represents a coordinate of the line profile. At the step 2003 in FIG. 1, the correlation value between I(x) and R0(*x*) (normalized correlation) is obtained, and if the correlation value is less than the previously determined threshold, the wafer proceeds to the steps 2004, 2005. At the steps 2004, 2005, the correlation value between I(x) and Ri(x) (i=1, 2, 3,) is obtained one by one, and the exposure condition number i with the highest correlation value is found. Representing the exposure and the focus at the exposure condition number i by E and F, respectively, the differences $\Delta E$ and $\Delta F$ ($\Delta E=Ex-E0$, $\Delta F=Fx-F0$) between a set of these values and a set of the optimal exposure E0 and the optimal focus F0 are the deviations of the exposure conditions of the resist pattern subject to inspection from the proper ranges.

When the actual electron beam image is used in this embodiment No. (1-3), although there is a disadvantage that the scale of the reference database becomes larger, on the other hand, there is an advantage that the method can be applied to every pattern. In general, since the electron beam image has a low S/N, in order to obtain a line profile suitable for the processing, it is absolutely necessary to perform line addition as shown in FIG. 11(*a*). It is only for the line pattern that simple line addition can be carried out and other patterns need some devise in performing the line addition (e.g., in the case of a circular pattern, plural cross sections along different diameters are added, etc.), so that it is difficult to apply this method to every pattern. If the actual electron beam image is used, there is no constraint about the pattern configuration. A scheme may be adopted whereby the embodiments described in the foregoing, ore used properly according to the pattern configuration.

Second Embodiment

Figure 21:
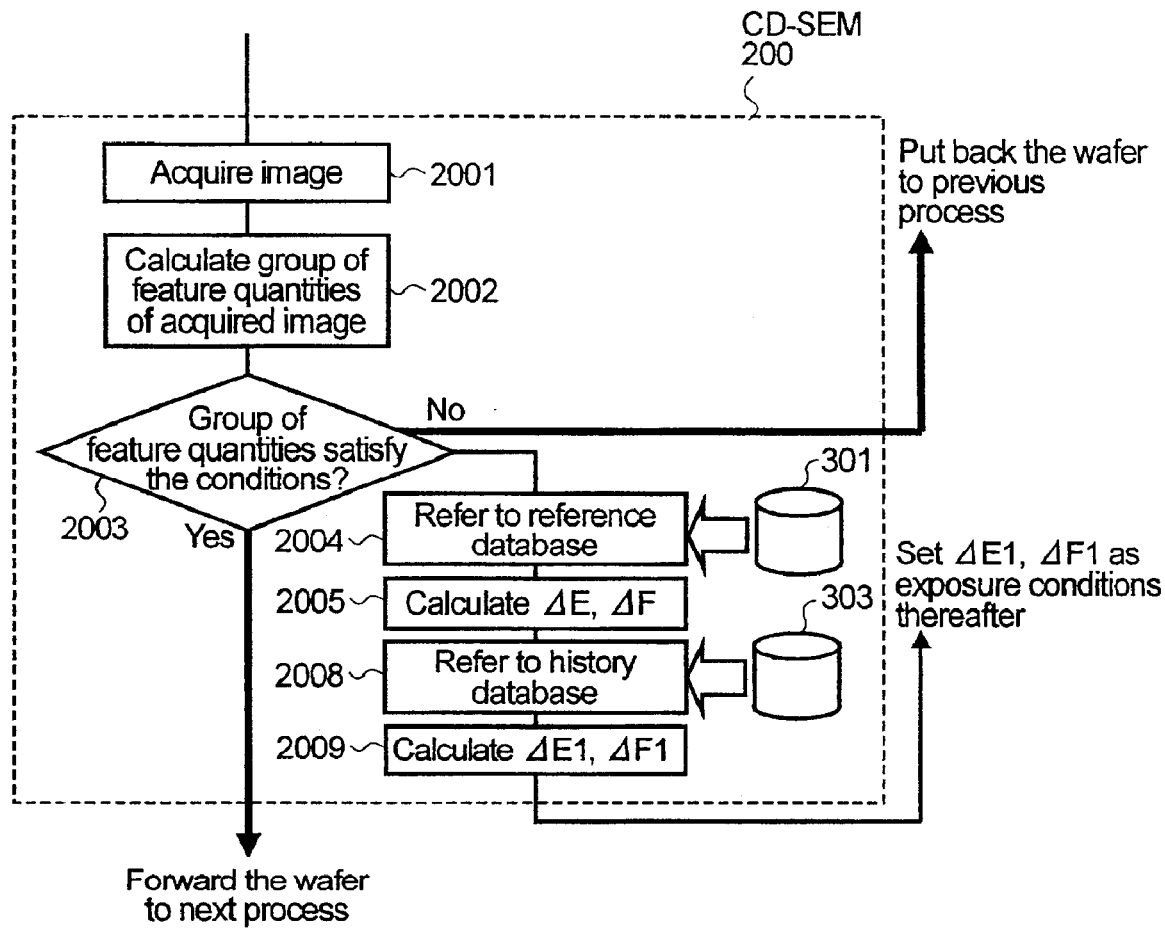
FIG. 21(a) is a flowchart showing a procedure of operations of the lithography-process monitoring system according to a second embodiment of the present invention.
FIG. 21(b) provides graphs showing relationships between the lot number and the ΔE and between the lot number and the ΔF, respectively.
Figure 21:
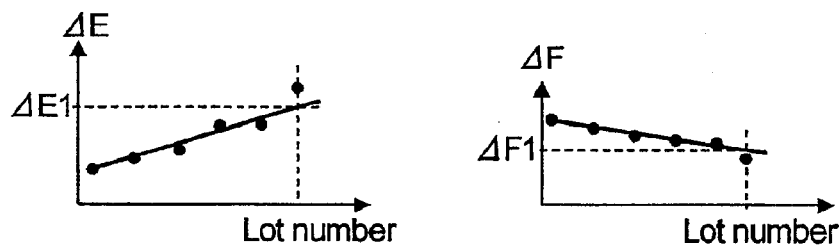

FIG. 21(a) shows a processing sequence in the lithography process monitoring system constructed on the CD-SEM 200, according to a second embodiment of the present invention.

In FIG. 21(a), the steps 2001–2005, in which calculation of ΔE and ΔF is fully achieved, are the same as in the first embodiment. Subsequently, ΔE and ΔF, as they are, are not fed back to the exposure equipment, but the feedback quantities ΔE1 and ΔF1 are determined by referring to a history database 303 and using the information of past ΔE and ΔF. For example, in the history database 303, ΔE and ΔF for a few lots are stored in the past are stored, and definitive feedback quantities ΔE1 and ΔF1 are determined by approximating the history data with a straight line, as shown in FIG. 21(b).

Even under the same exposure and the same focus, a completely identical resist pattern is not necessarily produced when observing it microscopically, and, in addition, ΔE and ΔF that were calculated from each subject of the inspection may have a certain error because of a slight difference in the image taking condition of the CD-SEM, a calculation error of the feature quantities, etc. Since it is not that the focus varies abruptly, but that it vines in a drifting manner, this embodiment can execute stabler process control compared to a case where the results of a single calculation is used to determine the feedback quantity.

Incidentally, in FIG. 21(a) the history database is assumed to exist on the CD-SEM. However it goes without saying that it is not necessary for the database to be on the CD-SEM and that it may be on another storage device in the network, as shown in FIG. 42. Further, in the figure, data of a few lots in the past are assumed to be history data, but data of a few lots are merely an example and the history data is not limited to this.

Third Embodiment

Figure 22:
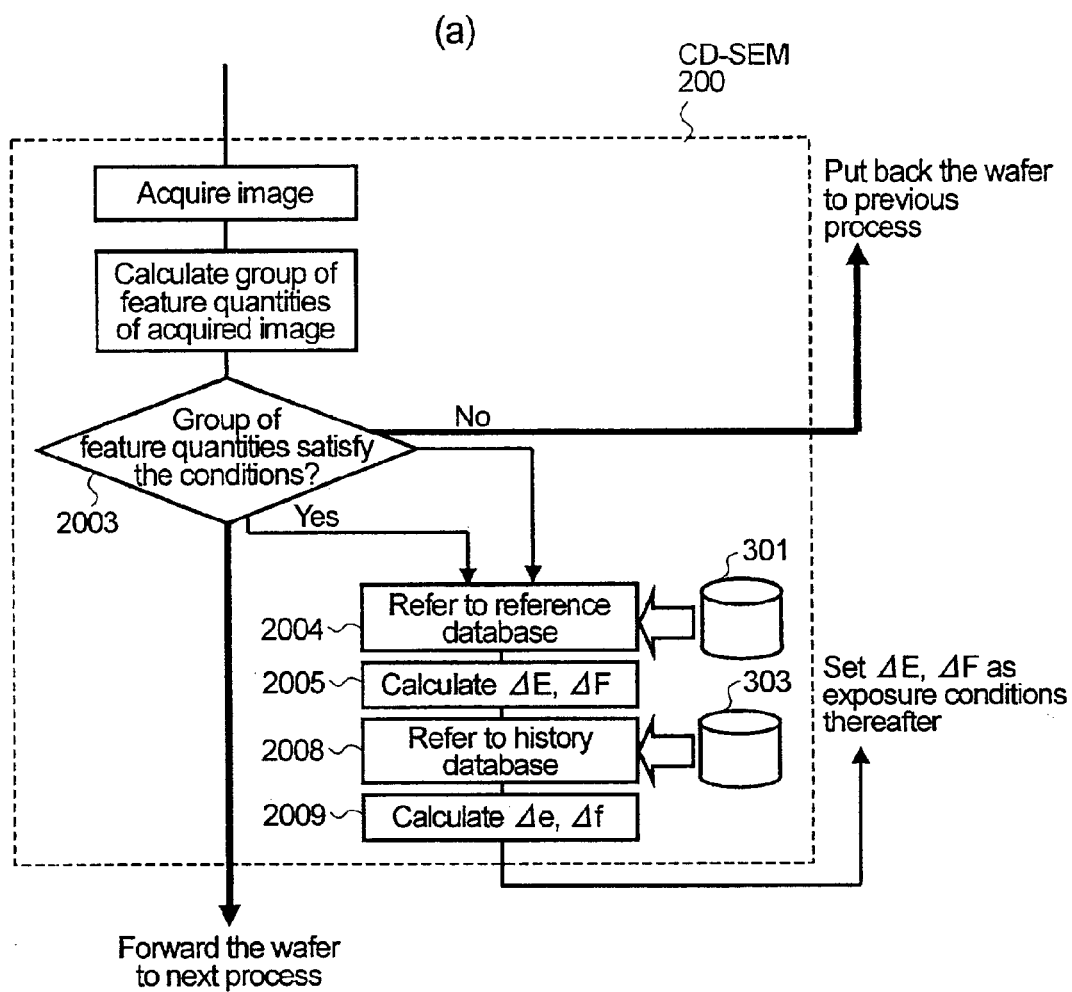
FIG. 22(a) is a flowchart showing a operational procedure of the lithography-process monitoring system according to a third embodiment of the present invention.
FIG. 22(b) provides graphs showing relationships between the lot number and the ΔE and between the lot number and the ΔF, respectively.
Figure 22:
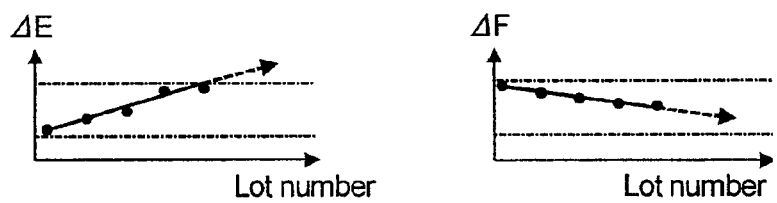

FIG. 22(a) shows a processing sequence of the lithography-process monitoring system constructed on the CD-SEM 200, according to a third embodiment of the present invention.

In the first and second embodiments, it is only when the group of feature quantities do not satisfy the conditions at the step 2003 the routine of calculating ΔE and ΔF is performed. However, in this embodiment, even when the group of feature quantities of the subject of the inspection satisfy the conditions, referring to the history database 303 and based on the trends of variations of ΔE and ΔF from the past, the situations in the future are predicted; and, if necessary, fine tuning of the exposure conditions (Δe, Δf) is executed.

In FIG. 22(b), a range between the alternate long and short dash lines represents a process window. The exposure tends to be on an upward trend and in the next run the exposure is at a risk of going out of the process window. On the other hand, the focus tends to be on a downward trend. In this case, the subject of the inspection in this run is made to proceed to the next process as it is, but in future runs thereafter, the exposure conditions are adjusted by the amounts of Δe and Δf.

According to this embodiment, when an indication that the exposure conditions are going out of the standard range is detected, the exposure conditions can be adjusted in an advanced control manner as described above; therefore, the number of wafers that need to be subjected to the re-exposure process can be decreased. Further, as the deviations from the standard ranges become larger, it becomes difficult to estimate the adjustment quantities of the exposure conditions with high precision; also, in that sense, there is a large effect associated with constant controlling of the deviations to prevent them from becoming too large. Incidentally, in FIG. 22, the history data is assumed to be stored in the CD-SEM. However, it goes without saying that this data is not necessarily stored in the CD-SEM and that the database may be on other storage devices in the network, as shown in FIG. 42. Further, in the figure, data of a few lots in the past are used as the history data, but data of a few lots are merely an example and the history data is not limited to this.

Fourth Embodiment

Figure 24:
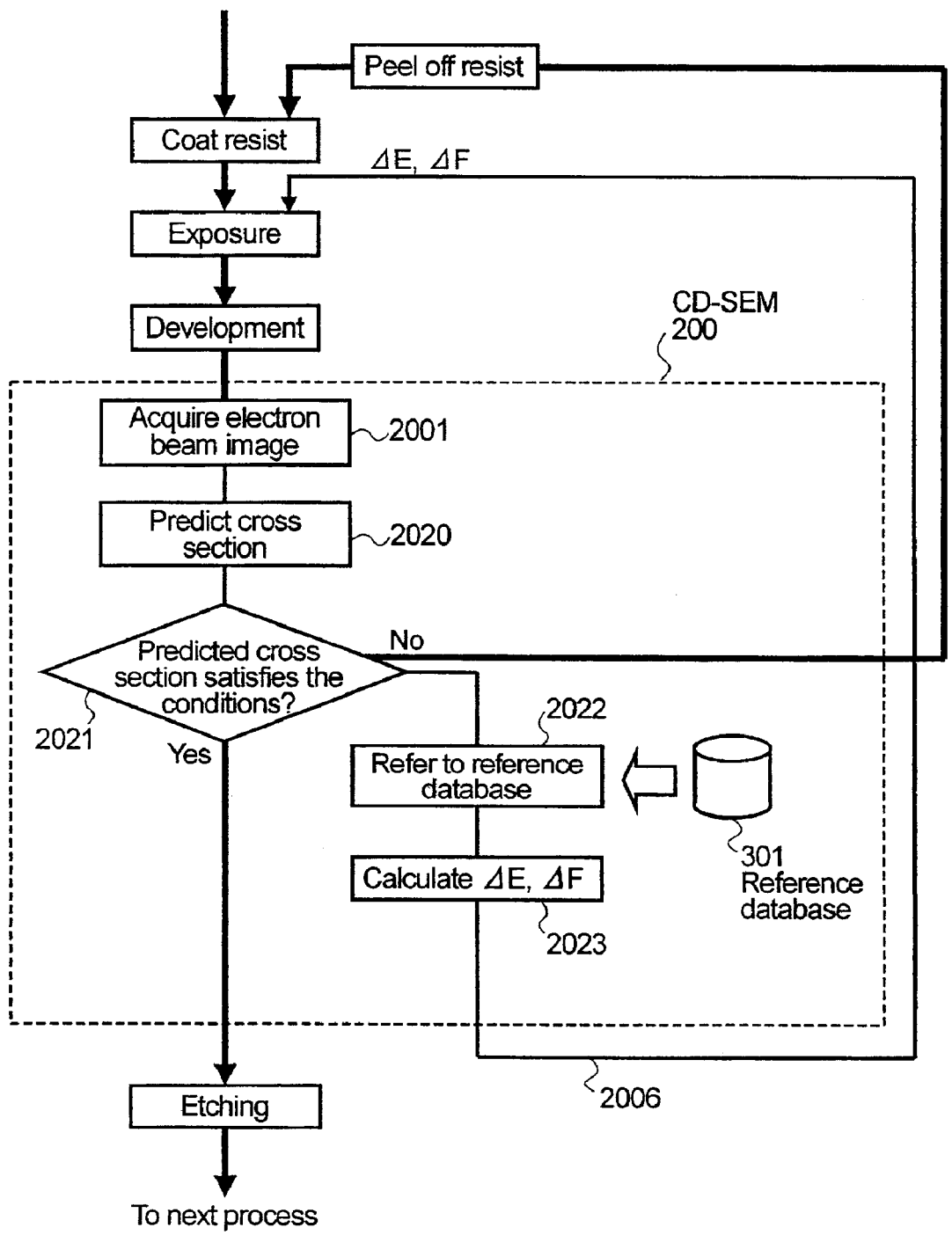
FIG. 24 is a flowchart illustrating an operational procedure of the lithography-process monitoring system according to a fourth embodiment of the present invention.

FIG. 24 is a conceptual flow diagram of the lithography process that is used in the lithography-process monitoring system constructed on the CD-SEM 200, according to a fourth embodiment of the present invention. In this embodiment, the CD-SEM generates an electron beam image (step 2001), subsequently predicts the cross section of the resist pattern from the electron beam image (details will be described later) (step 2020), evaluates the 3-D shape based on the predicted cross section, and, at the same time, calculates the feedback quantities ΔE and ΔF to the exposure condition parameters (the exposure and the focus) by using the reference database 301 (details will be described later) that has previously been constructed using the FEM wafer (steps 2022–2023).

To begin with, referring to FIGS. 25(a) to 25(c), a method of, predicting the cross section of the resist pattern will be described. FIG. 25(a) is a line profile obtained by superposing N lines, as with the first embodiment (refer to FIG. 11(a)). Representing the signal strength at a position k by SE(k) and a local slope angle at the position k by θ(k), since the secondary electron signal strength is proportional to 1/cos θ(k), the relationship between SE(k) and θ(k) can be represented by an expression (25-1), as seen in FIG. 25(a). Here a is a proportional constant and b is an offset.

On the other hand, since the interval L in FIG. 25(a) corresponds to the edge of the resist pattern, representing the resist height by H and the pixel size by d, integration of dXtan θ(k) for the interval L yields H, as shown in an expression (25-2) in FIG. 25(b). Here, if a suitable value is given to H and the slope angle at the resist top is assumed to be "0," values a and b can be obtained by the method of least squares. Substitution of the obtained values of a and b into the expression (25-1) yields the slope angle θ(k) at a position k, which indicates how the slope angle varies at the edge, and a pseudo cross section, as seen in FIG. 25(c), can be obtained.

Figure 25:
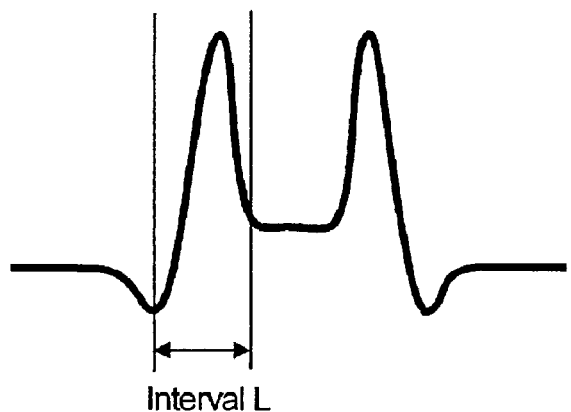
FIG. 25(a) is a diagram showing the line profile.
FIG. 25(b) is a diagram showing a part of the sectional contour of the resist pattern.
FIG. 25(c) is a diagram showing a sectional contour of the resist pattern.
FIG. 25(d) is a table showing a relationship among XL, XR, and an allowable error.
Figure 25:
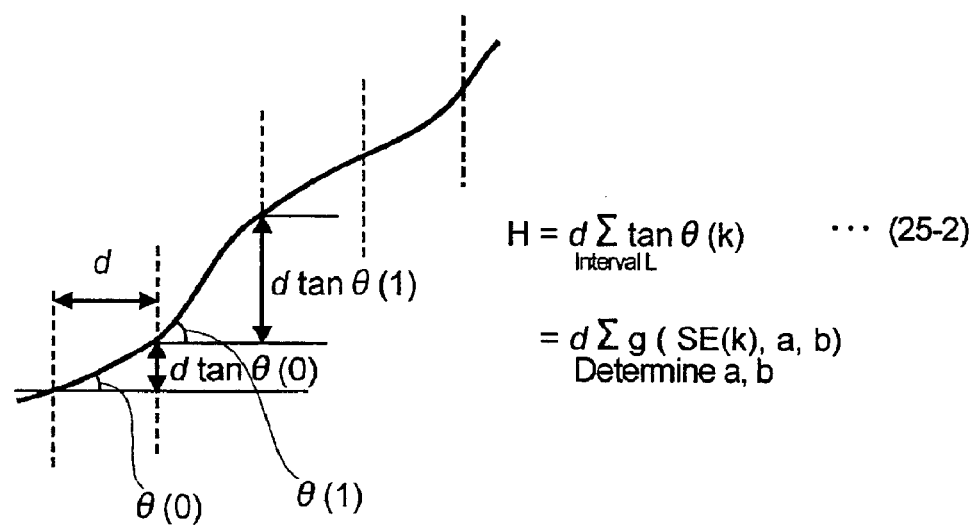
Figure 25:
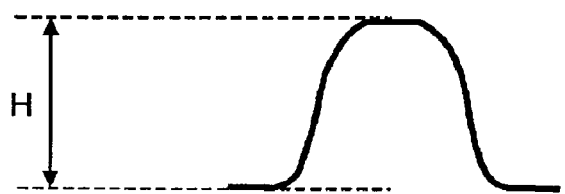

Since the resist height H is unknown and the relationship between SE(k) and θ(k) is not a simple relationship as evident from the expression (25-1) shown in FIG. 25, the pseudo cross section obtained in the above-mentioned manner does not agree with the actual cross section. However, when the variations of the exposure conditions cause the resist cross section to change, the pseudo cross section exhibits a variation that reflects such variations; therefore, the pseudo cross section can be treated as with the group of feature quantities in the first embodiment.

Figure 26:
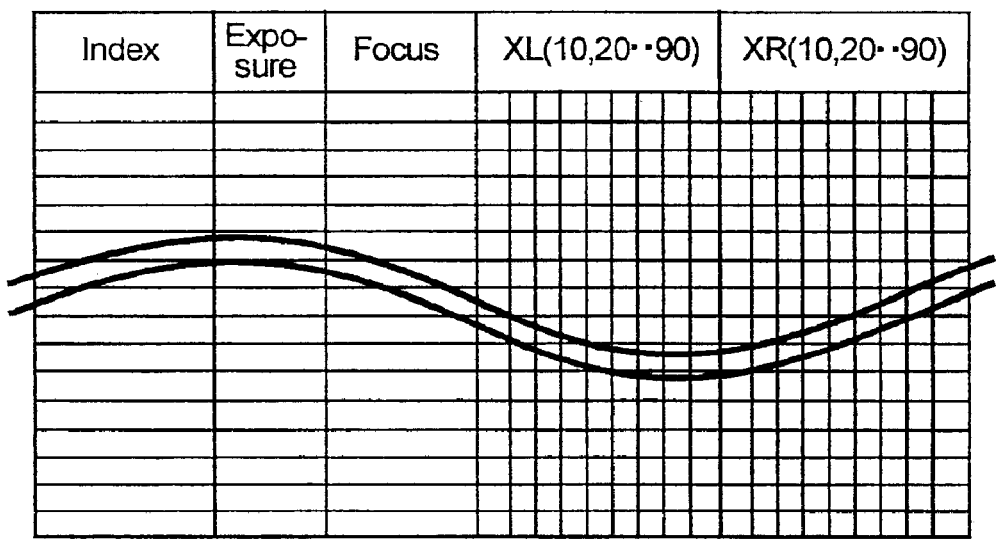
FIG. 26(a) is a diagram of the data stored in the reference database in the fourth embodiment according to the present invention.
Figure 26:
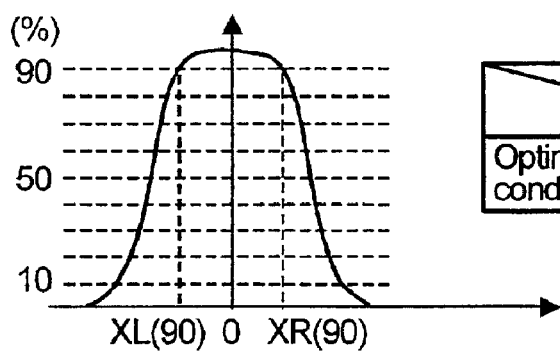

Next, the reference database 301 will be described. In this embodiment, prior to putting the product wafer into the manufacturing process, the reference database is created using the FEM wafer shown in FIG. 4. The creation procedure is the same as that used in the first embodiment, but instead of calculating the group of feature quantities, the pseudo cross section is calculated and stored so as to be paired with the exposure and the focus. The calculated results of the pseudo cross section may be stored as they are in the farm of a series, or the pseudo cross section may be represented by a suitable function and the function may be stored instead. FIG. 26(a) exhibits a case where the results are stored as edge positions on the right side and the left side at the height levels of 10%, 20%, . . . 90%. For example, XL(90) denotes a position on the left edge at a height level of 90%, as shown in FIG. 26(b). In the reference database, as with the first embodiment, pseudo cross sections under the optimal exposure conditions (FIG. 26(c)) and under the optimal exposure conditions (FIG. 26(d)) are stored in addition to the information of FIG. 26(a).

Figure 27:
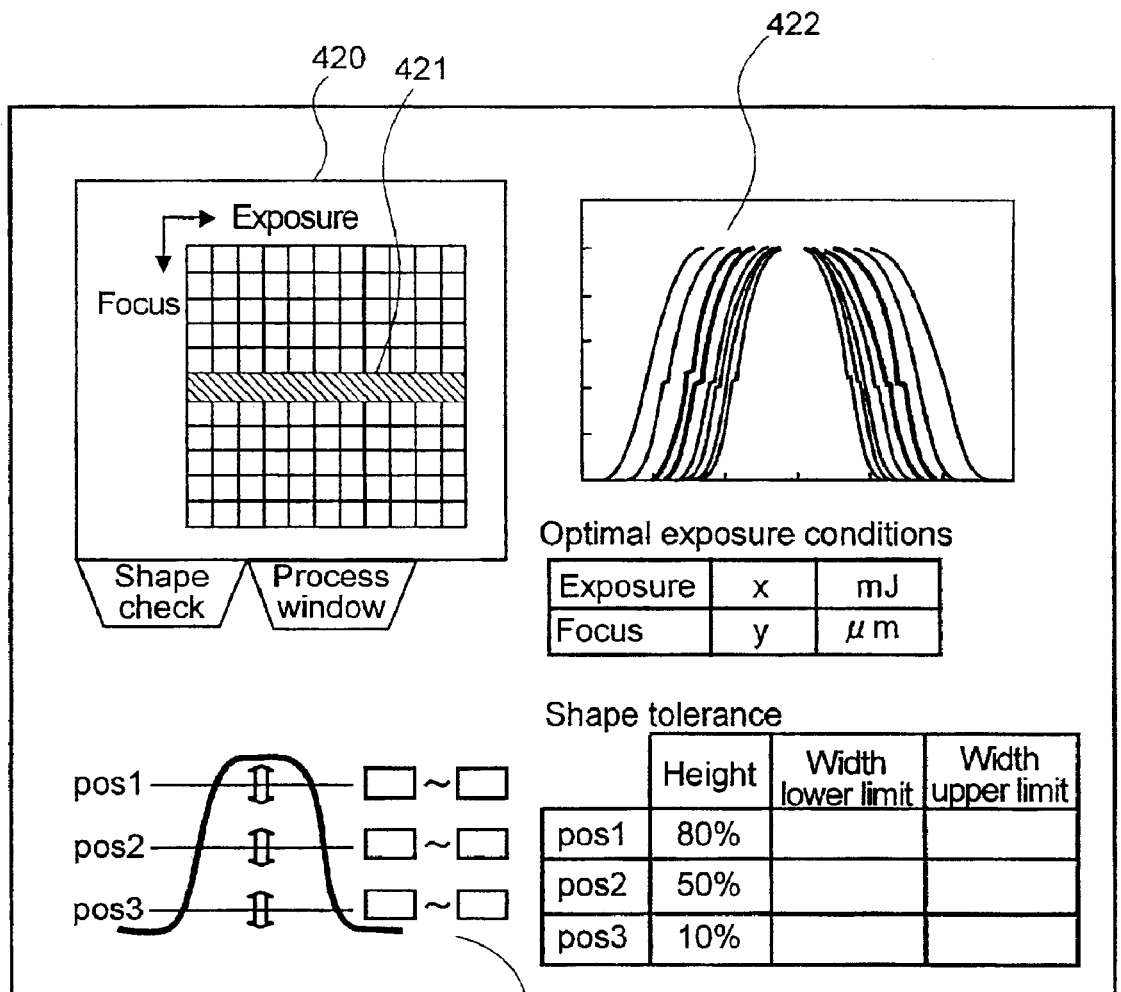
FIG. 27(a) is a diagram of the display screen showing an example of the process-window setting GUI according to the fourth embodiment of the present invention.
FIG. 27(b) is a diagram of a matrix 424 to be displayed to replace a matrix 420 on the display screen.
Figure 28:
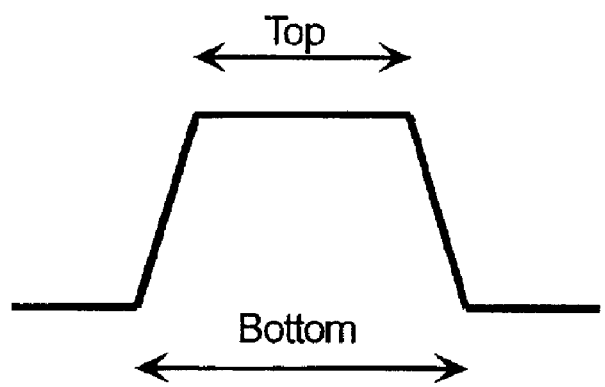
FIGS. 28(a) and 28(b) are both schematic diagrams of a section of the resist pattern that provide additional information for the method of setting a process window according to the fourth embodiment of the present invention.
Figure 28:
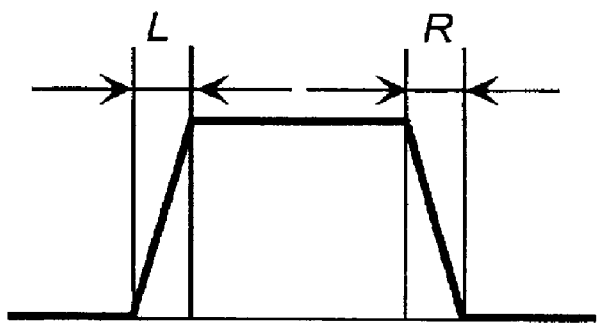

FIG. 27 shows an example of the GUI screen that is used to determine the optimal exposure conditions. When the user designates a suitable area in the matrix 420 that is composed of a horizontal axis representing the exposure and a vertical axis representing the focus, for example, an area 421, the pseudo cross section under the exposure conditions corresponding to the area previously selected, is displayed as in the insert 422. As shown in the insert 423, when conditions for the pseudo cross section are set in the form of the tolerances of the resist widths for the upper portion, the middle portion, and the lower portion, the information of FIG. 26(a), that is stored in the reference database, is referred to, and a matrix that specifies the ranges of the exposure and the focus, both of which satisfy the conditions, is displayed as of the matrix 424, taking the place of the matrix 420. For conditions affecting the pseudo cross section, a ratio of the top-side width and the bottom-side width of the resist pattern shown in FIG. 28(a), or a ratio of the left-side and the right-side edge width, as shown in FIG. 28(b), may be included in the process window. The center values (E0, F0) are the optimal exposure conditions, which are displayed on the screen and, at the same time, stored in the reference database, as the exposure conditions for the product wafer coming thereafter.

Next, the steps 2021–2023 in FIG. 24 will be described.

At the step 2021, the pseudo cross section calculated from the electron beam image of the product wafer subject to inspection is compared with the information of FIG. 26(d), and if the pseudo cross section is within the tolerances, the lithography process is assumed to be normal. If the shape is outside of the tolerances, the flow proceeds to the steps 2022, 2023, where the pseudo cross section is compared with the information of FIG. 26(a) to find the best agreed index i for the pseudo cross section. Now, the differences $\Delta R$, $\Delta F$ between a set of the exposure E(i) and the focus F(i) at the index i and a set of the optimal exposure E0 and the optimal focus F0 ($\Delta E=E(i)-E0$, $\Delta F=F(i)-F0$) are considered to be the deviations from the optimal ranges of the exposure conditions for a resist pattern subject to inspection. $\Delta E$ and $\Delta F$ are fed back to the exposure equipment to correct the exposure conditions thereafter (step 2006).

Figure 29:
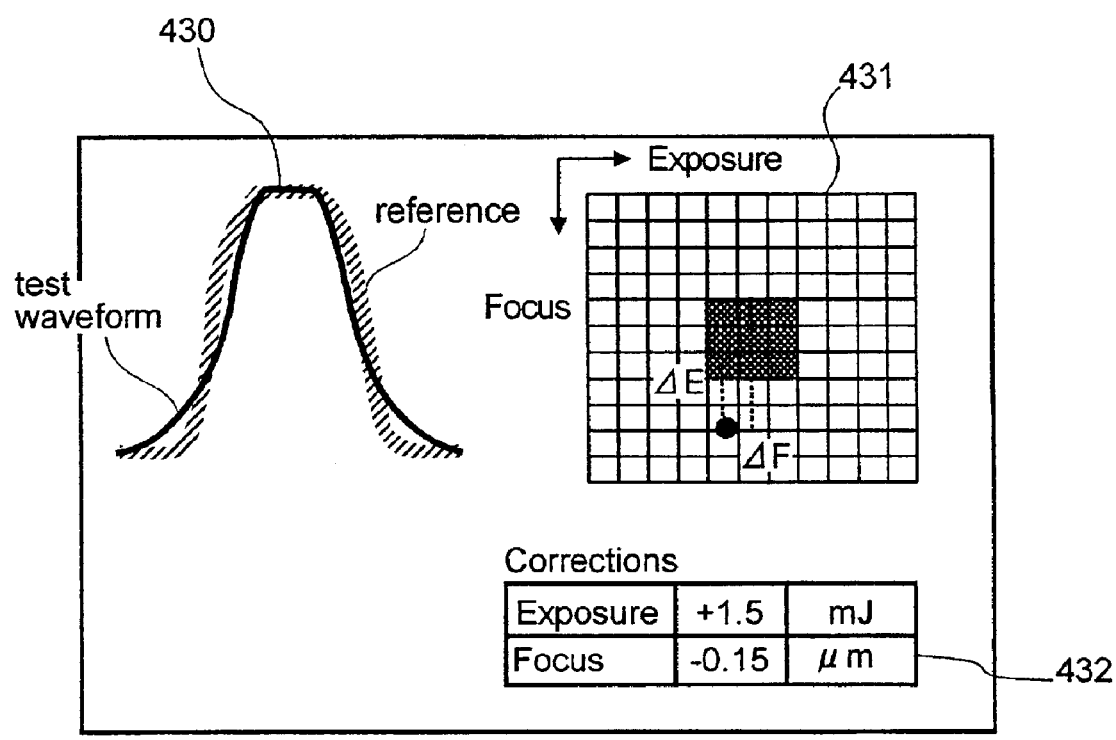
FIG. 29 is a diagram of the display screen showing an example of the process monitoring GUI according to the fourth embodiment of the present invention.

FIG. 29 is a schematic diagram of the GUI screen on which the user confirms the fluctuation state of the exposure conditions. In an insert 430, the pseudo cross section calculated from the line profile of the electron beam image of a sample subject to inspection and the pseudo cross section calculated from the line profile of the electron beam image under the optimal exposure conditions are displayed while being superposed, one on the other. How much the former deviates from the latter is displayed. In an insert 431, the deviations $\Delta E$ and $\Delta F$ from the optimal exposure conditions are displayed so as to be superposed on the display window.

This embodiment has an advantage in that it is easy for the user to handle the parameters and to adjust the process compared to the case where the feature quantities that are relative values and absolute numbers are used, because the user can set the conditions by using values linking to real values, especially when determining the optimal exposure conditions after obtaining the process window, in addition to the same affect as described with reference the embodiment No. (1-0).

Note that the relation equation between the signal strength SE(k) and the slope angle $\theta(k)$ that is used in obtaining the pseudo cross section is not necessarily limited to the expression (25-1) and that a function fitted to the relationship between the signal strength and the slope angle that has previously been investigated may be used. Further, it goes without saying that this embodiment can be combined with the second and the third embodiments.

Fifth Embodiment

Figure 30:
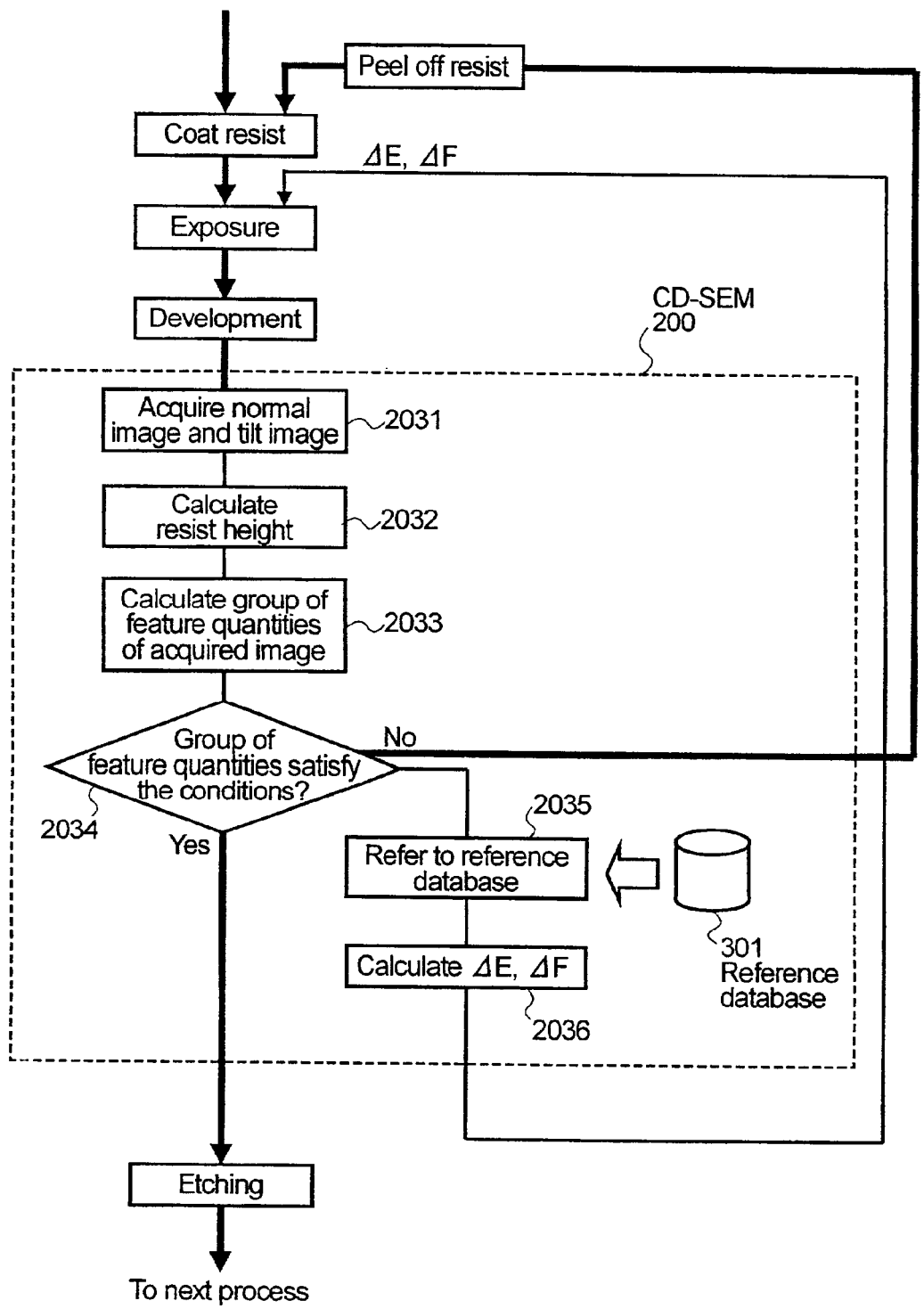
FIG. 30 is a flowchart showing a processing procedure of the lithography-process monitoring system according to a fifth embodiment of the present invention.
Figure 31:
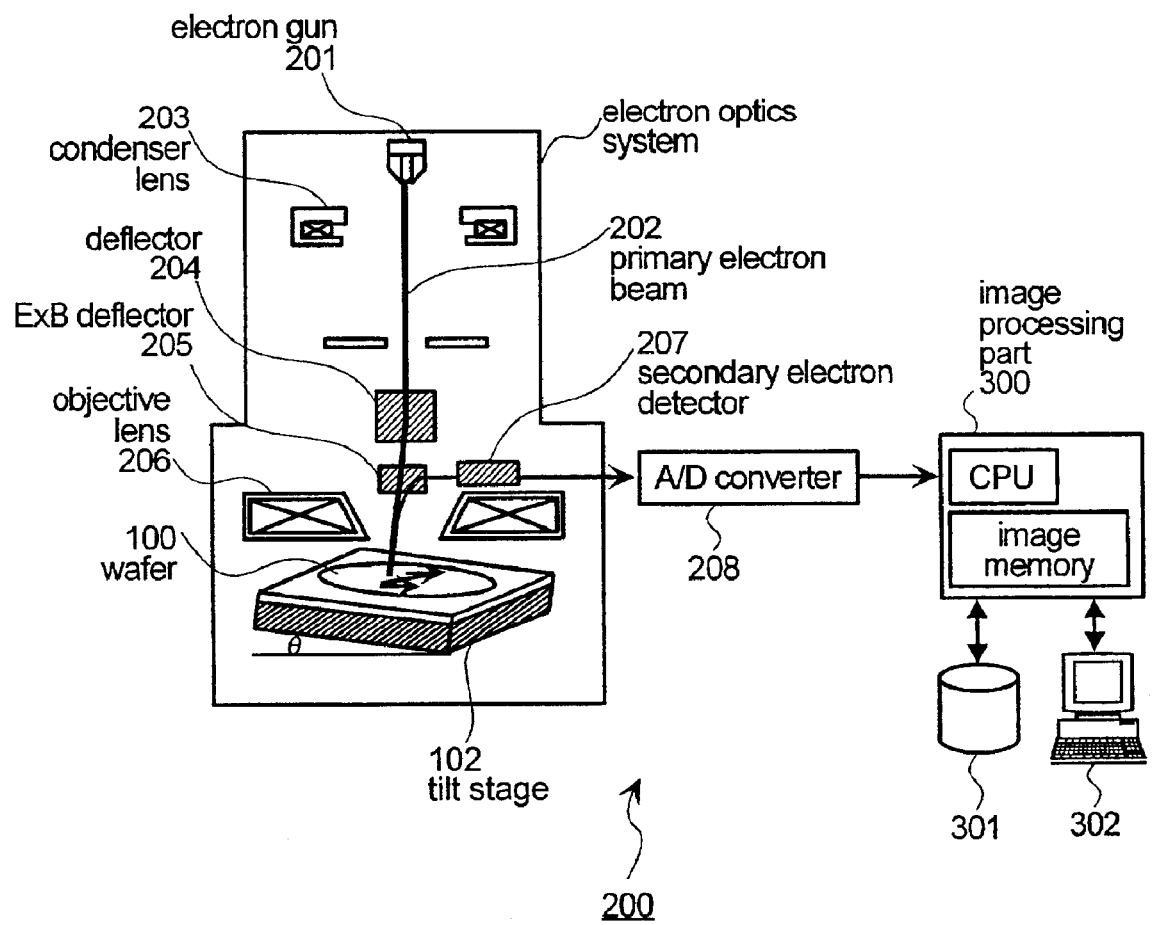
FIG. 31 is a block diagram showing a general construction of the CD-SEM according to the fifth embodiment of the present invention.

FIG. 30 is conceptual diagram of the lithography process that is used in the lithography-process monitoring system constructed on the CD-SEM 200, according to a fifth embodiment of the present invention. The CD-SEM used in this embodiment has a tilting stage 102 that can move in the xy plane, and it also is equipped with a tilting function, as shown in FIG. 31, whereby the tilt image can be obtained, besides the top-down view etc.

In this embodiment, the CD-SEM obtains a normal top-down view image and the tilt image (step 2031); subsequently calculates the height of the resist pattern from the normal image and the tilt image by a method that will be described later (step 2032); further calculates the group of feature quantities that represent features of the 3-D shape of the resist pattern (step 2033); and evaluates the 3-D shape based on the predicted cross section and at the same time calculates, the feedback quantities $\Delta E$ and $\Delta F$ to the exposure condition parameters (the exposure and the focus) by using the reference database 301 that has previously been constructed using the FEM wafer (steps 2034–2036).

Figure 32:
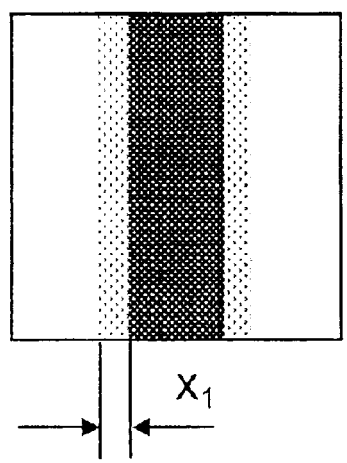
FIG. 32(a) is a diagram of an SEM image of the resist pattern detected with no tilt angle.
FIG. 32(b) is a diagram of an SEM image of the resist pattern detected with a tilt angle being given.
FIG. 32(c) is a diagram of the resist pattern to illustrate a principle of calculating the resist height according to the fifth embodiment of the present invention.
Figure 32:
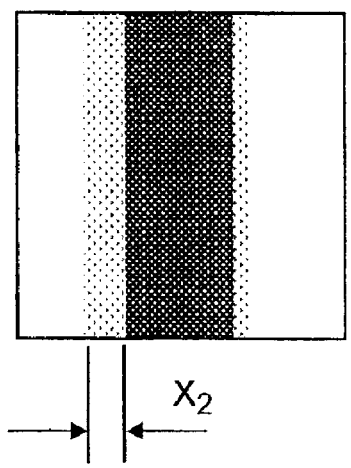
Figure 32:
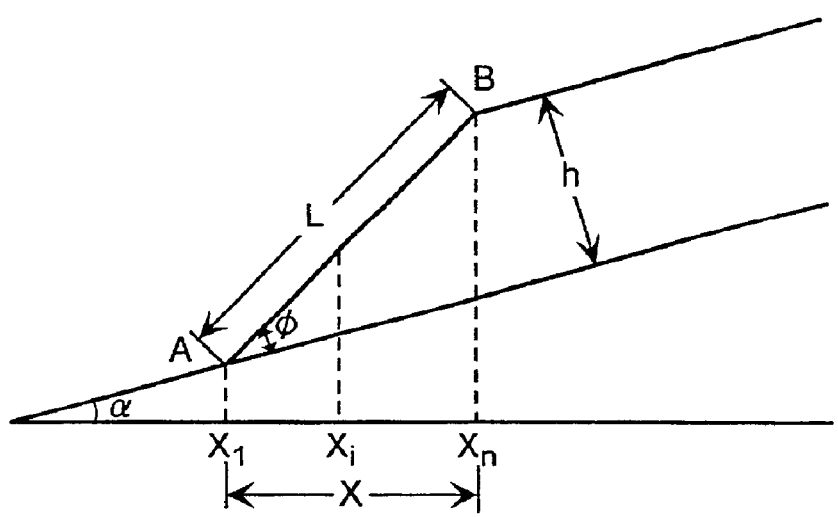

First, referring to FIGS. 32(a) to (c), a method of calculating the height of the resist pattern will be described. FIG. 32(a) is the top-down view and FIG. 32(b) is the tilted view of an image. By representing the edge width in the top-down view by X1 and the edge width in the tilt view of the image by X2, if X1 and X2 are substituted into the equation shown in FIG. 32(c), the height h of the resist pattern can be found because the tilt angles $\alpha 1$ and $\alpha 2$ are already known ($\alpha 1=0$, $\alpha 2$=a stage tilt angle of FIG. 31). FIG. 32(c) is an excerpt from "Electron Beam Testing Handbook," Japan Society for the Promotion of Science, the 132nd Committee of "Applications of Charged Particles to Industries," Research Material No. 98, p. 269.

Figure 33:
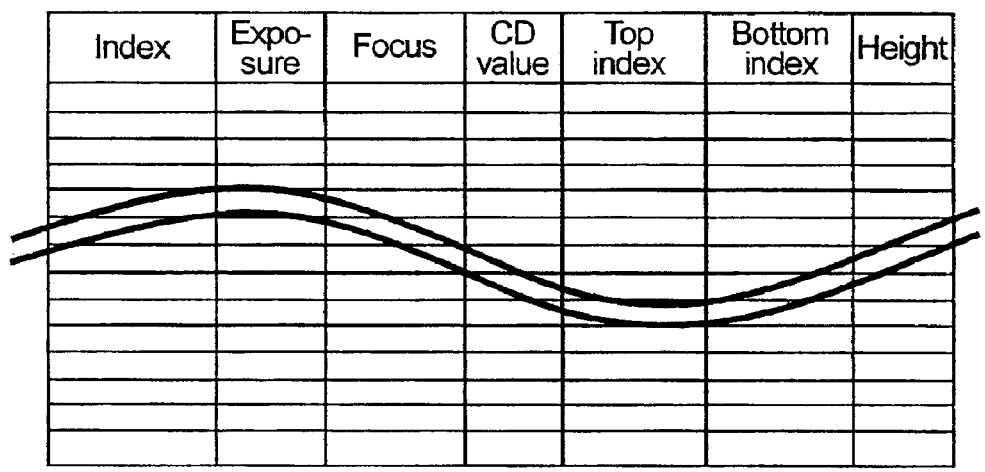
FIGS. 33(a) and 33(b) are both diagrams of the data stored in the reference database in the fifth embodiment of the present invention.

FIG. 33(a) shows stored information of the reference database 301 as used in this embodiment. What is different from the first embodiment is that the height of the resist pattern is included in the group of feature quantities. The group of feature quantities may be obtained from the top-down view of the image, it may be obtained from the tilt view of the image, or it may be obtained from both views.

Since the steps 2034–2036 in FIG. 30 are basically the same as the steps 2003–2005 used in the first embodiment, an explanation thereof is omitted.

According to this embodiment, there is an advantage in that the feedback quantities $\Delta E$ and $\Delta F$ of the exposure conditions can be obtained more accurately because of addition of information of the height of the resist pattern, in addition to the same effect as described in the embodiment No. (1-0).

Note that, instead of causing the stage to be tilted, the column of the electro-optical system may be tilted, or the angle of incidence of the irradiation electron beam relative to the sample may be altered by changing the deflection angle of the beam.

Also, note that this embodiment may be combined with the fourth embodiment. In the fourth embodiment, since the resist height is unknown, a suitable value was assumed. If the height obtained in such a way as described above is used, the pseudo cross section that agrees much more with the actual cross section can be obtained. Stored information of the reference database 301 in the case where this embodiment is combined with the fourth embodiment is shown in FIG. 33(b).

Further, a method may be adopted whereby, not only are the top-down view of the image and the tilt view of the image used to obtain the resist height, but the cross section is also reconstructed based on a principle of stereoscopic vision, and the result of the reconstruction is used as the feature quantities, as with the pseudo cross section in the fourth embodiment.

Figure 43:
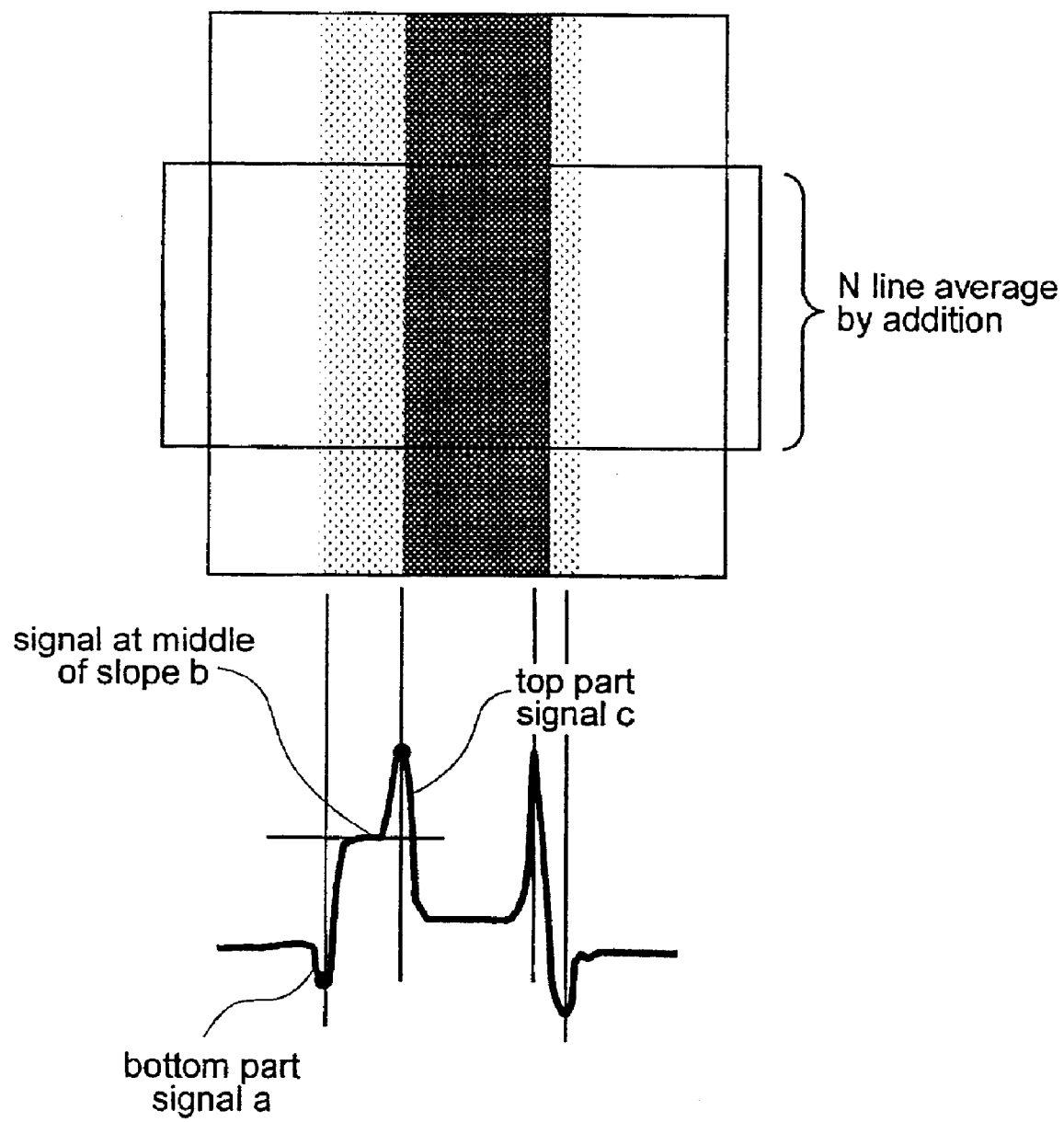
FIG. 43 is a diagram illustrating the tilt image according to the fifth embodiment of the present invention.

Moreover, in the tilt image, as shown in FIG. 32(b), the number of pixels increases in the left resist sidewall part (more accurately an area corresponding to the left resist side-wall part) and in the flat part(more accurately, an area corresponding to the flat part), whereas the number of pixels in the right resist sidewall part (more accurately, an area corresponding to the left resist side-wall part) decreases (in the case where the slope of the tilt stage is upward to the right relative to the sample). What should be noted in this embodiment is the line profile corresponding to the resist side-wall whose number of pixels was increased. As shown in FIG. 43, if the inclined plane can be detected with a sufficiently wide span, the middle part b in 43 of the inclined plane is hardly affected by the edge effect, and the amount of signal in proportion to the slope angle can be detected stably.

Then, utilizing this relationship between the amount of signal and the slope angle, the amount of signal of the resist side-wall part can be used as a feature quantity that indicates the slope angle of the resist side-wail. For example, the edges of the top and the bottom of a resist pattern an extracted, the intensity of the middle portion between the two edges are averaged, and the average value is assumed to be the feature quantity that indicates the slope angle of the resist side-wall. As described in the fourth embodiment, since the electron beam image of the SEM becomes brighter as the slope angle becomes larger, the increase/decrease in this feature quantity can give some indication of the change in the slope angle. If the relationship between the slope angle and the amount of signal has previously been obtained using a sample with a known slope angle, a higher-precision evaluation becomes possible. If information of the resist film thickness is used in combination with this relation, it is optionally possible to estimate a rough sectional, shape of the pattern.

Further, as with the embodiment of FIG. 11(a) to 11(d), if the waveforms of the top part c in FIG. 43 and the bottom part a in FIG. 43 are utilized, the states of the rounding and the footing can be evaluated together. These pieces of information can all be used as the feature quantities in the above-mentioned first embodiment.

According to this embodiment, in addition to the same effect as described with reference to the first embodiment, higher-precision feature quantities can be obtained, because the number of pixels corresponding to the side-wall part increases with the use of the tilt view of the image, and, consequently, a more accurate prediction of the exposure conditions can be realized. Additionally, the dimension measurement of a reverse-taper that cannot be measured with the top-down view also becomes possible for a certain range of tapers. Since the slope angle can be obtained directly using the amount of signal of the inclined plane, the dimension measurement is hardly influenced by a measurement error in the pattern width. Incidentally, the angle of incidence of the electron beam onto the sample may be altered by tilting the column of the electron optics system or by changing the deflection angle of the irradiation electrof1 beam, instead of tilting the stage. Further, it goes without saying that this embodiment can be combined with the second and third embodiments.

Sixth Embodiment

Figure 34:
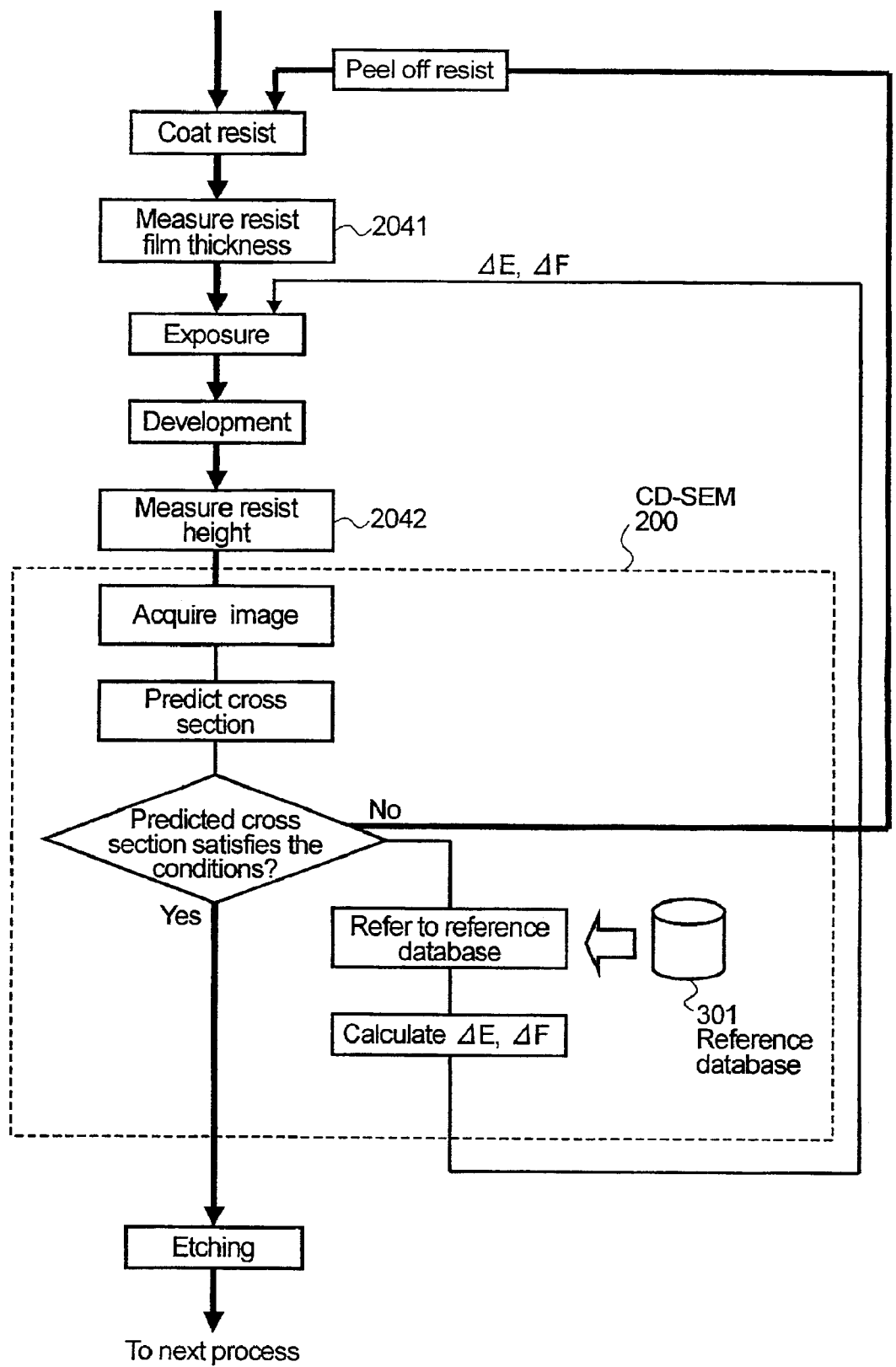
FIG. 34 is a flowchart showing a processing procedure of the lithography-process monitoring system according to a sixth embodiment of the present invention.

FIG. 34 is a conceptual diagram of the lithography process that is used in a lithography-process monitoring system constructed on the CD-SEM 200, according to a sixth embodiment of the present invention. In the previously described fifth embodiment, the resist height is calculated on the CD-SEM. However, in this embodiment, the result of measurement performed by some measuring means outside the CD-SEM is used as the resist height in obtaining the pseudo cross section in the fourth embodiment. More specifically, the measurement result by film thickness measurement 2041 performed after the resist coating or the measurement result by resist height measurement 2042 performed after the resist development is used. In the fourth embodiment, a suitable value is assumed as the resist height because it is unknown. According to this embodiment, the pseudo cross section that agrees with the actual cross section to a higher degree can be obtained. Further, since it is not necessary to obtain the tilt view of the image, this embodiment has an advantage that the throughput is higher compared to the fifth embodiment. Moreover, it goes without saying that this embodiment can be combined with the second and the third embodiments.

Seventh Embodiment

Figure 35:
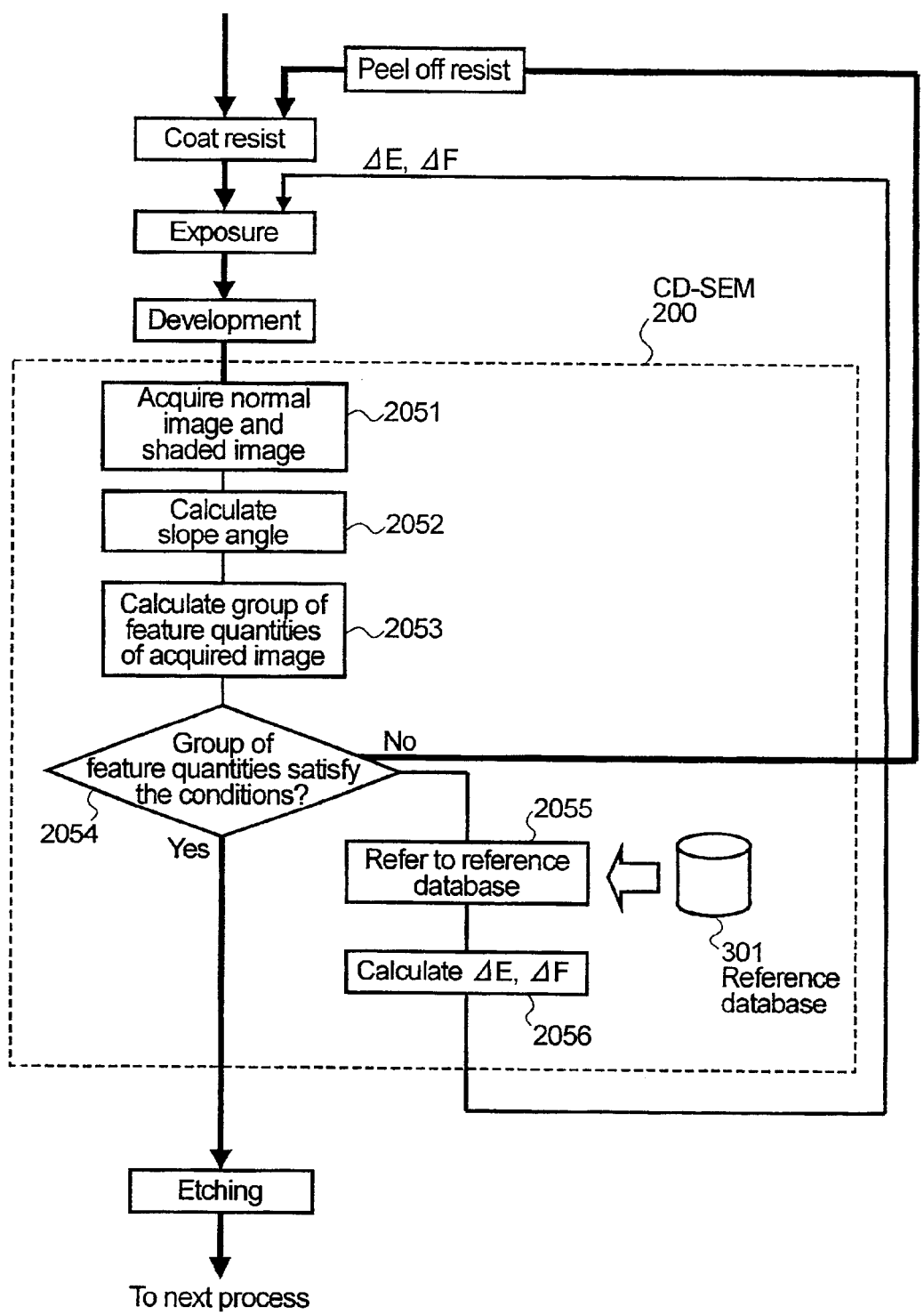
FIG. 35 is a flowchart showing a processing procedure of the lithography-process monitoring system according to a seventh embodiment of the present invention.
Figure 36:
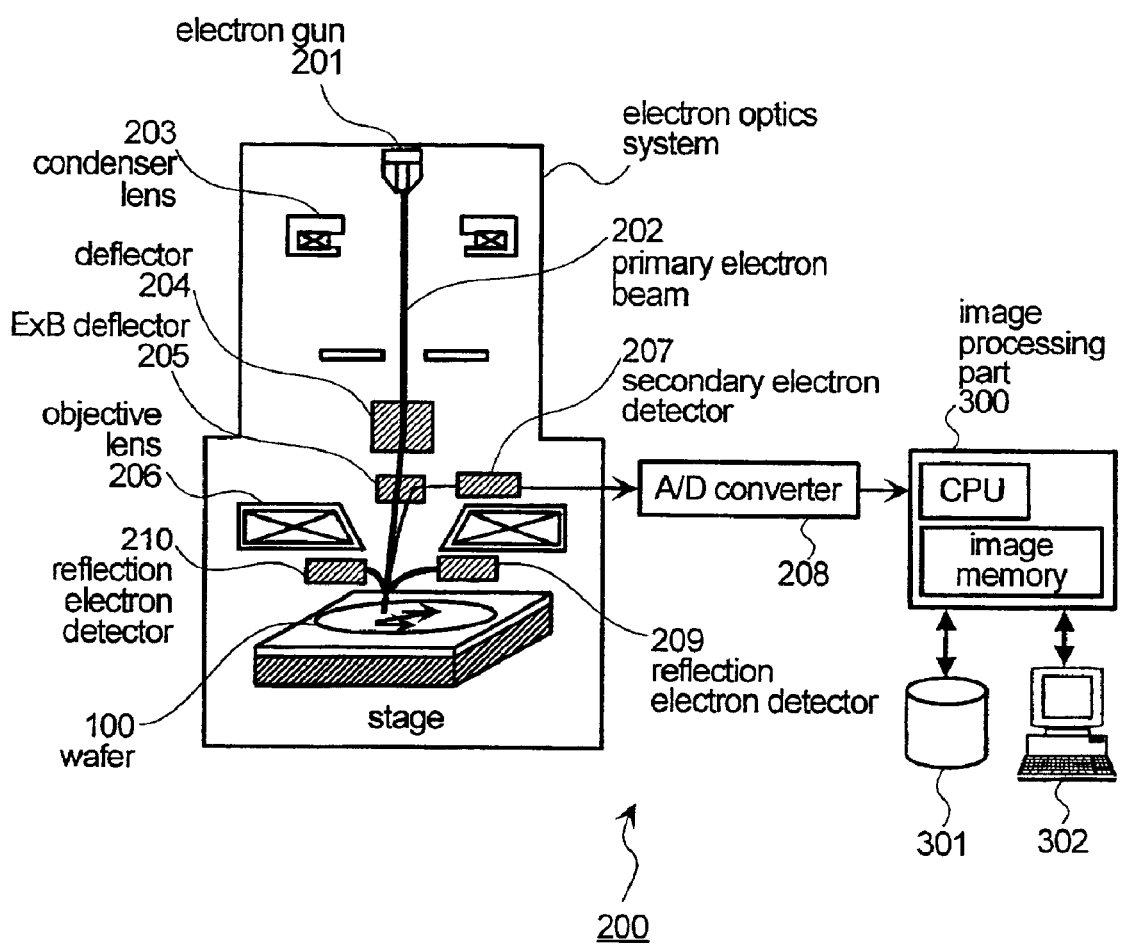
FIG. 36 is a block diagram showing a general construction of the CD-SEM according to the seventh embodiment of the present invention.
Figure 37:
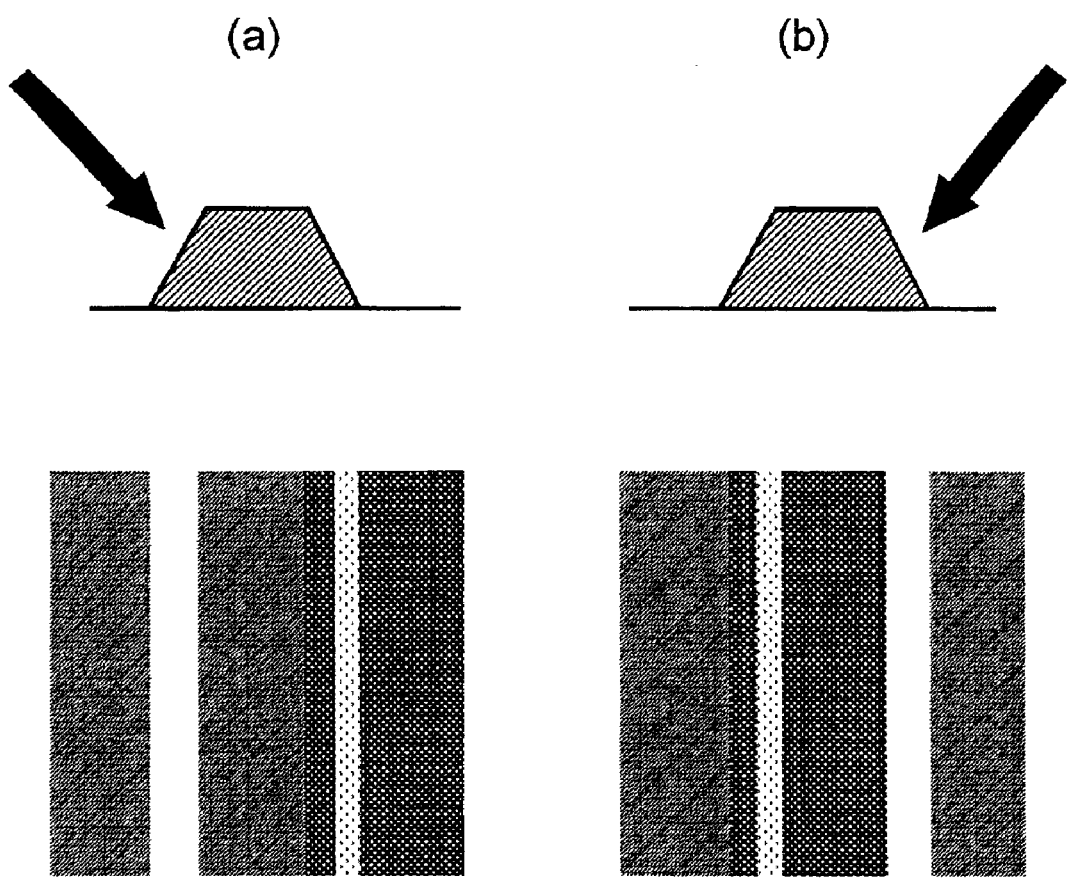
FIGS. 37(a) and 37(b) are diagrams showing the cross sections of the resist pattern accompanied by shaded images of the resist pattern.

FIG. 35 is a conceptual diagram of the lithography process that is used in the lithography-process monitoring system constructed on the CD-SEM 200, according to a seventh embodiment of the present invention. The CD-SEM used in this embodiment has reflection electron detectors 209, 210, as shown in FIG. 36, and it can obtain a shaded image as shown in FIG. 37(a), 37(b) in addition to the normal top-down view of the image.

In this embodiment, the CD-SEM first obtains the normal top-down view of the image and the shaded view of the image (step 2051), subsequently calculates the slope angle of the edge of the resist pattern from the shaded view of the image (step 2052), further calculates the group of feature quantities that represent the characteristics of the 3-D shape of the resist pattern (step 2053), and evaluates the 3-D shape based on the group of feature quantities, and at the same time calculates the feedback quantities ΔE and ΔF to the exposure condition parameters (the exposure and the focus) by using the reference database 301 that has previously been constructed using the FEM wafer (steps 2054–2056). Further, as with the fifth embodiment, the height of the pattern may be detected and the feature quantities of the side wall may be obtained by using the tilt view of the image provided by the reflection electrons.

According to this embodiment, in addition to the same effects as described in the embodiment No. (1-0), there is an advantage in that the feedback quantifies ΔE and ΔF of the exposure conditions can be obtained more accurately because a piece of information, a slope angle of the edge of the resist pattern, is additionally provided.

Also, it goes without saying that this embodiment can be combined with the second and third embodiments.

Eighth Embodiment

The eighth embodiment of the present invention relates to a method of constructing the reference database. In the embodiments described up to the seventh embodiment, the reference database is constructed by using an electron beam image of the actual wafer. However, in this embodiment, the reference data is created by simulation on a computer.

Figure 38:
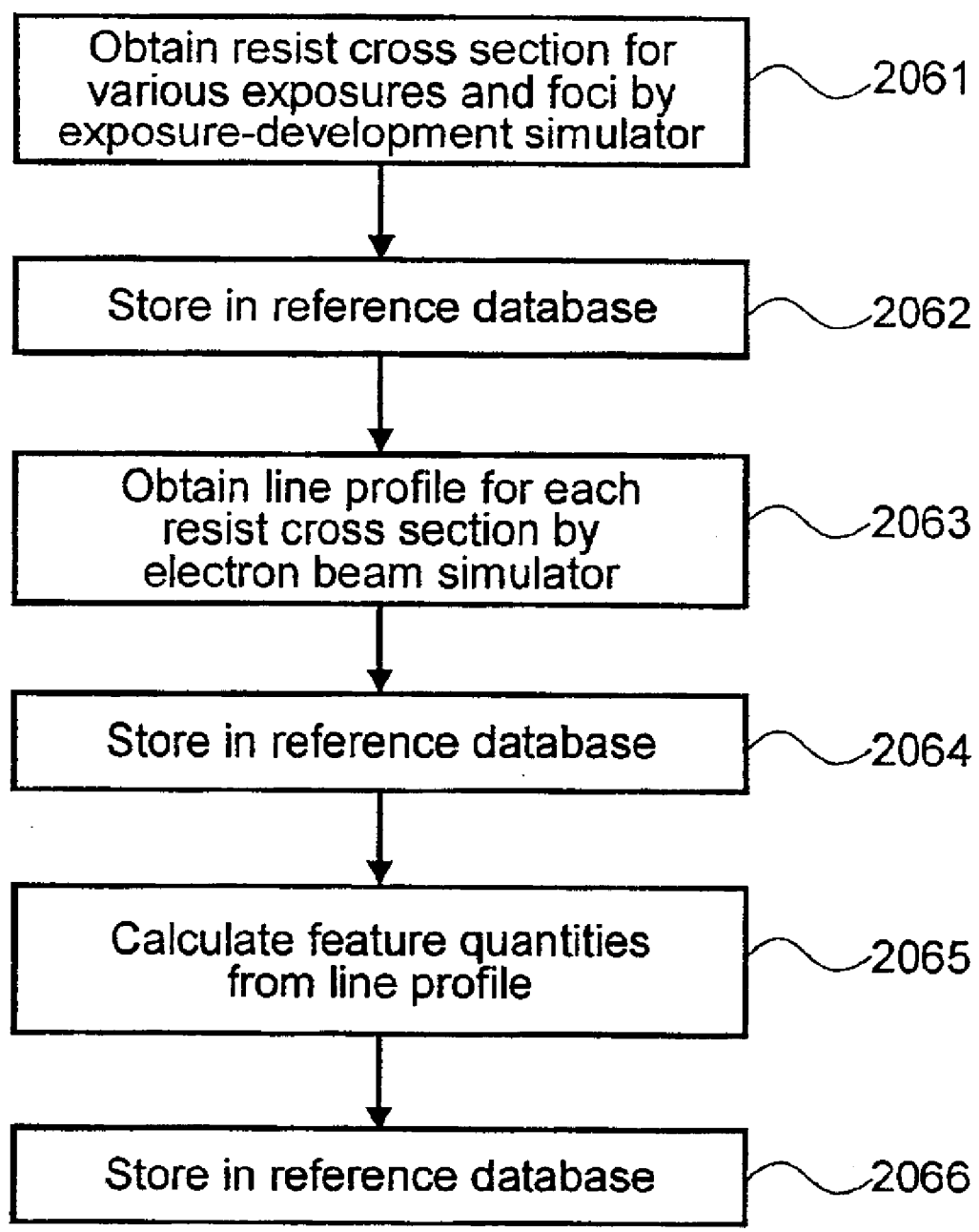
FIG. 38 is a flowchart showing a procedure for creation of the reference database according to an eighth embodiment of the present invention.

FIG. 38 shows the flow of processing used in creating the reference data. First, the resist cross sections under various exposure conditions (the exposure and the focus) are obtained by running a simulation of the resist cross section (step 2061), and these shapes are stored in the reference database (step 2062). Further, the line profile of the electron beam image in the obtained cross section is obtained by running simulation (step 2063) and is stored in the reference database (step 2064). For a simulator, for example, VS-M/BE (product name for package software by Fuji Research Institute Corporation) is used. From this line profile, the group of feature quantities is calculated in the same manner as the first embodiment (step 2065) and stored in the reference database (step 2066). Although not illustrated in the drawings, it goes without saying that it is necessary for the proper simulation conditions, under which results in good agreement with the actual situation are obtained, to be obtained before the simulation is performed.

When the evaluation of the 3-D shape of the resist pattern and the calculation of the feedback quantities are performed by using the line profile calculated from the resist pattern subject to inspection, the reference data stored at the step 2064 is used.

When the feature quantities calculated from the resist pattern subject to inspection are used, the reference data stored at the step 2066 is used.

When the predicted cross section of the resist pattern subject to inspection (namely, the pseudo cross section calculated in the fourth embodiment or in the sixth embodiment, or the reconstructed result using the tilt image in the fifth embodiment) is used, the reference data stored at the step 2062 is used.

According to this embodiment, since it is not necessary to acquire the electron beam images for various exposures and foci, there is an advantage in that the time required to create the reference database can be shortened.

Ninth Embodiment

A method of applying the monitoring system for the photo process that was described in conjunction with the embodiments up to and including the preceding embodiment with respect to the etching process is shown in FIG. 40(a) as a ninth embodiment.

Also, in the etching process, the process control can be executed by the same method as that of the photo process, but the following points can be enumerated, especially as the characteristics of the etching process: (1) a post-etching pattern shape is a final shape of the circuit pattern and a target shape differs according to what the process of concern is; (2) the etching has a lot of parameters of the processing conditions, hence it is complicated; (3) uniform processing is essential over the whole wafer surface; (4) it is difficult to execute the condition finding (contrary to the FEM of the photo process, the processing under various conditions cannot be carried out at the same time); and (5) the etching varies largely according to elapsed time due to fouling in the processing chamber. A method of realizing a system for monitoring an etching process in consideration of these characteristics will be described in the following.

In the process using the exposure equipment, it is possible to peel off the resist and re-process it; however, in the process using the etching equipment (etcher), it is impossible to perform re-processing. Therefore, it is a requisite to feedback the variations to maintain the dimensions within the set tolerances. Also, in the etching equipment, the same effects as those of the aforesaid exposure equipment can be obtained by evaluating the post-etching pattern shape and controlling equipment parameters that govern the state of a processed shape.

To achieve it, all that is required is that the shape of the pattern manufactured through a predetermined process is evaluated in terms of the degree of agreement with the target shape with the use of sets of the measured values of the line profiles shown in the previously stated embodiment No. (1-2), the correlation value of the line profile shown in the embodiment No. (1-3), and the correlation value of the actual electron beam image, and the differences obtained by the evaluation are fed back to the etching equipment.

Figure 41:
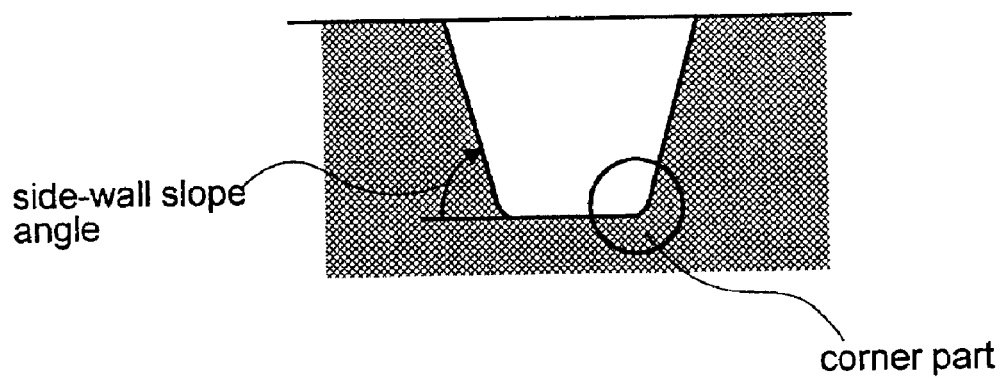
Figure 41:
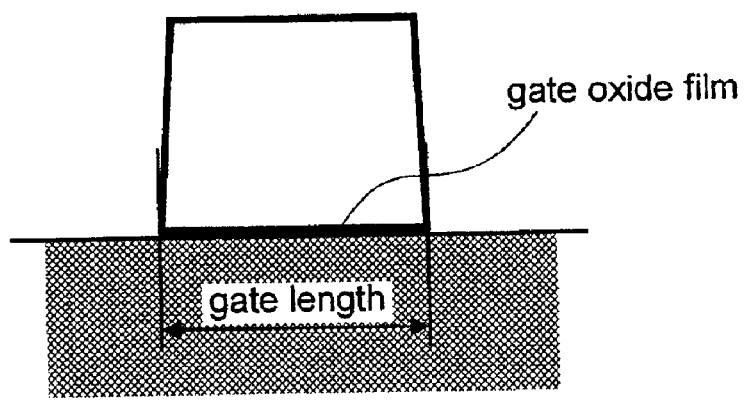

As shown in FIGS. 41(a) and 41(b), the processed shape to be produced by the etching process is determined by the requirements of the semiconductor device and differs depending on the target product and the process concerned. Therefore, it is preferable select and use those feature quantities that are suitable for evaluation of the target shape. For example, in the wiring process, as one of the feature quantities, including the wiring widths corresponding to the top part and the bottom part, a dimension showing a strong correlation with the top width and the bottom width, among the dimension 1 and the dimension 2 in FIG. 19, can be selected and used. In the case of gate wiring, since the width of a gate oxide film part produced on the bottom part of the wiring is most important, it is effective that, in addition to the wiring width, the footing feature quantity of the bottom part is added to the feature quantities.

Further, in the etching process, it is important to secure uniformity over the wafer surface, process monitoring such that the evaluation is performed at plural points in the wafer and the uniformity as considered is executed, as with the example of FIG. 23(b). Details will be described later.

Next, the processing conditions that are to be stored in the reference database are associated with the above-mentioned feature quantities. Compared to the exposure equipment, the etching equipment has a lot of parameters, each exerting an influence on the processing performance. For example, in the case of dry etching, it is necessary to control the kinds of gases used, the mixing ratio, the gas pressure, the high-frequency power, the temperature, and the etching time, etc. Consequently, in the ninth embodiment, parameters that are comparatively easy to be altered are selected from among these control parameters and the processed shape is controlled.

For example, in the case of the process of FIG. 40(a), the etching time is used as the etching parameter to be adjusted.

Using the wiring dimension selected as the feature quantity, if this dimension deviates from the set tolerance, and if this dimension is larger than the target value, the etching time is increased; whereas, if it is smaller than the target value, the etching time is decreased. At this time, if information concerning the processing conditions for etching the specimen in a proper shape and information as to differences between the evaluated values of the pattern under those conditions and the evaluated values of the pattern processed under conditions whose parameter is to be controlled (in case of FIG. 40, etching time) has been altered to conditions that are both stored in a reference database, the control amount of the etching time is determined based on the reference database.

With this method, actually varying parameters of the manufacturing equipment can not always be adjusted directly. For example, in the case of the example of FIG. 40(*a*), the processed shape is made to come close to the predetermined target values by control of the etching time in an actual situation, even when the processed shape is varied due to variation of other conditions, such as the gas pressure of the etching equipment, etc. Therefore, when the adjustment parameter is different from the cause of a variation, the shape can not always be controlled perfectly. However, in the case where there are many control parameters, as with the etching equipment, an optimal combination of the processing conditions is not limited to one, and when the variation quantities are small, correction is possible by using a different parameter.

Further, in the case of a gentle variation, not only a variation in the operation of the etching equipment, but also a variation in the operation of the exposure equipment can be countervailed with an alteration of the etching condition in a similar manner details thereof will be described later). Note that, if a shape variation results from fouling in the processing chamber, wear of the parts, etc., there can be a case where mere alteration of the processing conditions cannot countervail the variation sufficiently. It is recommended that the system be configured so as to display an error message in such a case, indicating that there exists a parameter the variation of which can not be countervailed, by using the display and communication means 503 in FIG. 42.

Figure 40:
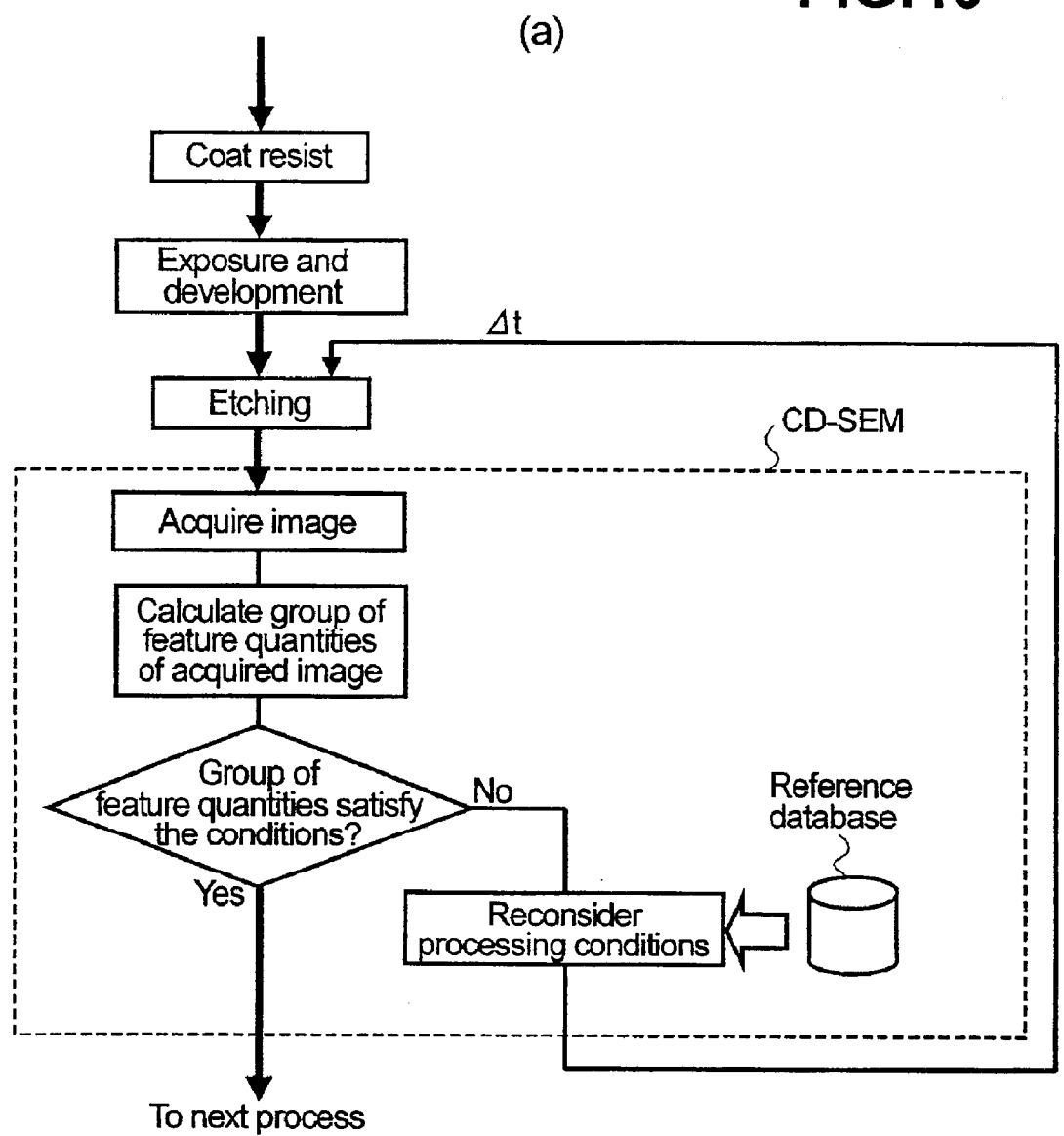
FIG. 40(a) is a flowchart of the lithography process that incorporates the lithography-process monitoring system according to a ninth embodiment of the present invention.
FIG. 40(b) is a graph of the adjustment value of the etching time.
FIG. 40(c) is a diagram showing the wiring width by lot number.
Figure 40:
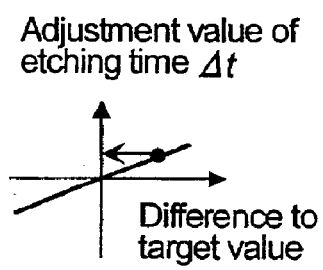
Figure 40:
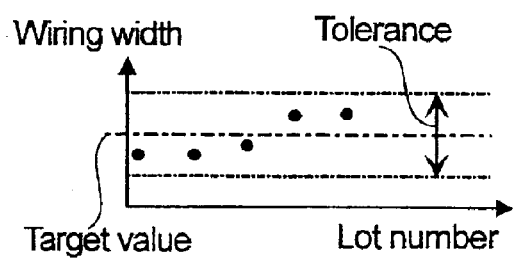

FIG. 40(*a*) illustrates a process which reconsiders the processing conditions of the etching equipment, such as the etching condition (here, the etching time) etc. based on the group of calculated pattern-shape feature quantities by referring to the reference database, corrects the procedures of the etching equipment in line with the results, and controls the etching equipment. However, naturally a scheme may be adopted such that data of the group of calculated pattern-shape feature quantities is displayed, the results obtained by referring to the reference database are displayed, the corrections of the etching condition are displayed of the screen, and the operator executes the alteration of condition according to these pieces of information. In the example of FIG. 40(*a*), all of the operations of the acquisition of the electron beam images through the quality judgment of the pattern shape, plus the improvement of the processing conditions, are performed on the CD-SEM. However, a scheme may be adopted such that, in the productions line of FIG. 42, only the acquisition of the images is performed on the CD-SEM 200, and the remaining processes are performed in the QC data collection and analysis system 501 and the equipment control system 500, or by using another computer connected with these systems. The alteration of the processing conditions may be carried out automatically by the equipment control system 500, or naturally may be performed by a human operator who confirms the results and gives instructions for the alteration of conditions via the display and communication means 503.

In the example of FIG. 40(*a*), the etching time is selected as the control parameter. However, naturally other control parameters may be selected, and a combination of a plurality of (two or more) parameters, such as the focus and the exposure of the exposure equipment, may be selected. In this case, a reference database of a multi-dimensional combination becomes necessary.

Further, in this case, if suitable functions expressing these relationships are introduced, the same control as the embodiment No. (1-1) can be implemented. In the etching process, since the processing conditions cannot be altered on a single wafer, as is the case with the FEM wafer in the photo process, it takes much more time than the photo process to create the database. Therefore, a larger speed-up effect can be achieved by introducing the functions as discussed with reference to the embodiment No. (1-1).

Also, in the case of the etching process, if such a system as shown in FIG. 31, and FIG. 36 is utilized, more detailed information of the 3-D shape can be obtained, as with the fifth embodiment and the seventh embodiment. In addition, if the tilt view of the image of the side-wall part is used, it becomes possible to apply this method to a reverse-taper and also to detect an abnormality, such as notches generated at the bottom part of the pattern, in addition to the same advantage as those of the photo process. Moreover, since the side wall is observable, even in the case of a multi-layer film, it becomes possible to obtain useful feature quantities by a method of subdividing the region according to the material or the like.

Further, as with the sixth embodiment, information concerning the film thickness of the film subject to etching can be utilized. Regarding this film thickness value, manufacturing specification values may be previously registered for each product and for each process, or the data thereof may be acquired by other means for each product wafer with which the manufacture is set about. The film thickness in the film formation process is controlled in a comparatively rigorous manner by using an optical film thickness gauge 506 etc. so that variation thereof is controlled to be within a few to a few tens of nanometers with respect to the film thickness of a few hundred nanometers. Especially in the etching process, since the pattern surface is protected with a resist mask, the film thickness can be regarded as almost constant.

For example, in the system of FIG. 42, the film thickness specification of the film subject to processing of the wafer can be obtained through the equipment control system 500. Further, if the film thickness measurement is being performed, high-precision film thickness information can be obtained by acquiring thickness information that was actually measured by the film thickness gauge 506 from the QC data collection and analysis system 501.

Moreover, for the processing state of the etching, there are simulators such as PLATAN-ETCH etc., and, the same processing as that of the eighth embodiment Sn be performed by using one of them. In the etching process, since it takes an extremely long time to create the reference database, the effect of shortening the required time through the use of the simulator is much larger than that in the photo process.

Furthermore, in FIG. 40(*a*), only when one or more of the feature quantities of the pattern shape exceeds the set tolerances will the alteration of the parameters be executed. However, as with the third embodiment in the photo process, even when the pattern shape is within the set tolerances, the parameters may be altered.

Figure 44:
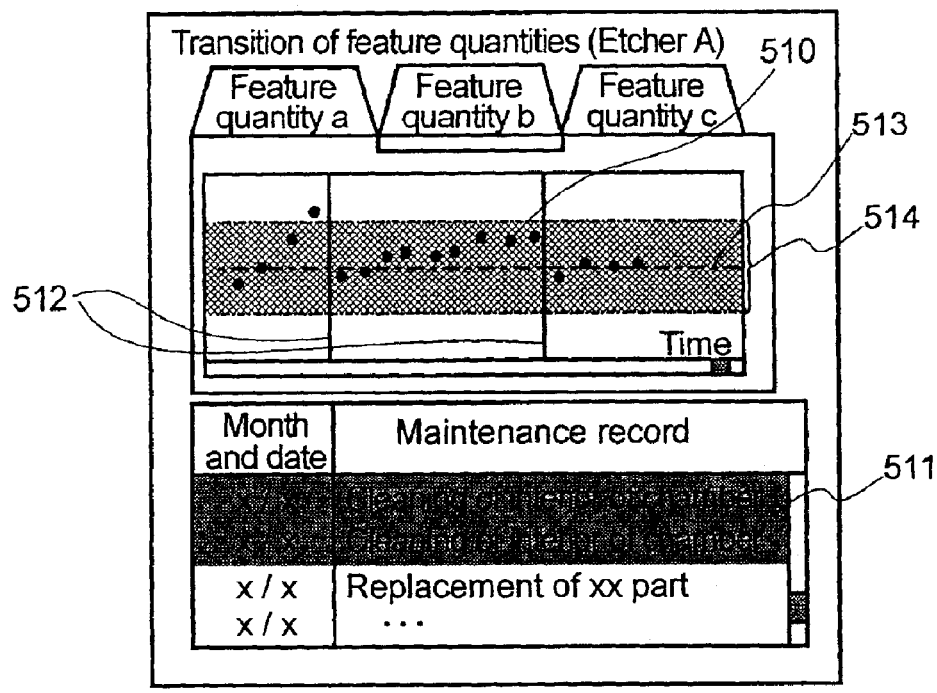
FIGS. 44(a) and 44(b) are diagrams of the display screen showing one example of the process monitoring GUI according to the ninth embodiment of the present invention.
Figure 44:
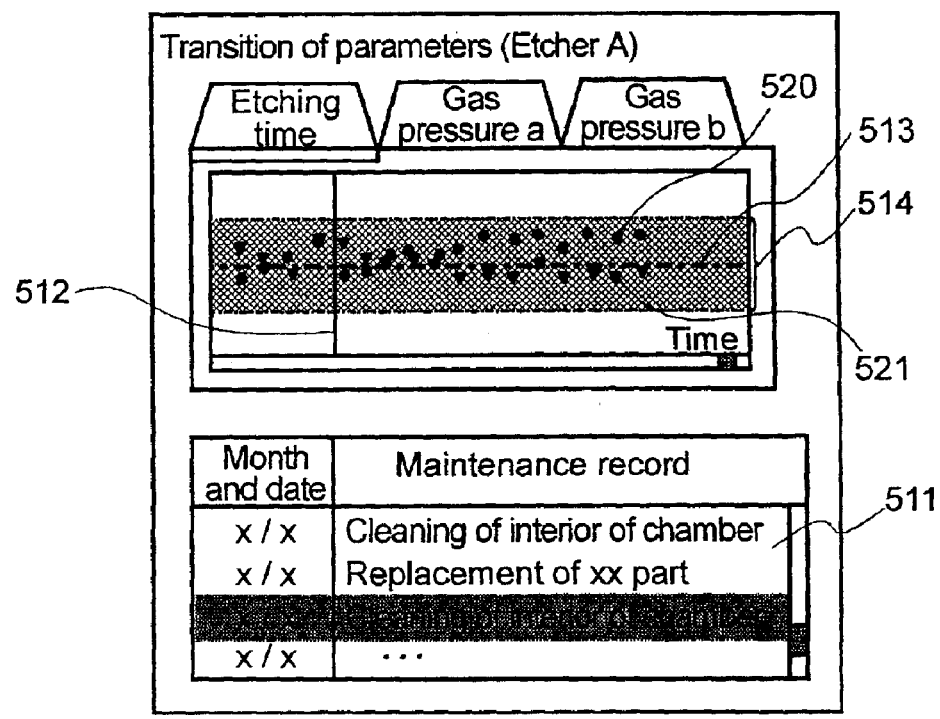

Next, one example of the GUI screen in the process monitoring system described with reference to FIG. 40 is shown in FIG. 44. In the etching equipment, since the pattern shape may vary due to the adhesion of byproducts, which are generated during the processing, to the interior of the chamber, as well as the wear of parts, periodic cleaning and part replacement are conducted. In the method and system according to the present invention, these maintenance records of the equipment and transition of the feature quantities obtained from the SEM images are displayed together. As shown in FIG. 44(a), the time series data 510 is displayed in graphical representation, independently for each feature quantity; and, at the same time, a table of the maintenance record 511 is displayed. The maintenance record in the graphical representation is displayed with different colors being assigned to different descriptions, and the maintenance record indication 512 is displayed also on the graph, so that the corresponding time can be read therefrom. Incidentally, in the time series data graph, a target value 513 and a tolerance 514 are also displayed together with the above data.

These displays are generated for every piece of etching equipment separately. In the case where pieces of data belonging to one and the same etching equipment exist on different critical dimension SEMs and these SEMs and the etching equipment are linked with one another via a network, as shown in FIG. 42, these pieces of data can be transferred and displayed. Further, the reference database need not necessarily be on the SEM, but it may be on another site connected with the etching equipment via the network. The horizontal axis represents any data that corresponds to an order of commencement of work of the equipment of concern, such as the date of commencement of work on the wafer, accumulative working hours of the etching equipment, and accumulative number of wafers with which the work was started in the etching equipment, for example. The screen of FIG. 44(a) is configured so as to display each of the feature quantities separately, but a plurality of feature quantities may be displayed simultaneously in a single graph or they may be converted into a value that represents the whole state, such as a sum of these values, and be displayed.

Further, FIG. 44(a) displays each of the feature quantities separately, but as shown in FIG. 44(b), the etching parameters inferred from the obtained feature quantities may be displayed. In the example of FIG. 44(b), as with the case of the third embodiment, the processing parameters are always controlled, displaying adjustment quantities 521 together with the variation quantities of the etching conditions 520. In this way, it can easily be confirmed what the degree of the alteration of a condition is being executed and how many variations there are, each of which cannot be countervailed even with the alteration of the condition, Further, together with the display of FIG. 44(a) or FIG. 44(b), outputs of various kinds of sensors (pressure gauge etc.) installed in the etching equipment may be displayed. Since the outputs of these sensors indicate the state of the equipment when the wafer is being processed, simultaneous display enables the operator to easily confirm the influences of the variations of the equipment upon the pattern shape.

Regarding the display of the process window and the display of the evaluation results of the current wafer, it is a matter of course that the same display as those shown in FIG. 15 and FIG. 16 may be produced. At this time, it is preferable that the display is produced with the use of the etching parameters, instead of the exposure and the focus.

Thus, according to this embodiment, also in the etching process, as with the exposure process, advanced process control becomes feasible and the processing of the pattern can be conducted excellently. Further, the actual state of the etching equipment and the maintenance records can easily be confirmed, together with the group of feature quantities defining the pattern shape and variations of the etching condition parameters that correspond to the shape variation; therefore, the state of the equipment can easily be grasped, and, in the case of occurrence of an abnormality, a rapid countervailing measure can be performed.

Tenth Embodiment (Adding In-plane Uniformity in Evaluation Parameters+GUI)

Figure 45:
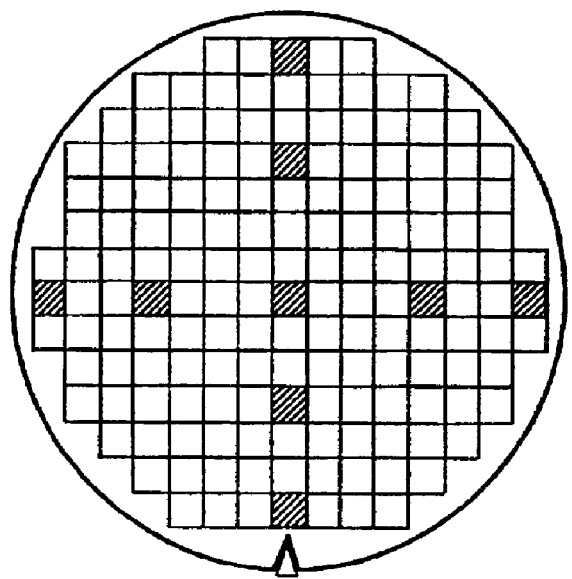
FIG. 45(a) is a diagram illustrating a method of evaluating in-plane uniformity of the post-etching shape according to a tenth embodiment of the present invention.
FIG. 45(b) is a graph which shows the distribution over the wafer of a certain feature quantity.
Figure 45:
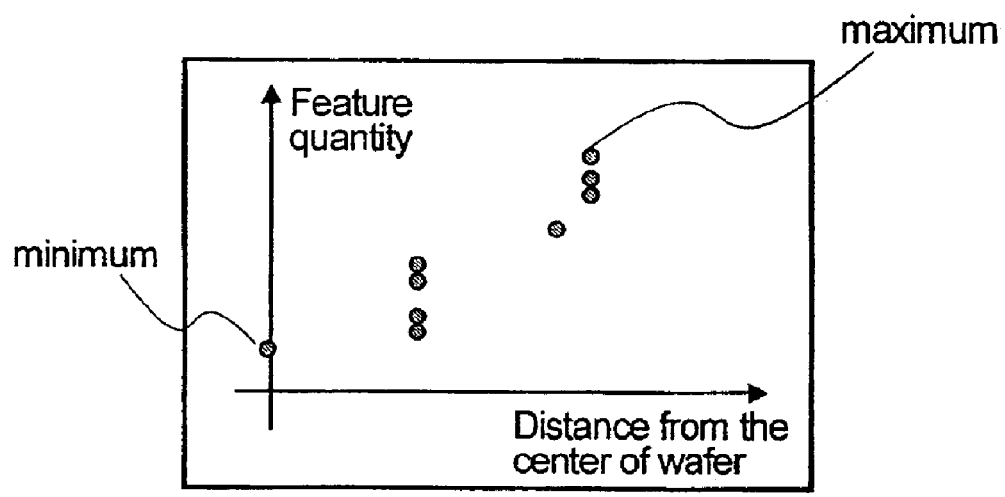

Next, referring to FIGS. 45(a) and 45(b), a tenth embodiment will be described. In the etching process, unlike the photo process, it is extremely important to secure a uniform processing over the wafer surface in order to realize excellent processing. Thus, in this embodiment, in addition to several feature quantities, such as the wiring width, the rounding, and the footing, the in-plane uniformities of these feature quantities are added as new feature quantities. For example, for chips designated by shading in FIG. 45(a), the SEM images are acquired. Next, as shown in FIG. 45(b), a distribution over the wafer of a certain feature quantity (for example, the wiring width) is obtained and a ratio of the maximum value to the minimum value of this feature quantity or the difference between them is employed as a new feature quantity. The above is all that needs to be done. At this time, there is not necessarily a need to obtain in-plane distributions for all feature quantities, and it is only recommended that, for an especially important feature quantity in the process intended to be controlled, the distribution of the feature quantity over the wafer surface is calculated. By providing a new feature quantity like this, a process control that considers the uniformity over the wafer surface can be executed and this will enable application of this system to larger-diameter wafers.

Figure 46:
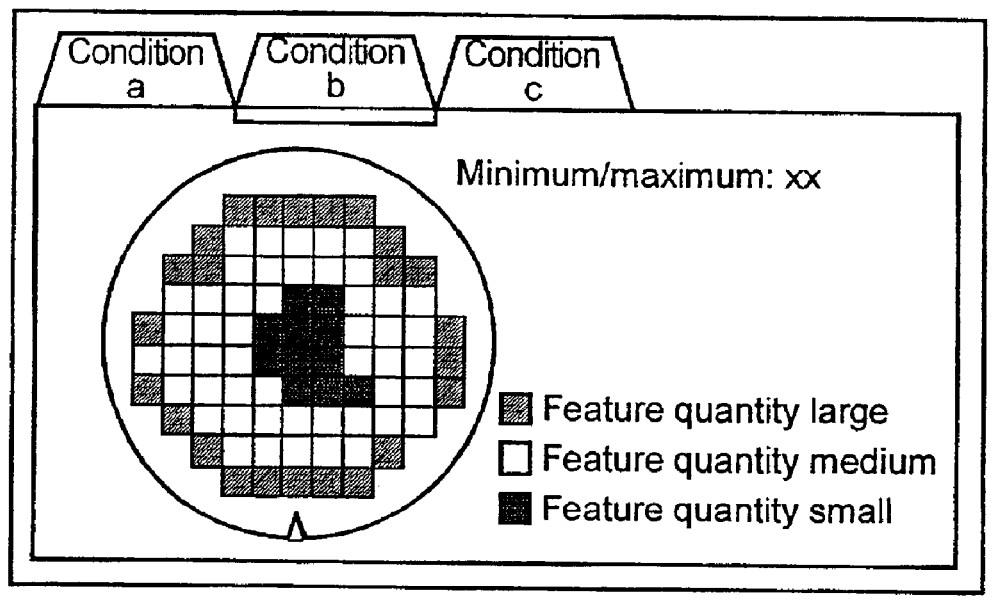
FIGS. 46(a) and 46(b) are diagrams of the display screen showing one example of the process monitoring GUI according to the tenth embodiment of the present invention.
Figure 46:
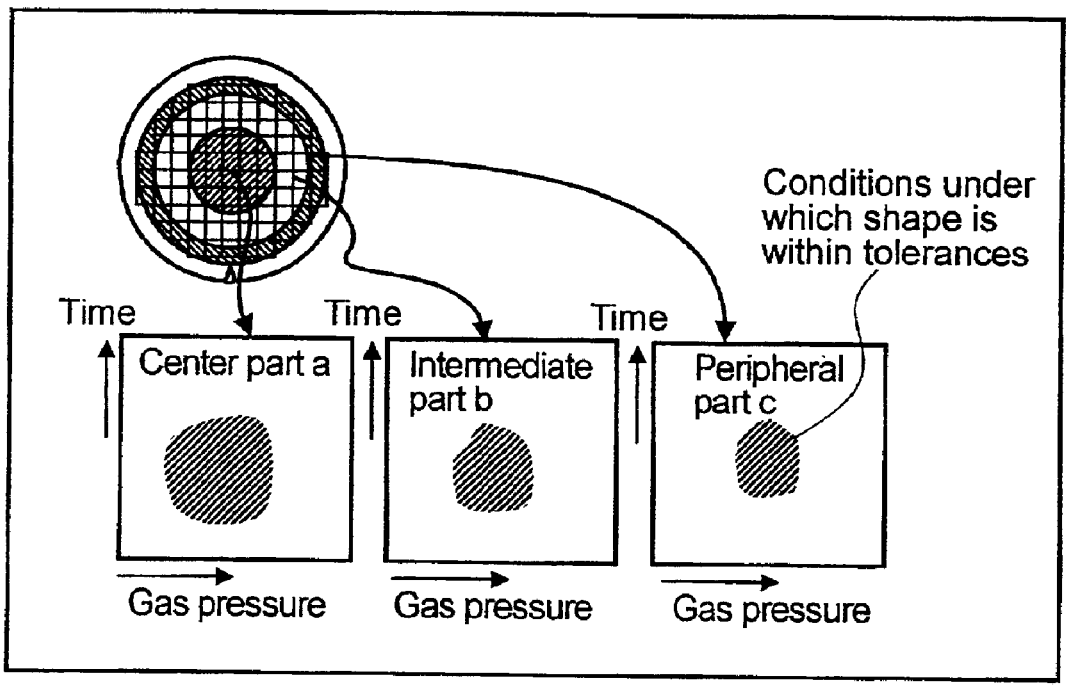

Further, an example of a display of the uniformity over the wafer surface is shown in FIGS. 46(a) and 46(b). FIG. 46(a) displays an in-plane distribution of the wafer that was theasured for a certain feature quantity (for example, the line width) with different colors each assigned to a different magnitude of the feature quantity, Instead of the displays (401a, 402a, 403a, etc.) that show parameter dependencies of the respective feature quantities in FIG. 15, the display of FIG. 46(a) may be used. Moreover, in FIG. 46(b), a respective process window for a certain feature quantity is displayed for different positions in the wafer plane, for example, the wafer center, wafer middle, and wafer peripheral. By displaying the process window in this way, the uniformity over the wafer surface of the post-etching pattern shape can easily be checked.

Eleventh Embodiment (Condition Finding+Method of Creating Reference Database)

Principal processing conditions of the etching process include the etching time, the electric power of the plasma discharge, the bias electric power applied to the sample, a flow rate (ratio) of a process gas and its pressure, the wafer temperature, etc. If these conditions are not set to proper values, a pattern of the desired shape cannot be produced. Since these parameters affect each other, it is highly difficult to set the optimal conditions, and, in the present circumstances, the setting is based mostly on the experience and intuition of experts.

Figure 47:
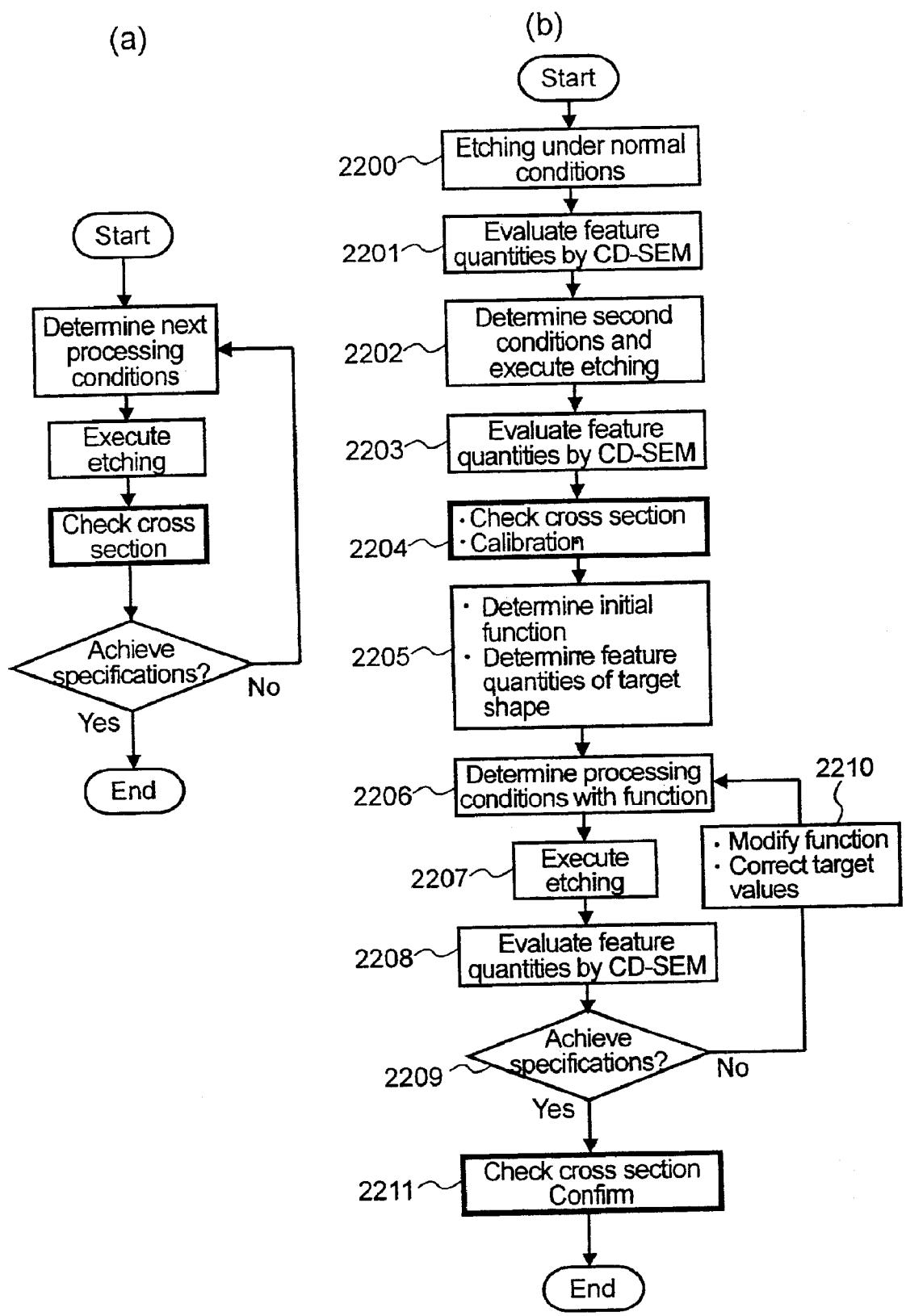
FIGS. 47(a) and 47(b) are flowcharts of the condition-finding operation for the etching according to an eleventh embodiment of the present invention.

Contrary to this, the present invention shows the feature quantities defining the shape with functions as in the embodiment No. (1-1), and thereby the time required for the condition finding is shortened. FIGS. 47(a) and 4(b) show a condition finding procedure according to the present invention. FIG. 47(a) shows a current condition-finding procedure whereby the processing and the cross-sectional observation are repeated for the quality judgment of the pattern. Unlike the FEM in the photo process, the pattern with different processing conditions cannot be produced on a single wafer and a set of the etching conditions requires a single sheet of wafer; therefore, if the iterative loops increase in number, the cost of the condition finding naturally increases. Consequently, compared to the photo process, the creation of the reference database as a matter of course and the determination of the optimal conditions require much time and cost. The number of iterations may differ depending on the skill of the expert. If the relationship between the etching conditions and the shape can be evaluated quantitatively the iterative operations can be decreased in number, and, hence, the condition finding is facilitated.

FIG. 47(b) illustrates the condition-finding procedure according to the present invention. In the beginning, functions, each of which expresses the relationship between one of the condition parameters and the feature quantities defining the shape, are obtained roughly at the steps 2200–2205.

As an example, a case in which the wiring is formed so as to be embedded in a trench of an oxide film by means of damascene processing will be described as follows. In this case, adjustment is executed by using the etching time and the gas pressure as principal parameters. Here, as a criterion of the etching conditions, a feature quantity that has a high correlation with the dimensions of concern is selected. For example, as the feature quantities including the wiring widths that correspond to the top part and the bottom part, respectively, a dimensions that is closely correlated with the top width and the bottom width is selected and used among the dimension 1 and a dimension 2 of FIGS. 19(a) and 19(b). For example, the dimension 1 and the dimension 2, as illustrated in FIG. 19(a) at a height of b=10%, are specified to be the bottom width and the top width, respectively, FIGS. 48(a) and 48(b) show a relationship between these feature quantities and the processing conditions that are to be obtained.

Normally there are standard processing conditions according to the material to be processed and a shape to be formed, and the conditions are optimized to an object product and a process. Further, it is often the case that a qualitative property of each parameter has been understood to some extent (for example, "as the etching time is prolonged, the amount of etching increases"). Then, to begin with, the processing is executed under the pre-optimization standard conditions (step 2200 in FIG. 47(b)) and the top part width and the bottom part width that are the feature quantities are evaluated (step 2201 in FIG. 47(b), points designated by solid circles in FIGS. 48(a) and 48(b)).

Figure 48:
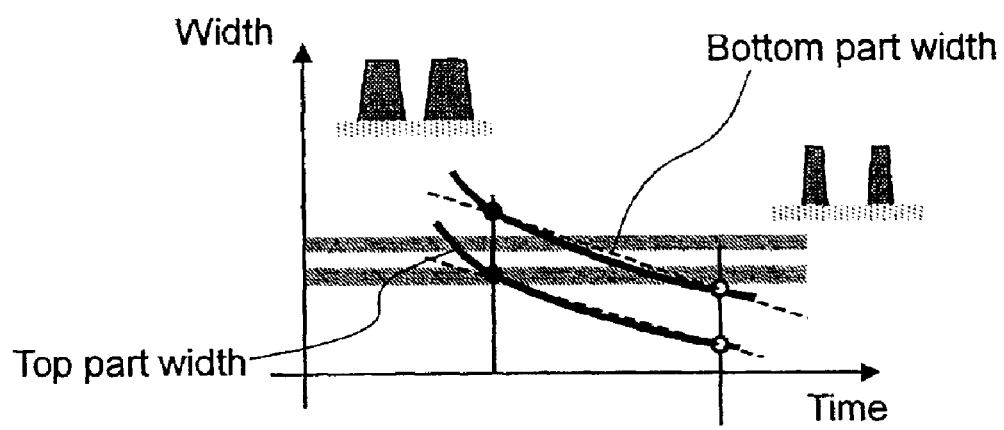
FIGS. 48(a) and 48(b) are graphs showing the relationship between the etching conditions and the feature quantities defining the pattern shape according to the eleventh embodiment of the present invention.
Figure 48:
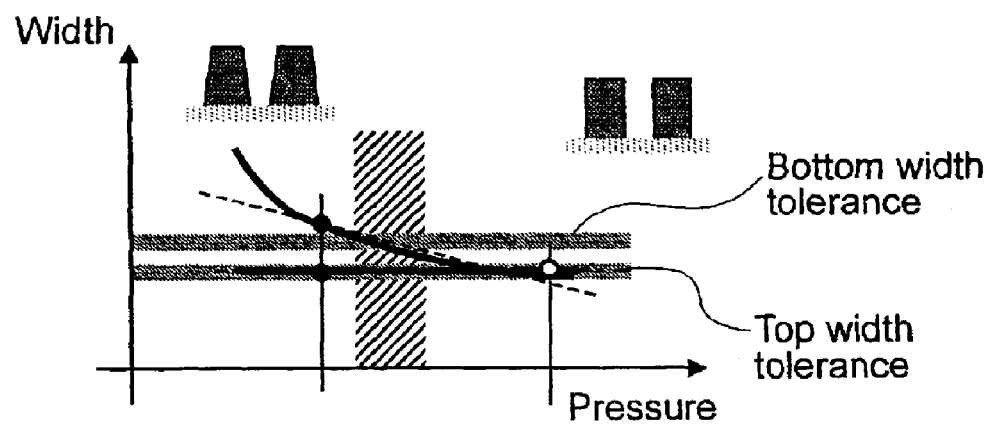

Based on this result, a second process (step 2202) in which each single parameter is altered by a suitable value and the other conditions are kept as the standard conditions, is executed, and the feature quantities are evaluated (step 2203; refer to points designated by open circles in FIGS. 48(a) and 48(b)). At this time, if the qualitative property of each parameter is known, the value is set in a direction in which the feature quantities approach their target values. For example, if a dimension is intended to be a target dimension smaller than the existing one in FIG. 48(a), the etching time is set to be longer and evaluation is performed.

By this evaluation, the relationship between the variation quantity of each parameter and the variation quantities of the feature quantities can be grasped roughly. This relation (dotted straight line shown in FIGS. 48(a) and 48(b)) is assumed to be an initial function, and the feature quantities of the target shape is temporarily determined (step 2205).

Here, it is preferable that the processed results under the standard conditions and those under the second conditions are properly checked for the quality of their shapes (step 2204) by using an AFM and with the use of cross-sectional observation. Note that, if these feature quantities have previously been calibrated by other means, the step 2204 is not necessarily required. Thus, if these shapes have previously been evaluated properly, the judgment as to whether the processed shape is good or bad can be performed merely with the feature quantities of the SEM image with the help of these results.

The use of the initial functions thus obtained makes it possible to predict which value the selected parameter should be set to, in order to realize the desired shape with the selected parameter. Therefore, the conditions are narrowed down by utilizing them. At a step 2206, the following processing conditions are set by using these initial functions. In the example of FIGS. 48(a) and 48(b), the following difference in the characteristics has been determined as the etching time is altered, both the top width and the bottom width change similarly (FIG. 48(a)), but as the gas pressure is altered, only the bottom width changes (FIG. 48(b)). Considering these characteristics, as well as the difference between the feature quantities under the standard conditions and the target values, a principal parameter(s) to be altered is determined.

For example, if the target dimensions are fixed as shown by gray lines in FIGS. 48(a) and 48(b), it is recommended that an attempt be made to alter the parameter of the gas pressure to a range indicated by hatching in FIG. 48(b) or the neighborhood thereof, which is designated as an intersection area of the prediction lines for the characteristic and the tolerances, and then a value that was found to be capable of realizing the desired shape is selected. This is the same operation as that in the first embodiment executed in calculating the variation quantities of the parameters to select the conditions under which the deviations of the group of feature quantities from the target values become minimum. At this time, if there are a plurality of parameters that can alter the shape similarly, it is recommended that one of the parameter be selected by considering the throughput, the ease of alteration of the parameter, the stability of the process, etc.

Such selection of the parameters can be executed by automatic calculation as well, if a proper evaluation function that considers the deviations from the target values and ease of alteration of each parameter is set. In this case, if a plurality of parameters are selected, the alteration quantities are adjusted with synergistic effects being considered. Note that, here each processing condition parameter is altered once to the standard parameter as a second processing condition and a trend is determined by simple linear approximation. However, a plurality of alterations of the condition may be executed and many more pieces of data may be used for the adjustment. In this case, according to several pieces of acquired data, a suitable method other than linear approximation may be employed.

Subsequently, (1) the processing (step 2207), the evaluation (step 2208), and the judgment (step 2209) are performed; (2) based on the results, the function of the feature quantities versus the processing parameters and the feature quantities of the target shape are corrected (step 2210); and, (3) the next processing conditions are determined (step 2206). The series of operations are repeated until the target shape is obtained. When the etching conditions under which the feature quantities of the target shape can be obtained are determined, the cross-sectional observation of the processed wafer is performed, and if there is no problem, the condition finding is completed.

Thus, in accordance with the present invention, since the conditions are altered based on quantitative evaluation results, the etching conditions can be brought to convergence without fail. Further, since the iterative loop for the alteration of a condition consisting of the steps 2206–2210 do not include the cross-sectional observation that is most time-consuming, faster condition finding compared to the conventional technique can be realized.

Naturally, if the cross-sectional observation is performed for some processing conditions similarly with the conventional method and the measured values are calibrated, the reliability of the condition finding can be further improved. Thus, by using the feature quantities, condition setting can be made quantitatively and efficiently, not by performing the cross-sectional observation every time, but only by conducting confirmation at important points.

In FIGS. 48(a) and 48(b), the widths of top part and of the bottom part are used as the feature quantities for shape evaluation. It is recommended to use such feature quantities as express characteristics of an important shape for the pattern to be processed, for example, the slope angle of the side-wall, the indices of the rounding and footing, etc. When the indices of the rounding and footing are used as the, feature quantities, it is difficult to estimate an absolute shape with the index values alone. However, for example, if the radius of curvature of the corner part is measured by the cross-sectional observation of the processed results for the standard conditions and those for the conditions whose parameters were altered, and then the relationship between the index value and the radius of curvature is obtained, the indices at the desired shape can be estimated.

Note that this embodiment represents an example where the standard conditions are known. In the case where totally a new material and structure are going to be examined to find their characteristics, but it is not yet clear which parameter will exhibit what characteristics, a condition-finding technique that uses the experimental design, Taguchi-method, or the like is effective. Also, in such a case, the optimal conditions can be determined with the use of the feature quantities obtained by this system, as evaluation values of workmanship.

Further, at the time of etching condition finding like this, if the reference database has been created simultaneously, it can be used for the process control in the above-mentioned ninth embodiment. In this embodiment, the iterative operations are performed only under conditions close to final conditions, but the database that is used when the process is actually monitored and controlled is enough, provided that a variation in shape close to the desired shape can be calculated therewith, and, hence, data that is stored at the time of the condition finding in this embodiment is sufficient.

Twelfth Embodiment

Figure 39:
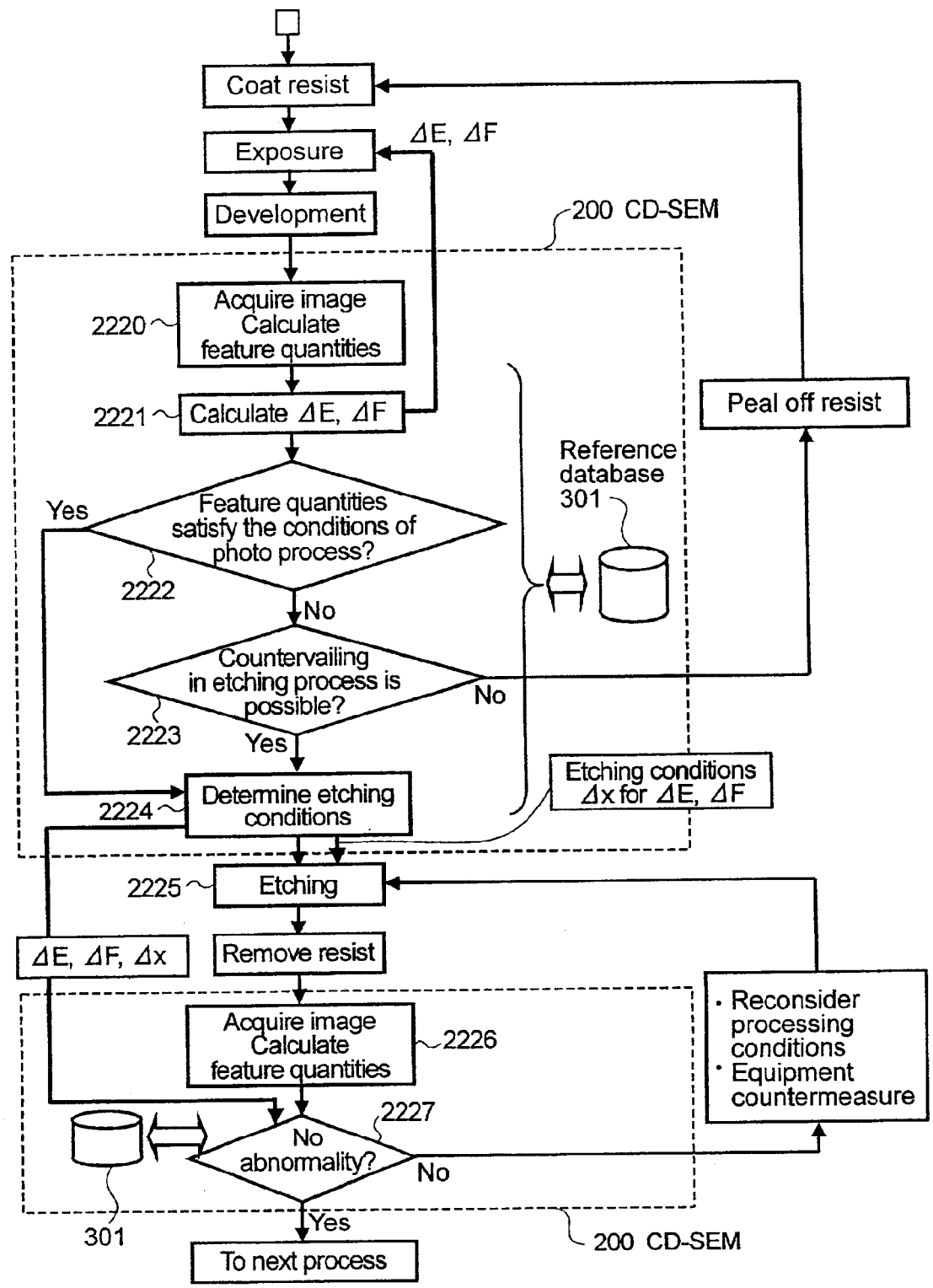
FIG. 39 is a flowchart snowing a processing procedure of the etching-process monitoring system according to the twelfth embodiment of the present invention.

FIG. 39 is a conceptual diagram of the lithography process that is used in the lithography-process monitoring system, according to a twelfth embodiment of the present invention. In the twelfth embodiment of the present invention, the process control is executed by using the shape information that was obtained from the electron beam images of the resist pattern and the post-etching pattern, both of which are of the product wafer subject to inspection.

Hereafter, referring to FIG. 39, the procedure will be described. First, as with the above-mentioned embodiment No. (1-0) etc., the shape of the resist pattern after the exposure is evaluated and the quantities of variation of the exposure conditions are calculated (step 2220, 2221). The calculated variation quantities of the exposure conditions are compared with the tolerances of the photo process that have previously been recorded in the reference database, (step 2222); and, if the criteria are satisfied, the normal etching conditions, as they are, are set (step 2224) and the flow proceeds to the etching process (step 2225).

Here, if the criteria are not satisfied, by referring to the correspondence relationship between the exposures conditions and the etching conditions that has previously been recorded in the reference database, it is judged whether or not nonconformity of the criteria can be countervailed with the alteration of the etching conditions (step 2223). If the countervailing measure is feasible, the etching condition is altered (step 2224) and the etching process is executed (step 2225); whereas, if the countervailing measure is impossible, the peeling off of the resist and re-exposure are executed (step 2225). Contents of the database that provide this relationship between the exposure conditions and the etching condition and how to create it will be described later. These steps 2220–2224 are performed in the CD-SEM 200. At this time, it is by referring to the reference database 301 that the steps 2221 to the step 2224 are performed. Here, it should be noted that FIG. 39 shows an example wherein calculation results of the exposure conditions at the step 2221 are always fed back to the exposure equipment, as with the third embodiment, but naturally a method may be adopted whereby suitable tolerances are set, and are corrected only when the calculation results exceed the tolerances, as with the embodiment No. (1-0).

This feedback is executed automatically through the data collection and analysis system and the equipment control system of FIG. 42. Alternatively, a scheme may be adopted such that, only when the calculation results exceed the tolerances will this fact be communicated to an operator and a production line manager on a CD-SEM screen, through the display and communication means 503 of FIG. 42 via a network, etc.

Next, also for the post-etching pattern, the shape feature quantities are evaluated (step 2226) arid it is judged whether or not an abnormality exists in the processed shape (step 2227). The result can be confirmed on the GUI Screen of the CD-SEM or by the display and communication means 503 shown in FIG. 42. Here, when the process results are not normal, and if the abnormality is judged to contribute to the variation in the etching process in consideration of the variation of the exposure conditions and the alteration of the etching condition, the countervailing measure of the device concerned and the alteration of the processing conditions are carried out. These steps 2226 and 2227 are performed in the CD-SEM 200 by referring to the reference database 301. Moreover, the method of concern may be executed in such a way that, from the calculated shape feature quantities, the variation quantity of the etching condition parameter that acts as a countervailing measure against the change in the shape is calculated, and the condition of the etching apparatus is automatically altered, as with the case of the exposure equipment.

That is, the pattern is evaluated after the exposure and the etching, and if the exposure process is found to be the cause of the shape variation, the conditions of the exposure process are changed back to an optimal condition; and, at the same time, the etching conditions for the wafer in which the abnormality was detected are altered, and, thereby, possible influence of the abnormality in the exposure process is absorbed, so that the post-etching pattern shape is guided to a good state, On the other hand, if there is a problem in the etching process, a countermeasure for the equipment of the etching process is devised and/or the processing conditions are altered. Here, regarding the feature quantities acquired from the SEM image, any of the feature quantities described in the above-mentioned embodiments may be used.

Further, in FIG. 39, operations from the image acquisition of the pattern to the judgment of evaluation results of the shape are performed on the CD-SEM. However, naturally, any procedures, except the acquisition of the electron beam image, may be performed on another computer(s) that is linked with the CD-SEM via a network.

Next, a method for creating a database that describes the relationship between the exposure conditions and the etching condition will be described. In order to obtain a proper etching condition for the variation quantities of the exposure and focus in the photo process, according to points for creating the process window as described with reference to the embodiment No. (1-0) and the fourth embodiment, a database is created that describes the relationship among the processing conditions in the photo process (the exposure and the focus), the feature quantities of the processed results, and the tolerances thereof, using the condition-finding wafer (FEM wafer) in the photo process shown in FIG. 4.

Figure 50:
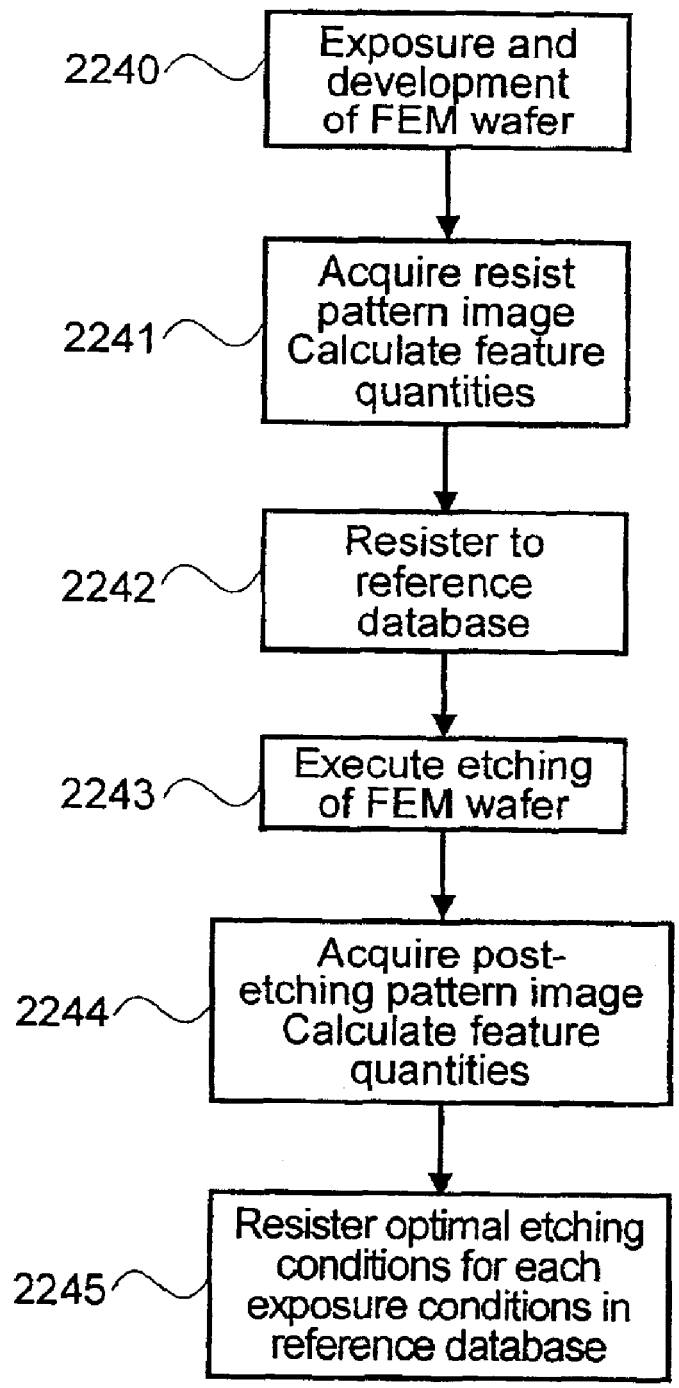
FIG. 50 is a flowchart of the procedure for creation of a reference database that expresses the relationship between the exposure conditions and the etching condition according to the twelfth embodiment of the present invention.

Referring to FIG. 50, a procedure for creating the reference database will be described. To begin with, plural sheets of FEM wafers of the type shown in FIG. 4 will be produced (step 2240). Next, the feature quantities of the images of these FEM wafers are calculated (step 2241) and stored in the reference database together with the exposure conditions (step 2242), as with the embodiment No. (1-0). Subsequently, the produced FEM wafers are subjected to the etching process under the optimal conditions and also under several conditions other than the optimal conditions (step 2243), and the feature quantities of the SEM image are calculated for those wafers (step 2244). Finally, the exposure conditions under which obtained feature quantities of the image satisfy the tolerances of the final shape are checked on each wafer and these relationships are stored in the reference database (step 2245).

Figure 4:
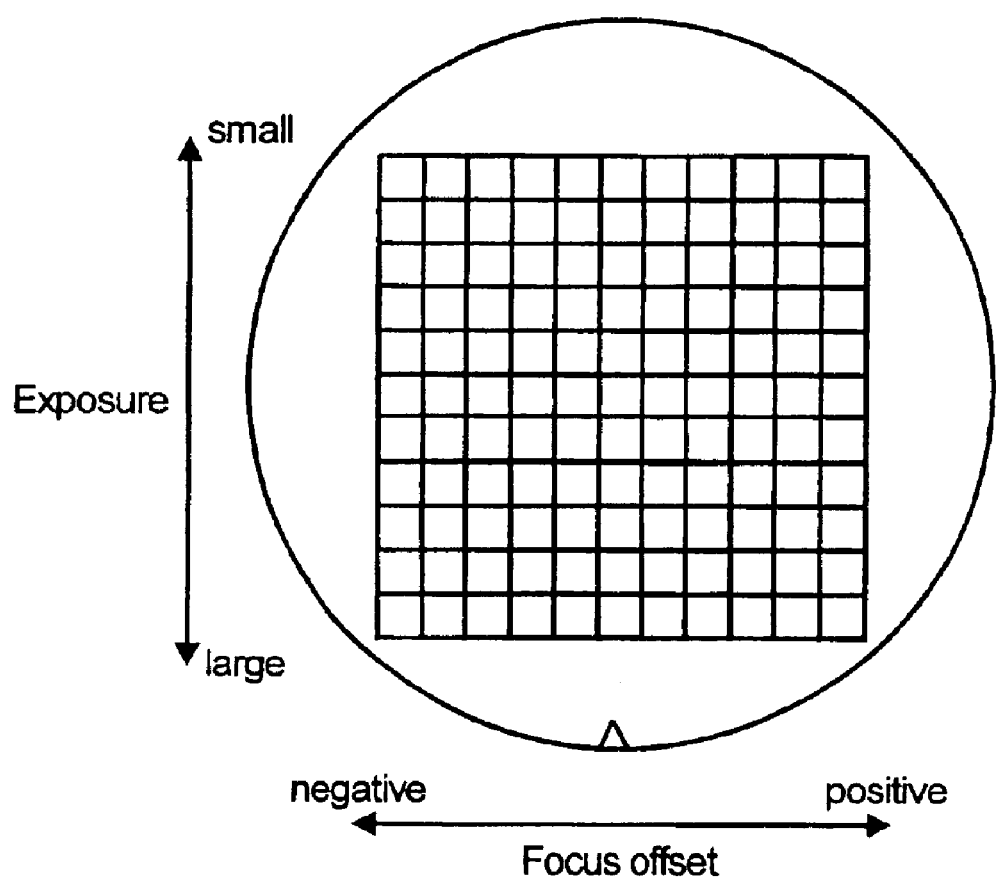
FIG. 4 is a diagram showing one example of a wafer for condition determination.
Figure 5:
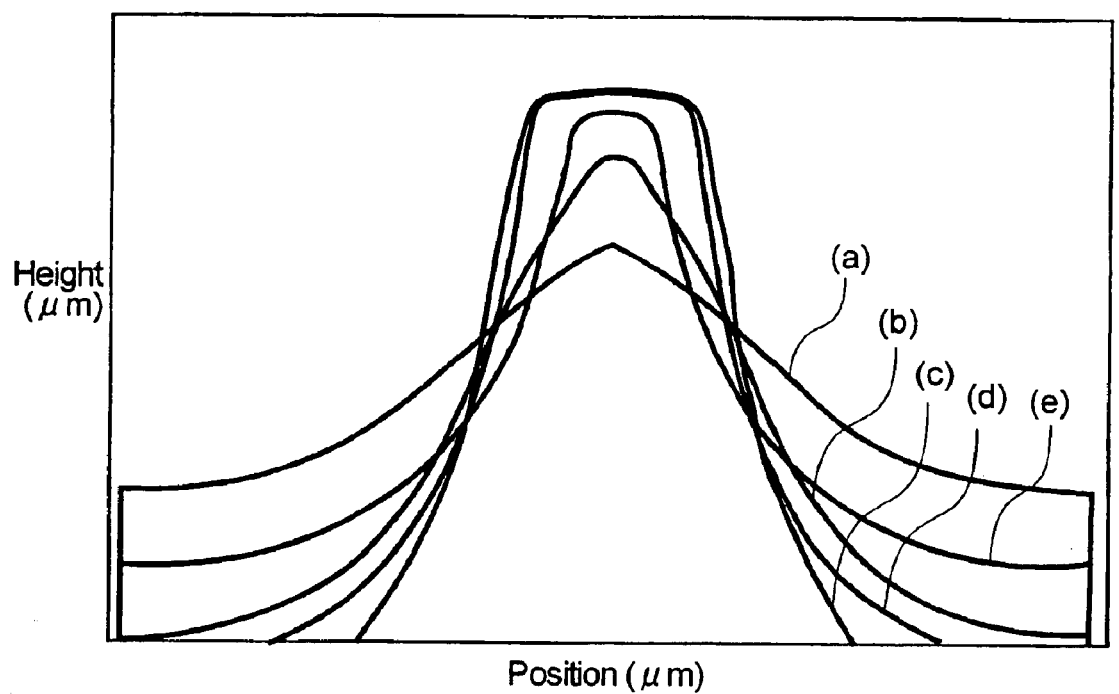
FIG. 5 is a graphical diagram of the resist showing the change in the resist cross section due to out of focus condition.
Figure 6:
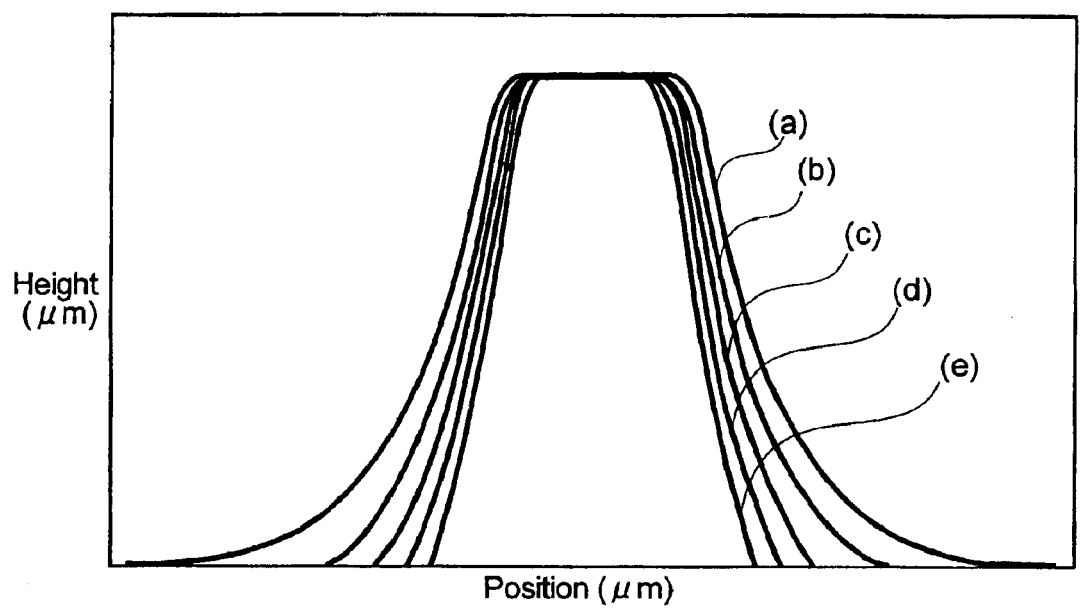
FIG. 6 is a graphical diagram showing a change in the resist cross section due to drift of the exposure.
Figure 7:
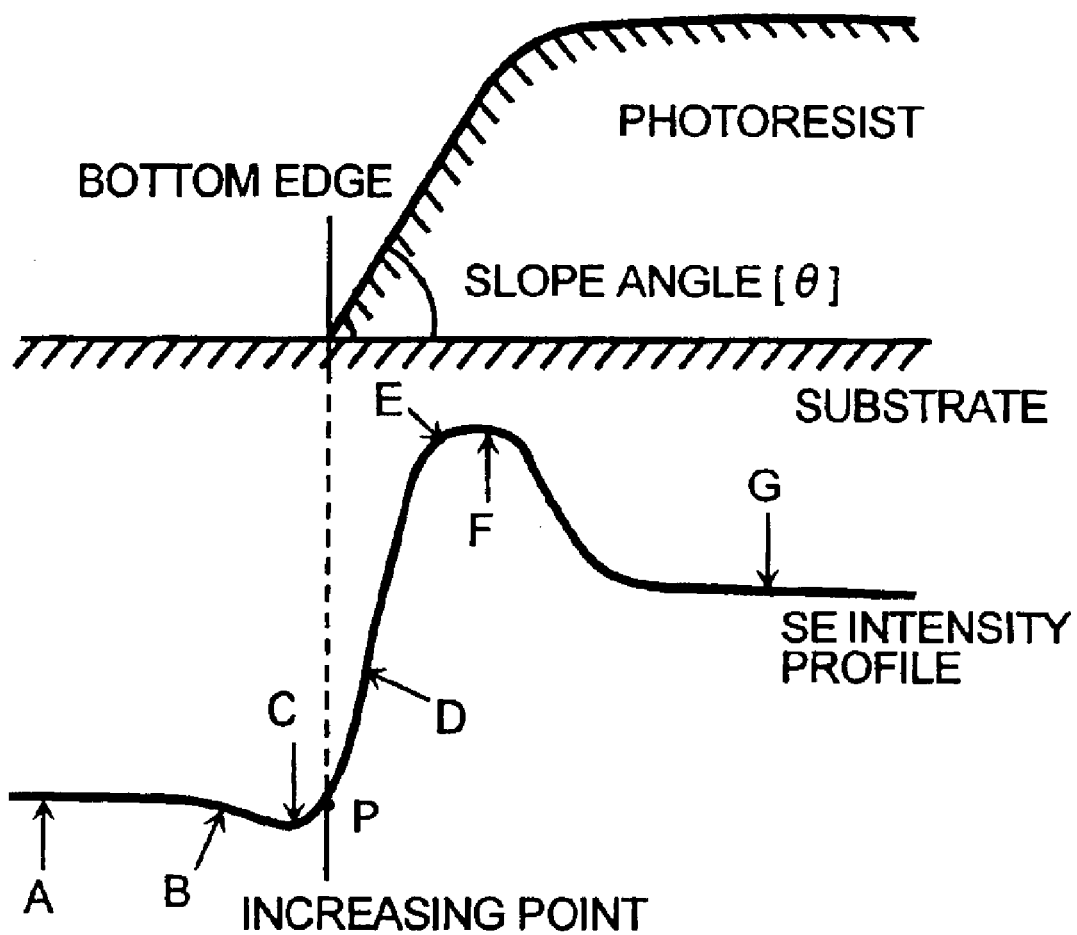
FIG. 7 is a schematic diagram showing a relationship between the resist cross section and secondary electron signal strength.
Figure 49:
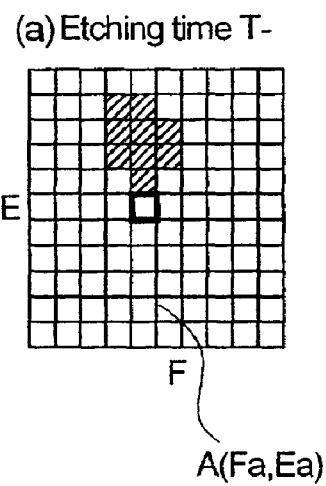
FIGS. 49(a) to 49(d) are diagrams illustrating the relationship between the exposure conditions and the etching condition according to a twelfth embodiment of the present invention.
Figure 49:
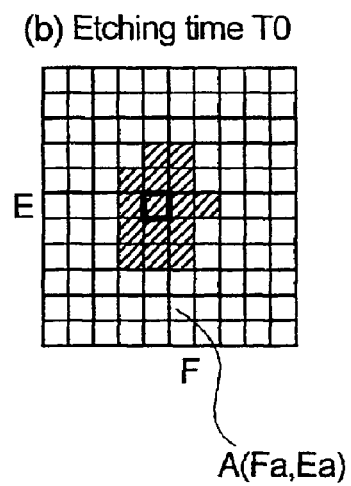
Figure 49:
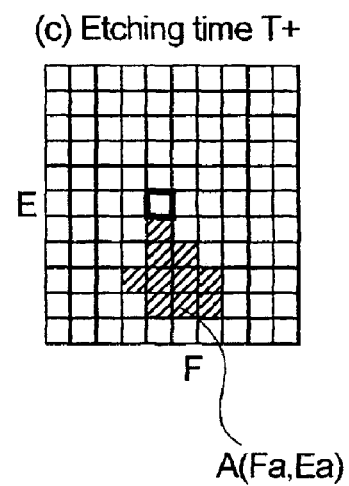
Figure 49:
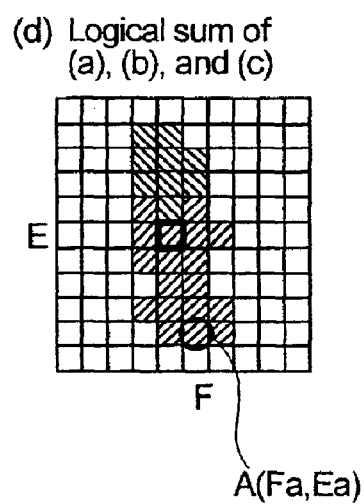

Next, referring to FIGS. 49(a) and 49(b), detailed contents will be described. The description will be directed to the case where the etching time is controlled for the oxide film etching described with reference to the eleventh embodiment. For example, consider that the etching condition is the etching time, and the exposure condition-finding wafers shown in FIG. 4 are etched for three kinds of etching times, respectively.

FIGS. 49(a) and 49(d) show results of the etching of the wafers, each of which has been processed with different conditions of the exposure and the focus. In these figures, the x axis represents the focus, the y-axis represents the exposure, and a box area enclosed with a solid line represents the optimal exposure conditions. A patterned region consisting of hatched box areas represents a "process window," wherein each hatched box area represents a different set of the exposure conditions, such that the post-etching shape under the conditions is judged to be within tolerances by the evaluation of the feature quantities. The FIGS. 49(a), 49(b), and 49(c) show the results of etching under different etching times, respectively, wherein the optimal etching time for a normally exposed pattern is the condition of FIG. 49(b). With this process window, for example, the following knowledge can be obtained. If the focus and the exposure were (Fa, Ea) due to an abnormality in the photo process, the etching with the etching time T+ as illustrated in FIG. 49(c) will give a desired processed shape. Thus, if a set of the exposure and the focus in the photo process, the etching condition, and the feature quantities of the post-etching pattern shape have been recorded as a piece of data to create the database using the resist pattern shown in FIG. 4, even when an abrupt abnormality occurs in the photo process, a desired pattern shape can be obtained by the alteration of a condition in the etching process.

FIG. 49(d) shows a logical sum of the hatched box areas of FIGS. 49(a), 49(b), and 49(c). With only the alteration of a condition in the photo process, only the process window of FIG. 49(b) is allowed to yield the desired pattern shape; whereas, if the etching condition is altered, the process window of FIG. 49(d) is allowed to yield the desired pattern shape, which means that countervailing measure can be devised against a wider variation in the photo process. Incidentally, the white-background portion in FIG. 49(d) represents cases where the desired processed shape could not obtained under any etching condition and conventional resist peeling off and re-exposure should be executed for those. In this case, a warning and/or an error message can be output, if necessary.

If the etching condition under which the desired pattern can be processed for each exposure condition has been stored in the reference database based on these results, the process control illustrated in FIG. 39 becomes possible. Note that, if the, desired shape can be obtained under plural values of the etching condition, it is naturally recommended to select a value of the condition under which a wider surrounding region consisting of box areas, each giving the desired shape, is given, namely a value of the condition whose process margin is the largest. Note also that, if there is a gap among the process windows in FIGS. 49(a), 49(b), and 49(c) conversely, it is recommended to form the FEM with an etching condition that falls between these etching conditions, to determine a suitable condition by interpolation, or other measures. It should be noted that, although the parameter in the etching process is only the etching time, having three different values in this embodiment, the kinds of parameters to be altered and the number of values for each parameter may be changed as the need arises.

According to this embodiment, focus drift at the time of exposure, that is liable to be overlooked in the conventional method, can be detected without fail by acquiring the information of the 3-D shape of each pattern in a non-invasive manner to monitor the process; therefore, when an abnormality arises, whether the cause is the photo process or the etching process can be determined on the spot. Consequently, investigation of the cause and its countervailing measure at the time of occurrence of the abnormality can be executed quickly. As a result, a stable process can be realized and high-volume occurrence of a defective device that is caused by an abnormality of the pattern shape can be prevented. Further, even when the abnormality occurs in the photo process, the number of peeling off and reformation of the resist operations can be reduced from what is necessary in the conventional process.

Thirteenth Embodiment

In the above-mentioned twelfth embodiment, a case was considered where a condition-finding wafer of FIG. 4 was used. As the thirteenth embodiment, a technique for creating a database that considers the uniformity of the etching will be described.

In the etching process, it is difficult to execute a uniform process over the whole wafer because of various factors, such as the distributions of a plasma and of process gas pressure in the chamber. Because of this, if samples each having an altered exposure and altered focusing are simply arranged in the manner as shown in FIG. 4 and the above-mentioned etching process is executed, the post-etching pattern shape is very liable to differ, not only due to the difference of the exposure and the focus, but also due to the influence of the uniformity of the etching process. Therefore, it is preferable to arrange the samples in consideration of the uniformity of the etching, rather than altering the exposure and the focus sequentially as in FIG. 4.

Figure 51:
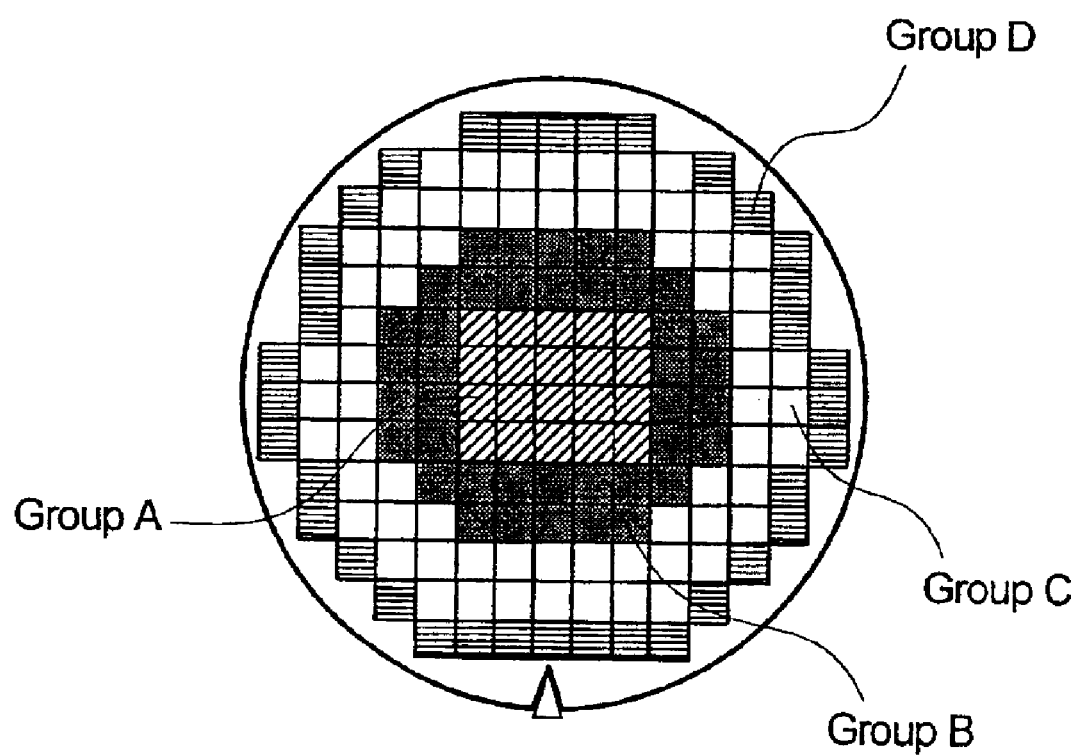
FIG. 51 is a diagram of the wafer according to a thirteenth embodiment of the present invention.

As shown in FIG. 51, an exposure shot is divided up into several groups (in the example of FIG. 51, group A to group D) according to the distance from the edge of the wafer, and a combination of shots, each of which has a different exposure and a different focus, is made for each group. That is, for each group, the samples are processed under the conditions of the combination of shots so that the data of the process window of the exposure and the focus shown in FIG. 49 can be obtained. By using this data, information of the uniformity over the wafer surface resulting from the etching process can be obtained in light of the difference between the feature quantities of the resist pattern before the etching process and that after the etching process.

For example, if one of the feature quantities of the pattern shapes that were formed udder the same exposure conditions varies only after the etching, it is reasonable to consider that there is a problem in the etching process; and, if one of the variation quantities of the feature quantities has a positional dependency in the wafer, information of the uniformity over the wafer surface resulting from the etching can be obtained, and especially positions, where a process margin is small, and the degree thereof can be known quantitatively. For example, if the process window is displayed for each group similar to that shown in FIG. 46(b), the operator can confirm how the process magin of the lithography process, including the photo and the etching processes, differs depending on positions in the wafer.

Note that what is shown in FIG. 51 is a way of grouping positions in the wafer that uses a property such that variation in the shape after the etching process has a comparatively concentric distribution on the wafer. However, if there is knowledge that the variation has a different distribution depending on the exposure equipment, a way of grouping that matches such a distribution may be performed.

According to the present invention, wafers with a larger diameter can also be monitored similarly by executing a process control that considers the uniformity over the wafer surface, in addition to such advantages as can be obtained in the above-mentioned twelfth embodiment.

According to the present invention, the 3-D shape of the resist pattern can be monitored at the product level each is the object of the invention, and thereby a lithography-process monitoring system capable of detecting not only the exposure drift, but also the focus drift, can be provided. As a result, an abnormality in the 3-D shape caused by the focus drift that has been overlooked by the conventional dimension measurement becomes detectable, so that the method according to the present invention can prevent a wafer having a defect that exists in the post-etching film pattern, hence being incapable of being reformed, from being put into manufacture. Further, getting away from conventional feedback to the exposure equipment that is based on experience and the intuition, precise feedback to the process becomes possible because quantitative outputs are made possible. Moreover, by executing variation predictive control of the exposure conditions, the present invention can provide stable lithography.

The invention may be embodied in other specific forms without departing from the spirit or essential characteristics thereof. The present embodiment is therefor to be considered in all respects as illustrative and not restrictive, the scope of the invention being indicated by the appended claims, rather than by the foregoing description, and all changes which come within the meaning and range of equivalency of the claims are therefore intended to be embraced therein.

What is claimed is:

1. A system for monitoring a semiconductor device manufacturing process, comprising:
   image acquiring means for acquiring an electron beam image of a pattern produced on the surface of a substrate by irradiating the substrate, on whose surface the pattern was produced by being subjected to a predetermined treatment process, with the electron beam by scanning;
   calculation means for calculating feature quantities of said pattern from the electron beam image of said pattern obtained by said image acquiring means;
   storage means for storing a reference database that describes a relationship between processing condition parameters in said predetermined treatment process and the feature quantifies of the pattern produced on the substrate by the substrate being subjected to said predetermined treatment process; and
   monitoring means for monitoring a state of said predetermined treatment process by referring to both the feature quantities of the electron beam image of said pattern calculated by said calculation means for calculating the feature quantities and the relationship between the processing condition parameters and the feature quantities of the pattern described in the reference database stored in said storage means.

2. The system for monitoring a semiconductor device manufacturing process according to claim 1, wherein said monitoring means calculates variation quantities of the processing condition parameters in said predetermined treatment process and monitors a state of said predetermined treatment process based on said calculated variation quantities of the processing condition parameters.

3. The system for monitoring a semiconductor device manufacturing process according to claim 1, wherein said monitoring means obtains corrections of processing conditions of said predetermined treatment process by using information of said calculated variation quantities of the processing condition parameters.

4. The system for monitoring a semiconductor device manufacturing process according to claim 3, wherein said monitoring means corrects the processing conditions of said predetermined treatment process based on said obtained corrections of the processing conditions of said predetermined treatment process.

5. The system for monitoring a semiconductor device manufacturing process according to claim 1, wherein said monitoring means displays time fluctuation of the feature quantities of the electron beam image of said pattern on the screen.

6. The system for monitoring a semiconductor device manufacturing process according to claim 5, wherein said monitoring means displays parameters that indicate a state of said predetermined processing equipment obtained from said predetermined processing equipment together with time fluctuation of said feature quantities on the screen.

7. The system for monitoring a semiconductor device manufacturing process according to claim 1, wherein said predetermined treatment process is either an exposure process or an etching process.

8. A system for monitoring a semiconductor device manufacturing process, comprising:
   image detecting means for obtaining an electron beam image of a pattern produced on the surface of a substrate by irradiating the substrate, on whose surface the pattern was produced by being subjected to a predetermined treatment process, with the electron beam by scanning;
   means for calculating feature quantities of said pattern from the electron beam image obtained by said image detecting means;
   storage means for storing a reference database that describes a relationship between processing condition parameters in said predetermined treatment process and the feature quantities of the pattern produced on the substrate by the substrate being subjected to said predetermined treatment process and also a proper region of the feature quantifies of the pattern produced on the substrate by the substrate being subjected to said predetermined treatment process; and
   judgment means that compares the feature quantities of the electron beam image of said pattern calculated by said calculation means for calculating said feature quantifies with the proper regions that are described in the reference database stored in said storage means, and if any one of said feature quantities deviates from said proper regions, judges that variation quantities of said processing condition parameters exceed allowable errors.

9. The system for monitoring a semiconductor device manufacturing process according to claim 8, further comprising monitoring means that
   calculates the feature quantities of said electron beam image with the calculation means for calculating said feature quantities from the electron beam image of the pattern produced on said substrate that was acquired by said image detecting means,
   calculates variation quantities of said processing condition parameters from said calculated feature quantities of the electron beam image by referring to a relationship between said processing condition parameters and the feature quantities of said pattern that are described in the reference database stored in said storage means, and
   monitors a state of said predetermined treatment process on the basis of said calculated variation quantities of the processing condition parameters.

10. The system for monitoring a semiconductor device manufacturing process according to claim 8, wherein said monitoring means obtains corrections of processing conditions of said predetermined treatment process by using information of said calculated variation quantities of the processing condition parameters.

11. The system for monitoring a semiconductor device manufacturing process according to claim 8, wherein said monitoring means displays information concerning said obtained corrections of processing conditions of said predetermined treatment process on the screen.

12. The system for monitoring a semiconductor device manufacturing process according to claim 8, wherein said monitoring means displays time fluctuation of the feature quantities of the electron beam image of said pattern on the screen.

13. The system for monitoring a semiconductor device manufacturing process according to claim 8, wherein said monitoring means displays parameters indicating a state of said predetermined processing equipment that is obtained from said predetermined processing equipment together with the time fluctuation of said feature quantities on said screen.

14. The system for monitoring a semiconductor device manufacturing process according to claim 10, wherein said monitoring means corrects the processing conditions of said predetermined treatment process based on said obtained corrections of the processing conditions of said predetermined treatment process.

15. The system for monitoring a semiconductor device manufacturing process according to claim 8, wherein said predetermined treatment process is either of an exposure process or an etching process.

16. The system for monitoring a semiconductor device manufacturing process according to claim 8, wherein said feature quantities include three kinds of feature quantities of: (a) line width of the pattern; (b) a degree of rounding of a top part of the pattern; and (c) a degree of footing of a bottom part of the pattern.

17. The system for monitoring a semiconductor device manufacturing process according to claim 8, wherein said feature quantities are a predicted cross section calculated from a line profile of said electron beam image.

18. A system for monitoring a semiconductor device manufacturing process, the system comprising:
   first image detecting means for acquiring an electron beam image of a resist pattern produced on a substrate subject to processing that underwent an exposure process;
   first feature-quantities calculating means for calculating feature quantities of said resist pattern from said detected electron beam image;
   second image detecting means for acquiring the electron beam image of a circuit pattern that was produced by an etching process that uses the pattern produced by said exposure process as a mask;
   second feature-quantities calculating means for calculating feature quantities of said circuit pattern from said detected electron beam image;
   reference-database creating means for creating a reference database that describes (a) a relationship between the feature quantities of said resist pattern calculated by said first feature-quantities calculating means and exposure condition parameters in said exposure process, and (b) a relationship among said exposure condition parameters, etching condition parameters in said etching process, and the feature quantities of said circuit pattern; and
   etching-condition calculating means for calculating said etching conditions under which the feature quantities of said circuit pattern agree with desired values by using both
   (a) information of the feature quantities of said resist pattern calculated by said first feature-quantities calculating means and
   (b) information of the relationship among said exposure condition parameters created by said reference database creation means, etching condition parameters in said etching process, and the feature quantities of said circuit pattern.

19. A method for monitoring a semiconductor device manufacturing process, comprising steps of:
obtaining an electron beam image of a pattern produced on the surface of a substrate, on which the pattern was formed by being subjected to a predetermined treatment process, by irradiating said substrate with the electron beam by scanning;
calculating the feature quantities of said pattern from said obtained electron beam image of said pattern; and
monitoring a state of said predetermined treatment process by using both information of said calculated feature quantities of the pattern and information of a relationship between processing condition parameters in said predetermined treatment process stored previously and the feature quantities of the pattern produced on the substrate by the substrate being subjected to said predetermined treatment process.

20. The method for monitoring a semiconductor device manufacturing process according to claim 19, wherein, at a step in which a state of said predetermined treatment process is monitored, variation quantities of the processing condition parameters of said predetermined treatment process are calculated; and the state of said predetermined treatment process is monitored based on said calculated variation quantities of the processing condition parameters.

21. The method for monitoring a semiconductor device manufacturing process according to claim 20, wherein, at a step in which the state of said predetermined treatment process is monitored, corrections of processing conditions of said predetermined treatment process by using information of said calculated variation quantities of the processing condition parameters.

22. The method for monitoring a semiconductor device manufacturing process according to claim 21, wherein, at the step in which the state of said predetermined treatment process is monitored, information concerning said obtained corrections of the processing conditions in said predetermined treatment process are displayed on the screen.

23. The method for monitoring a semiconductor device manufacturing process according to claim 19, wherein, at the step in which the state of said predetermined treatment process is monitored, time fluctuation of the feature quantities of the electron beam image of said pattern is displayed on the screen.

24. The method for monitoring a semiconductor device manufacturing process according to claim 19; wherein, at the step in which the state of said predetermined treatment process is monitored, parameters indicating the sate of said predetermined processing equipment that are obtained from said predetermined processing equipment are displayed together with the time fluctuation of the feature quantities of the electron beam image of said pattern on the screen.

25. The method for monitoring a semiconductor device manufacturing process according to claim 21, further comprising a step of correcting the processing conditions of said predetermined treatment process based on said obtained corrections of the processing conditions of said predetermined treatment process.

26. The method for monitoring a semiconductor device manufacturing process according to claim 21, wherein said predetermined treatment process is either of an exposure process or an etching process.

27. A method for monitoring a semiconductor device manufacturing process, comprising steps of:
obtaining an electron beam image of a pattern produced on the surface of a substrate on which the pattern was produced by the substrate being subjected to a predetermined treatment process by irradiating said substrate with the electron beam by scanning;
calculating feature quantities of said pattern from said obtained electron beam image; and
judging that, if the feature quantities of said pattern deviate from said proper ranges, the variation quantities of processing condition parameters exceed allowable errors by using following pieces of information:
(a) said calculated feature quantities of said pattern;
(b) a relationship between the parameters of processing conditions in said predetermined treatment process and the feature quantities of the pattern produced on the substrate by the substrate being subjected to said predetermined treatment process; and
(c) proper ranges of the feature quantities of the pattern produced on the substrate by the substrate being subjected to said predetermined treatment process.

28. The method for monitoring a semiconductor device manufacturing process according to claim 27, the method further comprising steps of:
calculating variation quantities of said processing condition parameters by using both information of said calculated feature quantities of the electron beam image of said pattern and information of a relationship between the said processing condition parameters and the feature quantities of said pattern; and
monitoring a state of said predetermined treatment process based on said calculated variation quantities of the processing condition parameters.

29. The method for monitoring a semiconductor device manufacturing process according to claim 27, the method further comprising a step of obtaining corrections of the processing conditions of said predetermined treatment process by using information of the variation quantities of the processing condition parameters that were calculated at a step in which the variation quantities of said processing condition parameters were calculated.

30. The method for monitoring a semiconductor device manufacturing process according to claim 27, the method further comprising a step of displaying information concerning said obtained corrections of the processing conditions of said predetermined treatment process.

31. The method for monitoring a semiconductor device manufacturing process according to claim 27, the method further comprising a step of displaying time fluctuation of the feature quantities of the electron beam image of said pattern.

32. The method for monitoring a semiconductor device manufacturing process according to claim 27, the method further comprising a step of displaying parameters indicating a state of said predetermined processing equipment that was obtained from said predetermined processing equipment together with time fluctuation of the feature quantities of the electron beam image of said pattern on said screen.

33. The method for monitoring a semiconductor device manufacturing process according to claim 27, the method further comprising a step of correcting the processing conditions of said predetermined treatment process based on said obtained corrections of the processing conditions of said predetermined treatment process.

34. The method for monitoring a semiconductor device manufacturing process according to claim 27, wherein said predetermined treatment process is either of an exposure process or an etching process.

35. The method for monitoring a semiconductor device manufacturing process according to claim 27, wherein said feature quantities includes three kinds of feature quantifies of (a) a line width of the pattern, (b) a degree of rounding of a top part of the pattern, and (c) a degree of footing of a bottom part of the pattern.

36. The method for monitoring a semiconductor device manufacturing process according to claim 27, wherein said feature quantities are feature quantities of a predicted cross section calculated from a line profile of said electron beam image.

37. The method for monitoring a semiconductor device manufacturing process, the method comprising steps of:

acquiring an electron beam image of a resist pattern produced on a substrate subject to processing by being subjected to an exposure process;

calculating feature quantities of said resist pattern from said acquired electron beam image;

acquiring an electron beam image of a circuit pattern that was produced by an etching process that uses the resist pattern formed by said exposure process as a mask;

calculating feature quantities of said circuit pattern from said acquired electron beam image; and finding said etching conditions under which the feature quantities of said circuit pattern agree with the desired values by using information of (a) a relationship between said calculated feature quantities of said resist pattern and the exposure condition parameters in said exposure process and (b) a relationship among said exposure condition parameters, etching condition parameters in said etching process, and the feature quantities of said circuit pattern.

* * * * *